United States Patent [19]

Wincn et al.

[11] Patent Number: 5,164,960

[45] Date of Patent: Nov. 17, 1992

[54] MEDIUM ATTACHMENT UNIT FOR USE WITH TWISTED PAIR LOCAL AREA NETWORK

[75] Inventors: John M. Wincn; Nader Vijeh, both of Cupertino; Ian S. Crayford, San Jose; Jeffrey M. Blumenthal, Fremont, all of Calif.

[73] Assignee: Advanced Micro Devices Inc., Sunnyvale, Calif.

[21] Appl. No.: 480,426

[22] Filed: Feb. 15, 1990

[51] Int. Cl.$^5$ .............................................. H04B 3/46
[52] U.S. Cl. ....................................... 375/10; 375/121
[58] Field of Search ...... 375/19, 36, 121, 10; 371/55, 56, 57; 370/13, 14, 15, 56, 80

[56] References Cited

U.S. PATENT DOCUMENTS

| | | | |
|---|---|---|---|
| 3,824,548 | 7/1974 | Sullivan et al. | 370/17 |
| 4,380,810 | 4/1983 | Canniff | 370/56 |
| 4,403,320 | 9/1983 | Canniff | 370/56 |
| 4,859,815 | 8/1989 | Irwin et al. | 375/13 |

*Primary Examiner*—Stephen Chin
*Attorney, Agent, or Firm*—Townsend and Townsend

[57] ABSTRACT

An integrated media attachment unit (MAU) operative for interfacing Digital Terminal Equipment (DTE) on a Local Area Network (LAN) using twisted pair media. The twisted pair function as either a DTE MAU or a repeater MAU. A line driver for the twisted pair differential signal provides a ramped response with low jitter while an improved Attachment Unit Interface (AUI) driver uses CMOS technology and provides simplified End-of-Transmission Delimiter (EDT) control. The twisted pair MAU includes a combined override and status indication of link status and an additional feature to allow automatic polarity reversal of differential signal input lines and polarity status signalling.

5 Claims, 37 Drawing Sheets

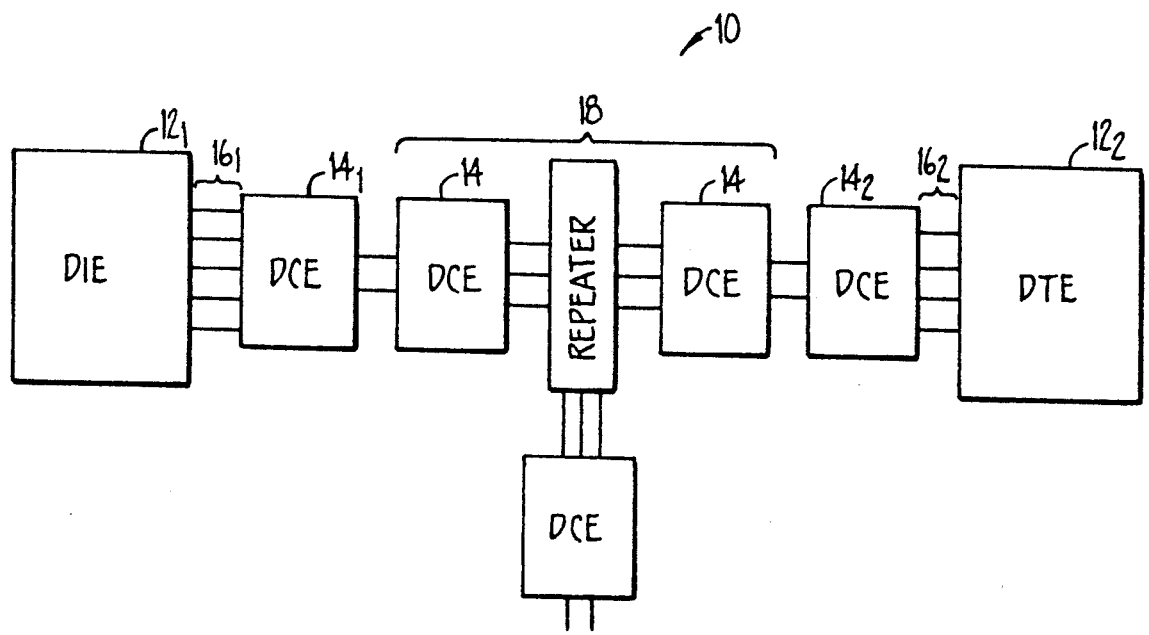
FIG._1. (PRIOR ART)
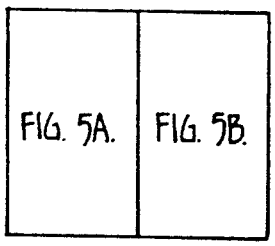
FIG._5.
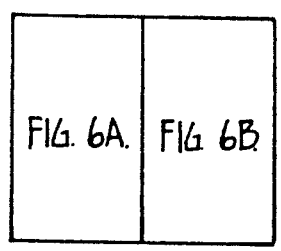
FIG._6.
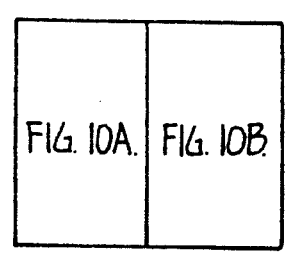
FIG._10.
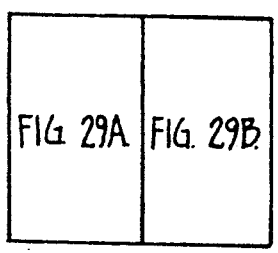
FIG._29.
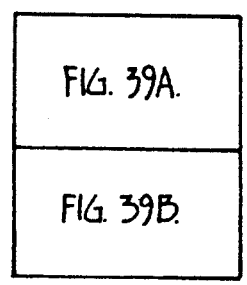
FIG._39.

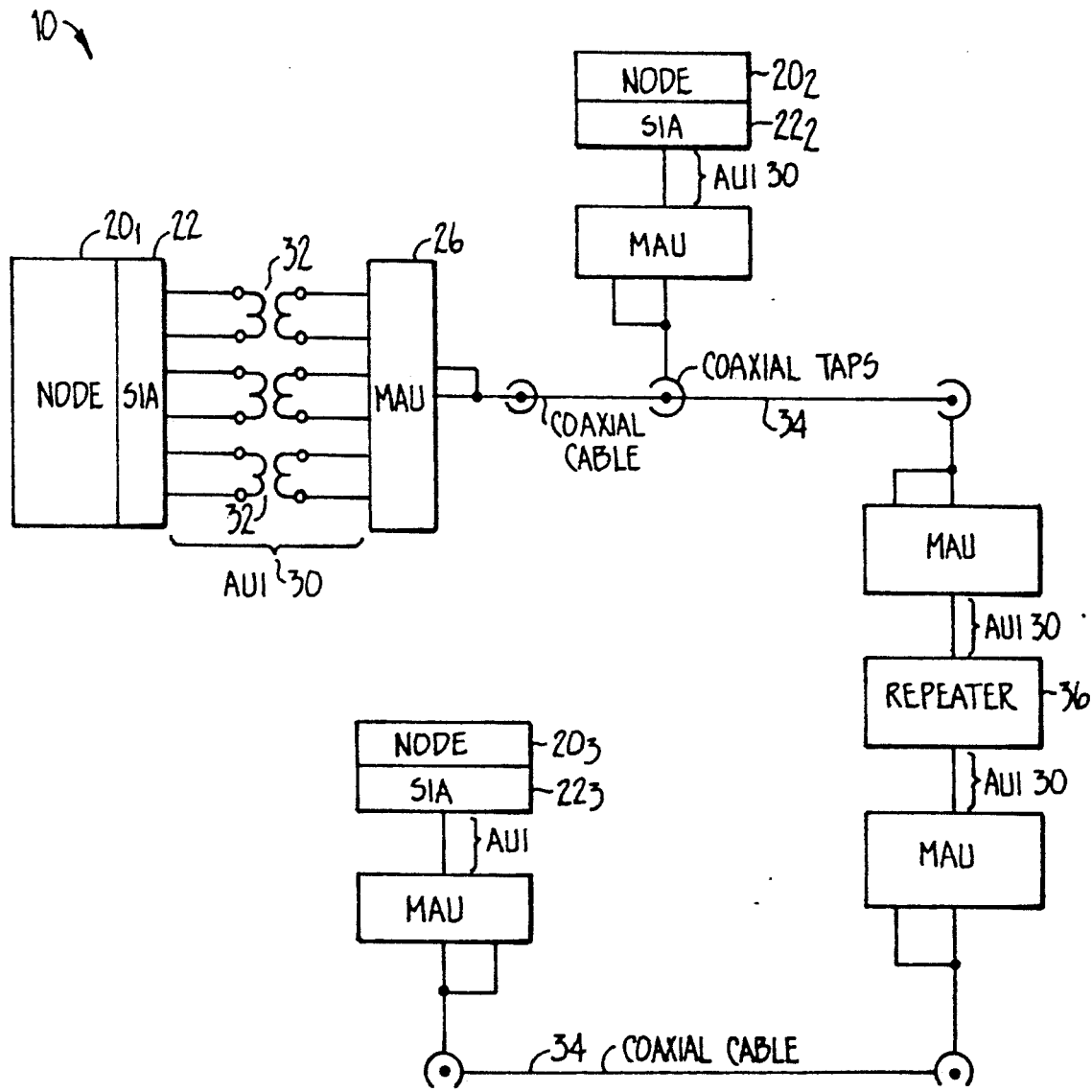
FIG._2.

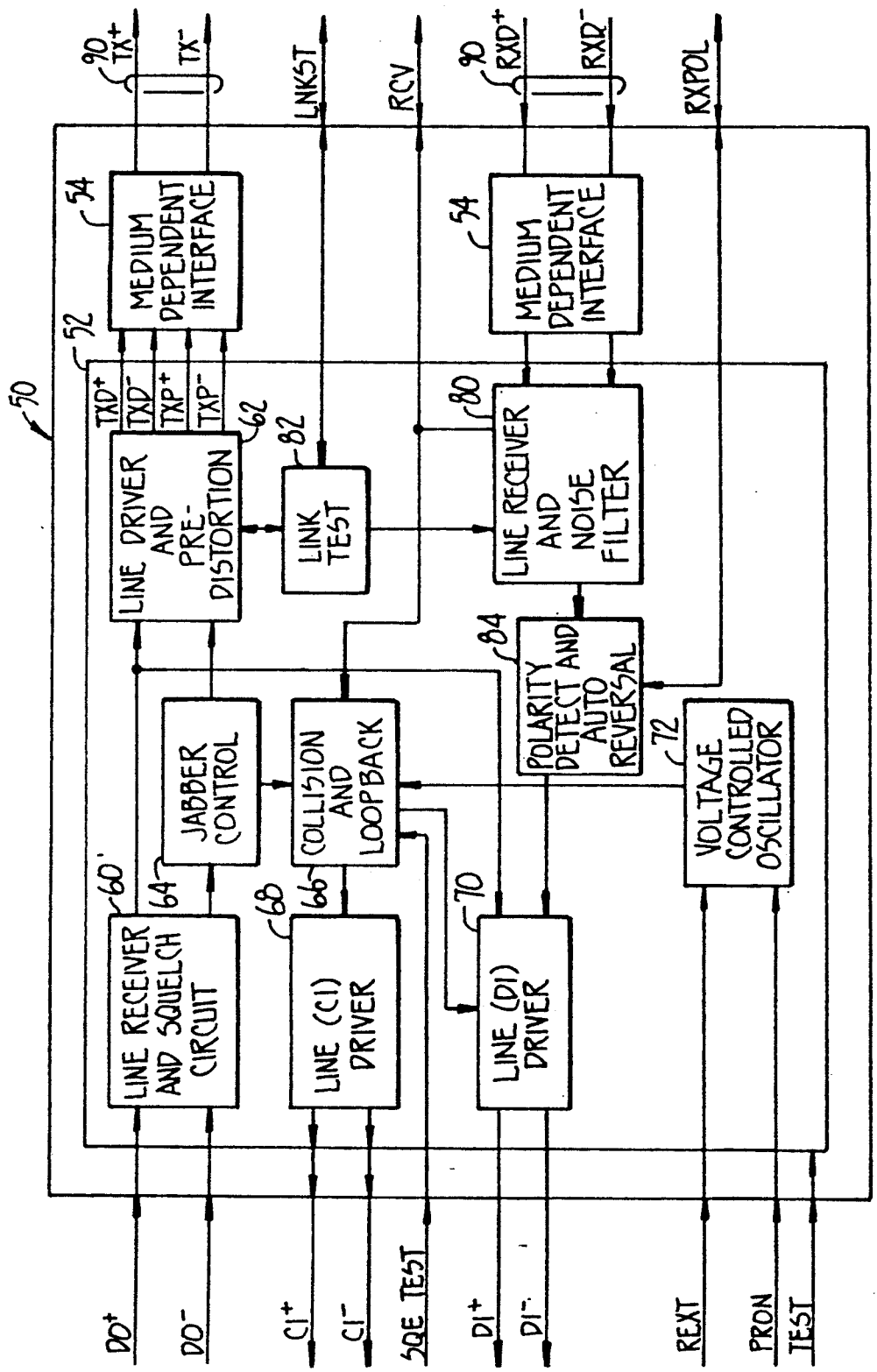
FIG._3.

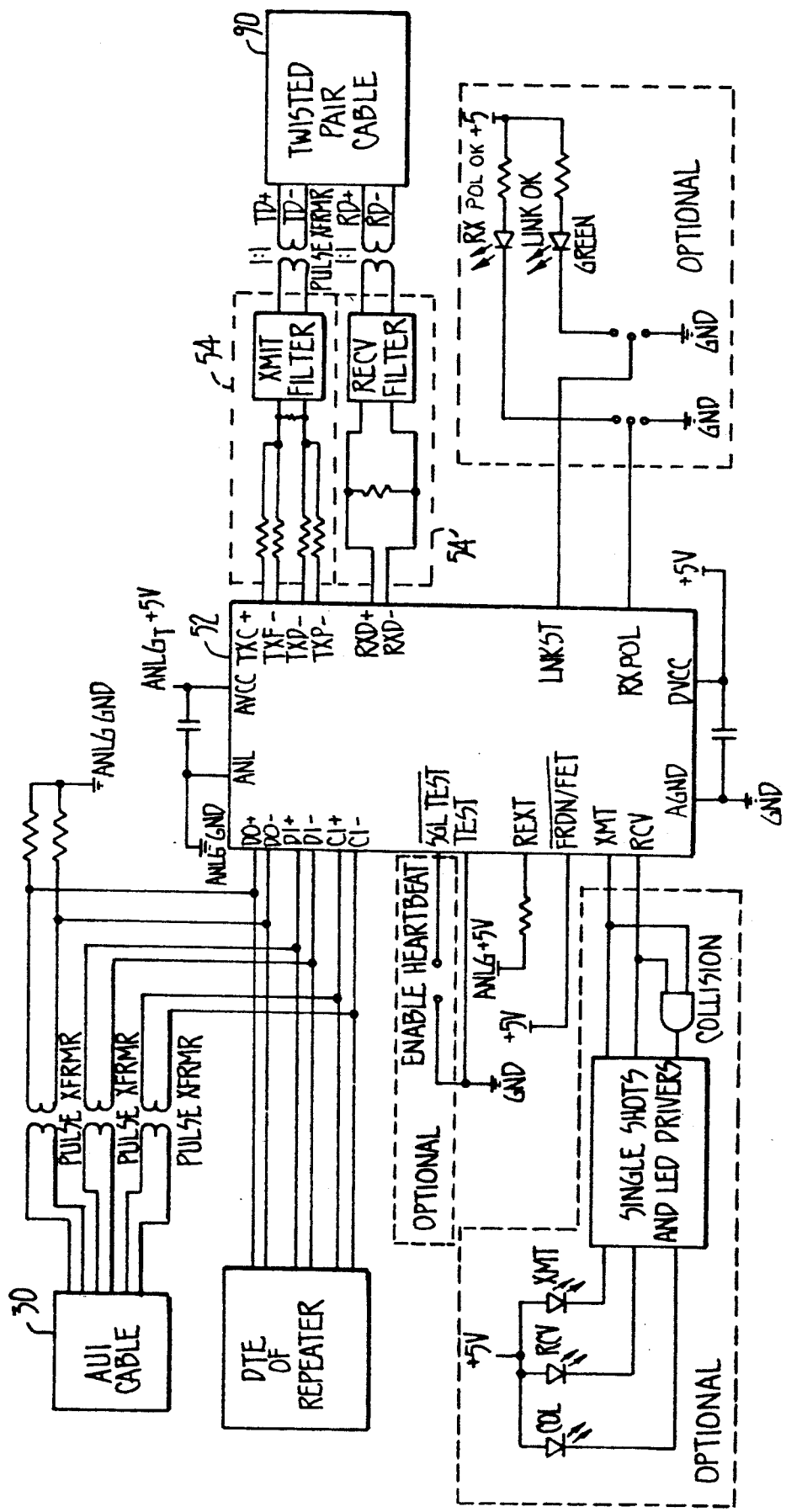
FIG._4.

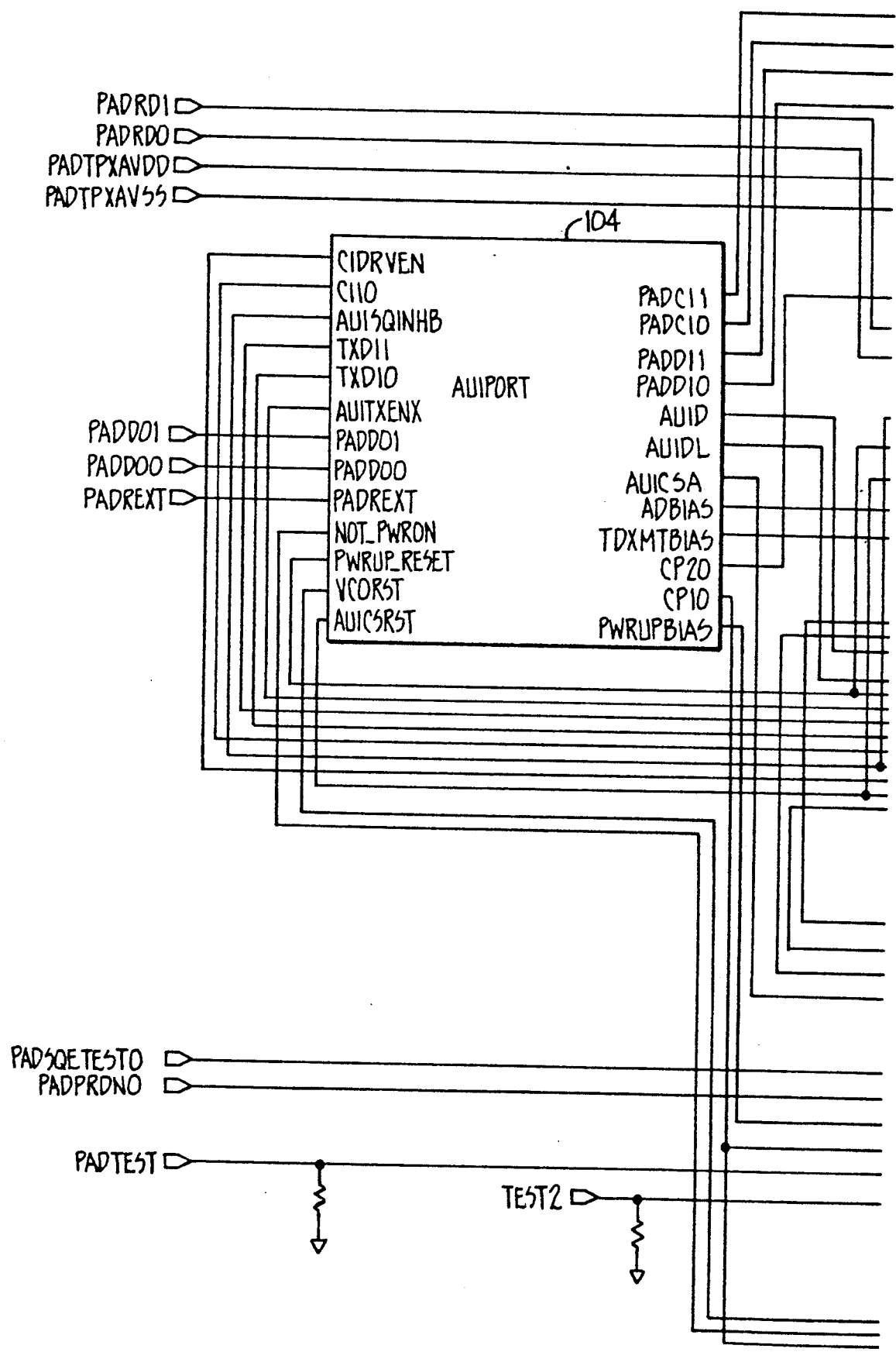
FIG._5A.

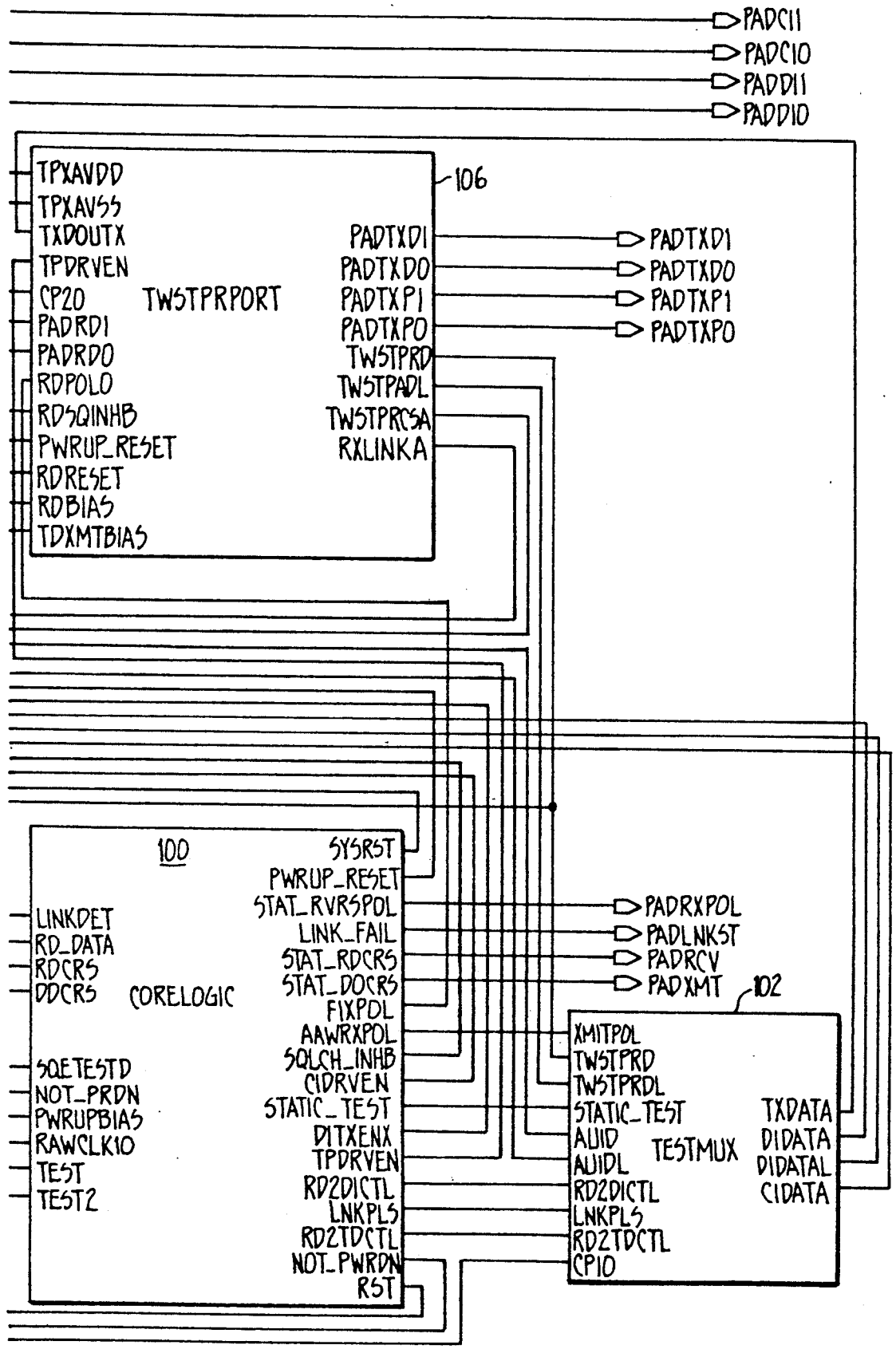
FIG._5B.

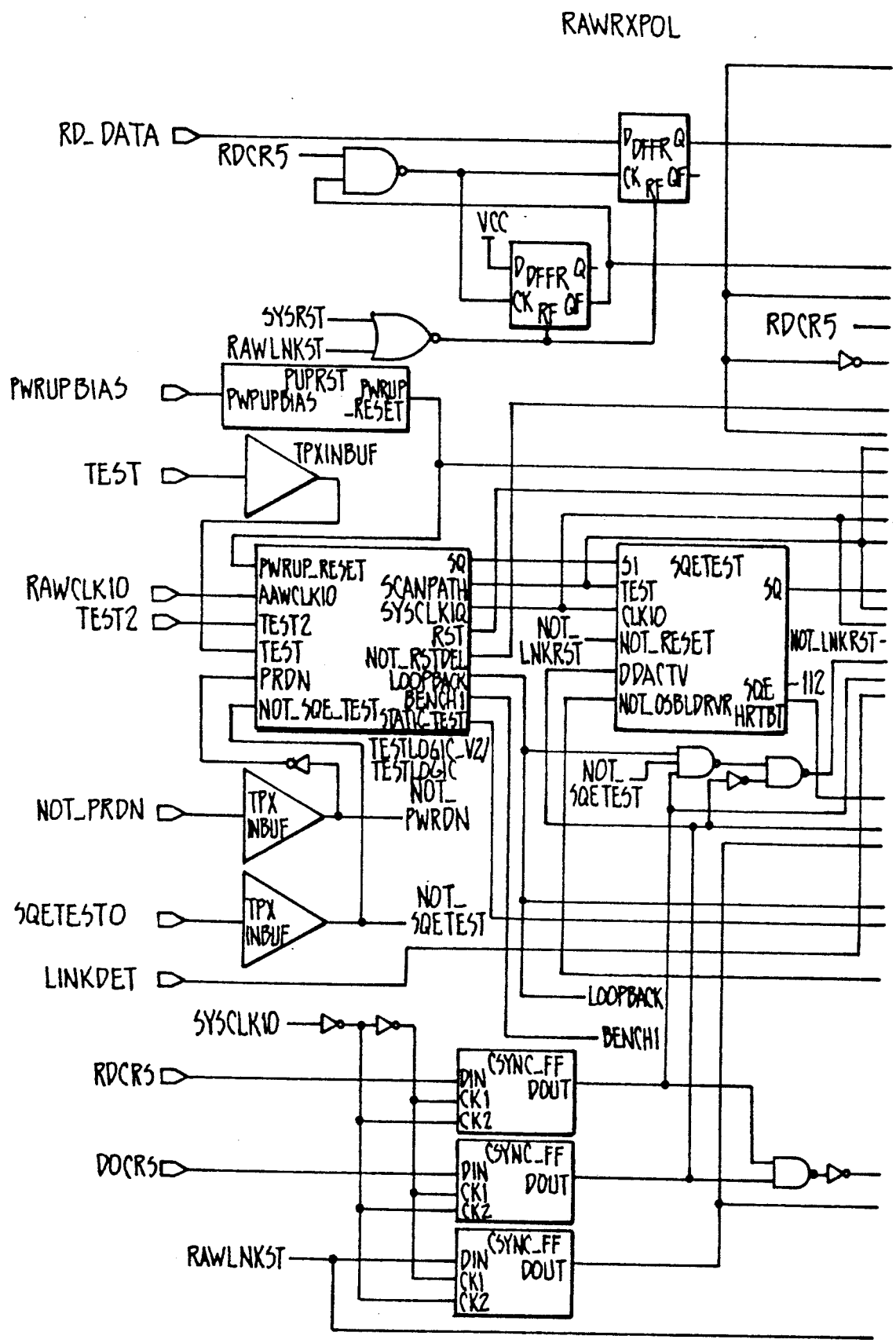
FIG._6A.

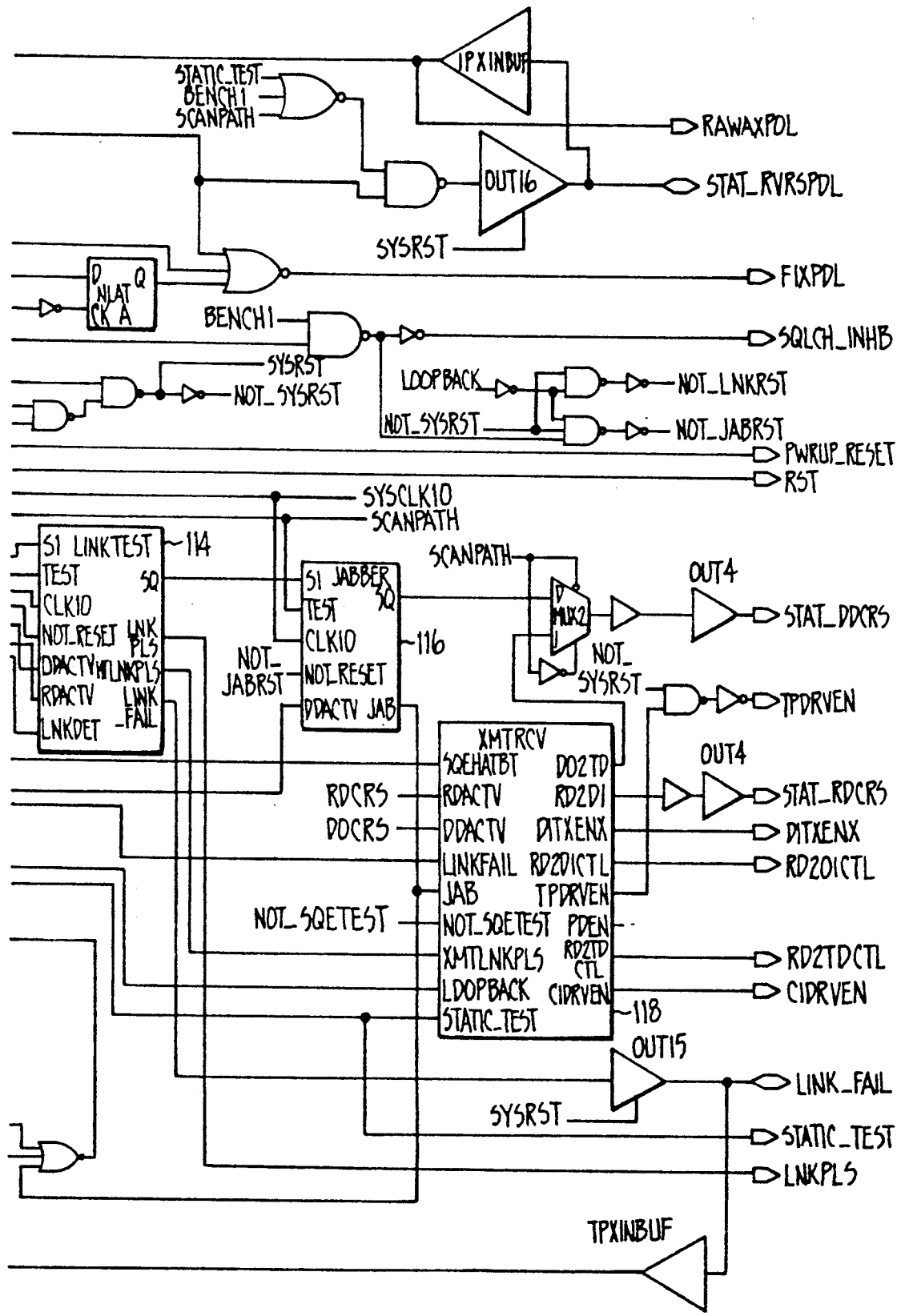
FIG._6B.

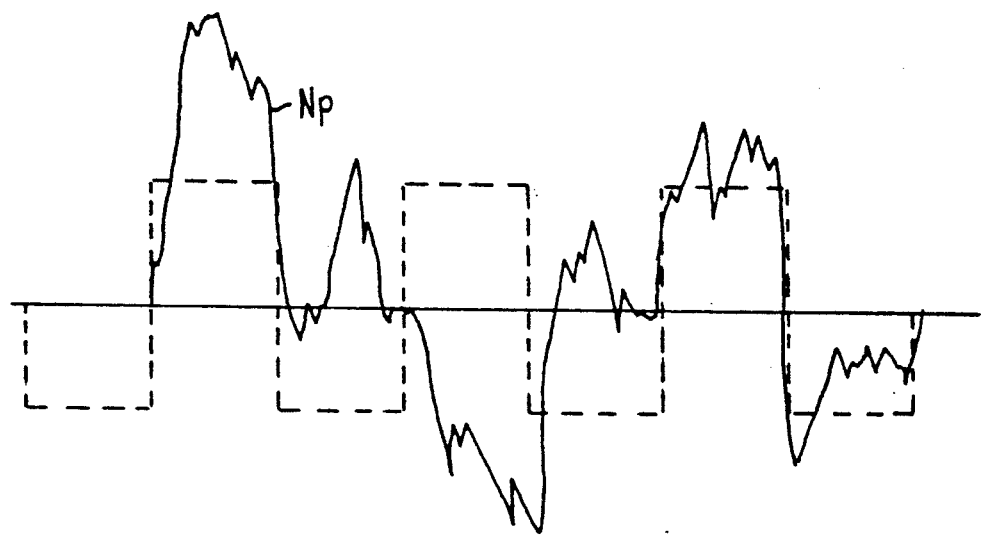
FIG._7.
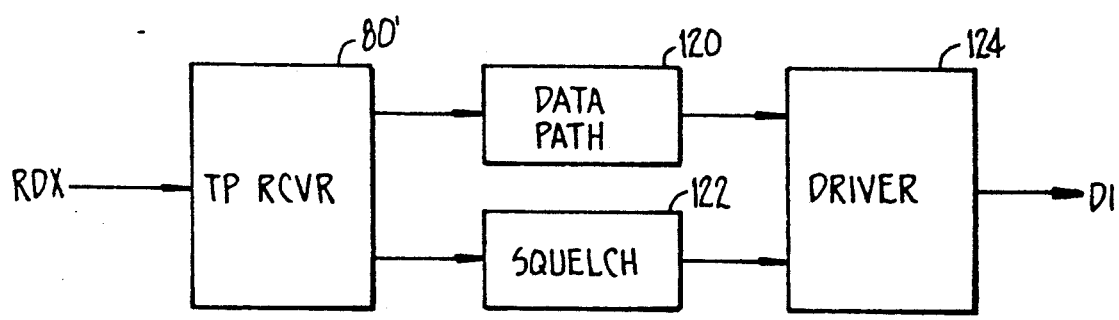
FIG._8.

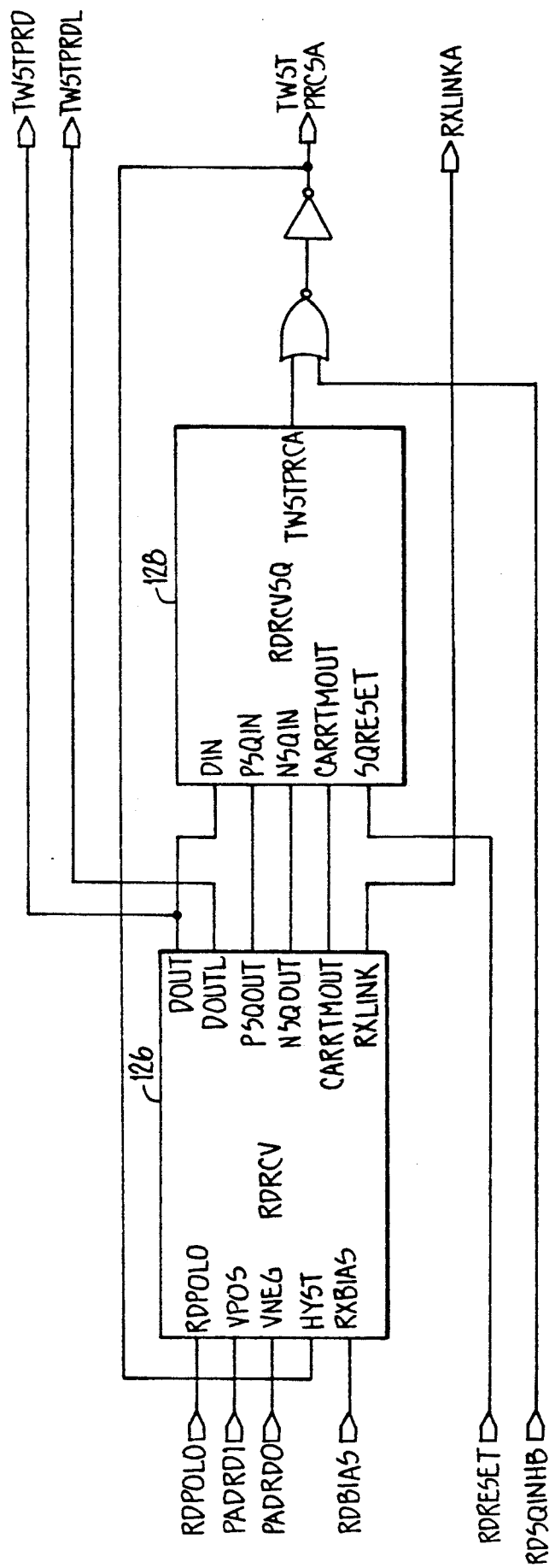
FIG._9.

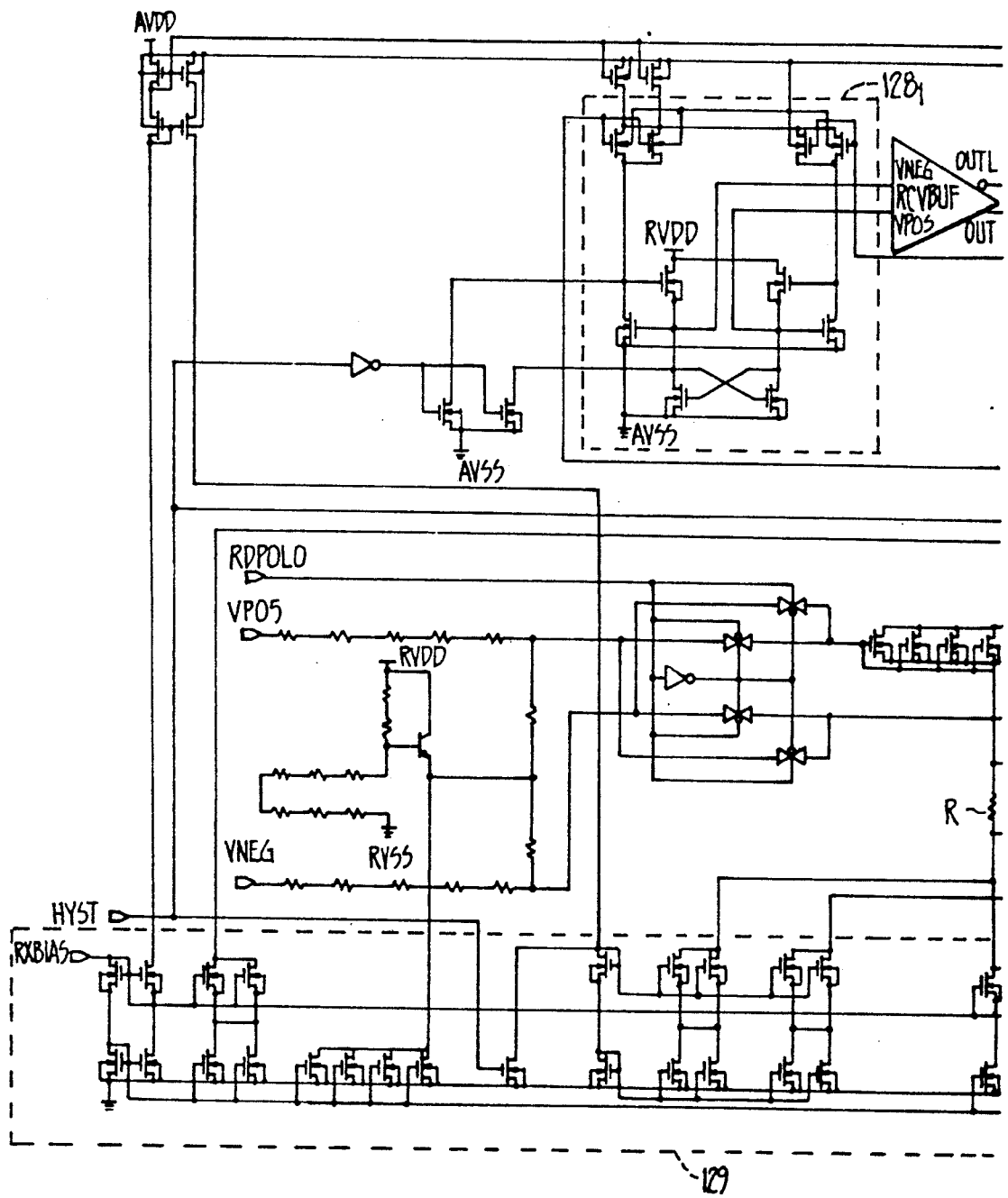
FIG._10A.

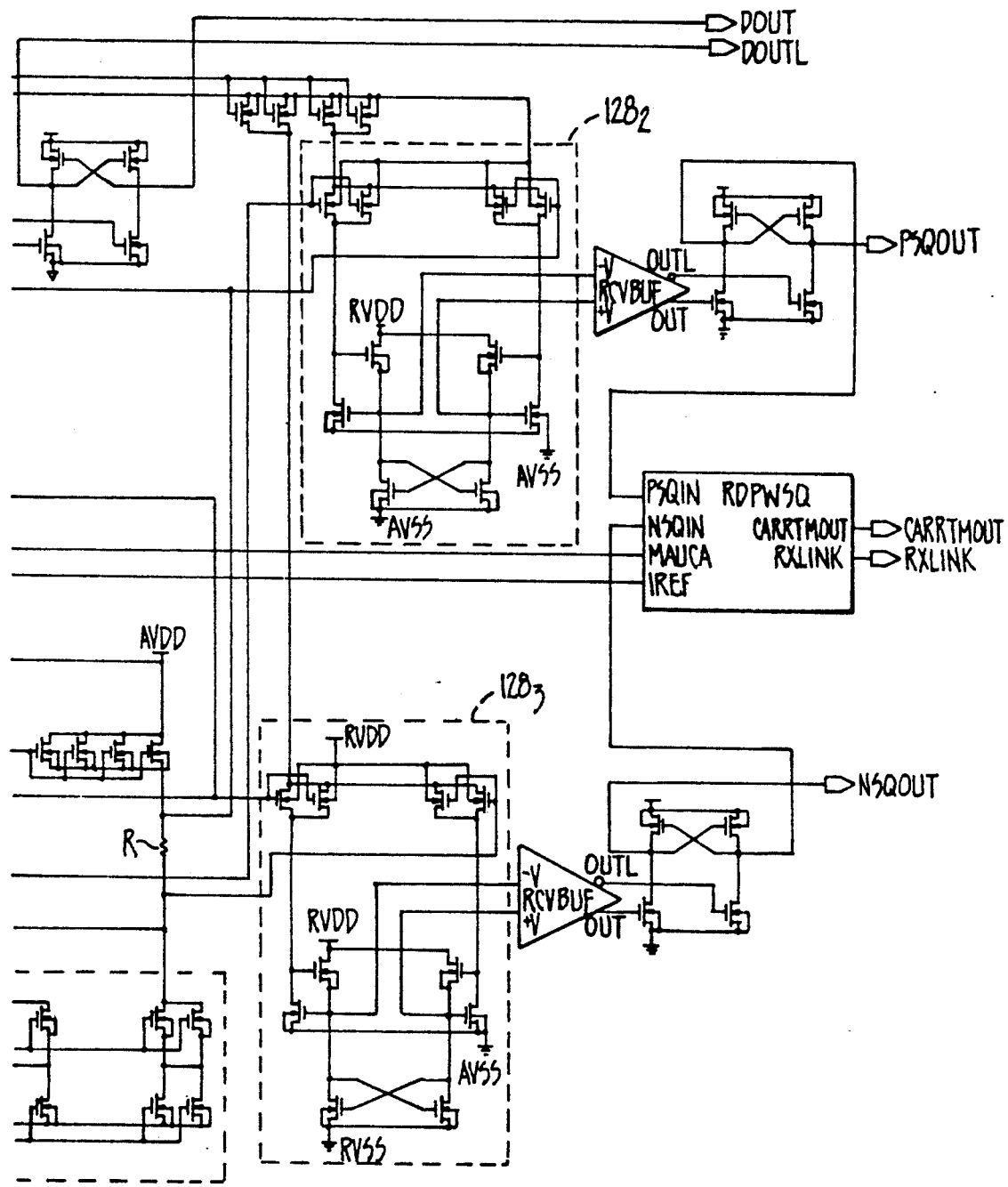
FIG._10B.

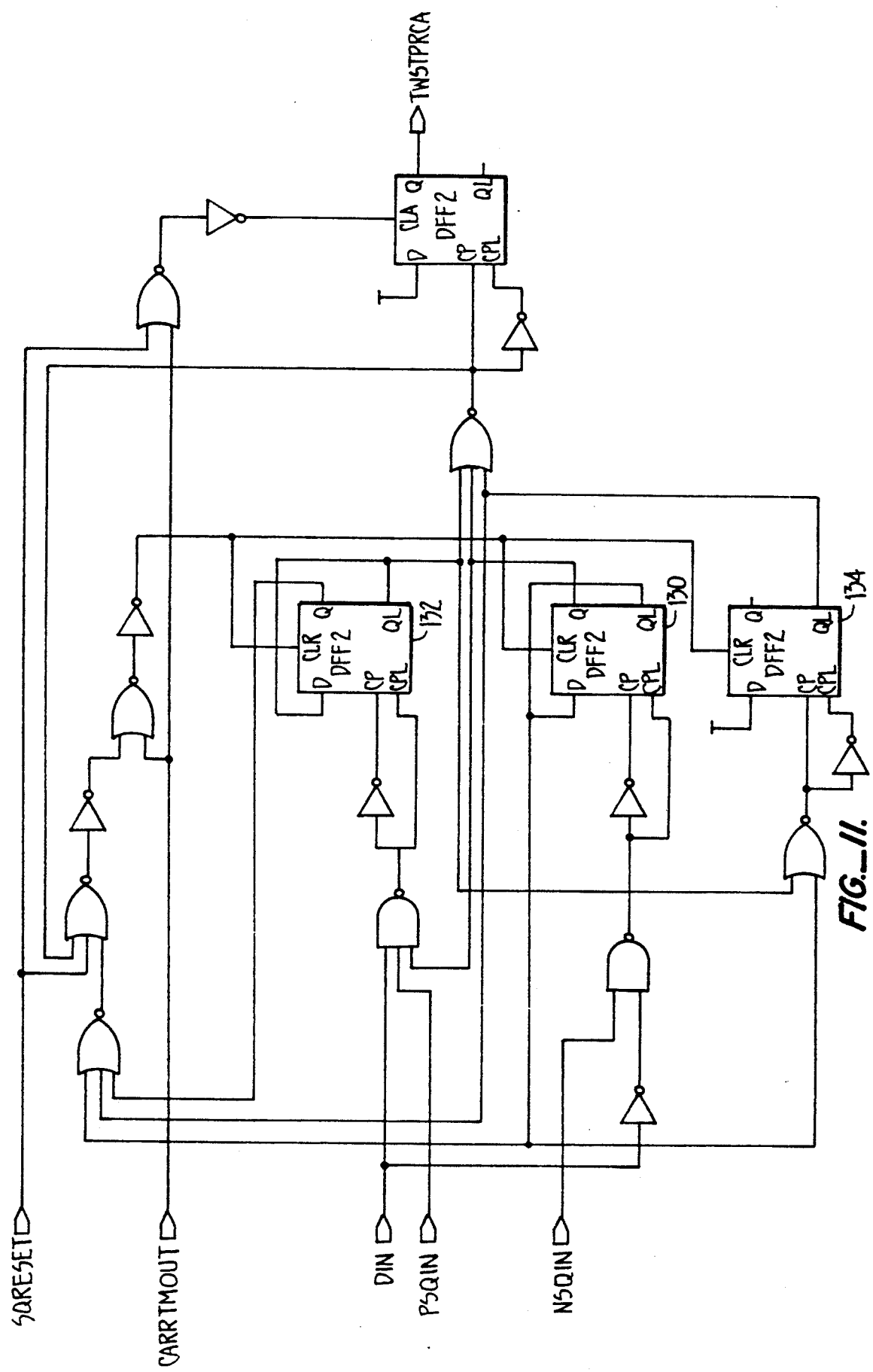
FIG._11.

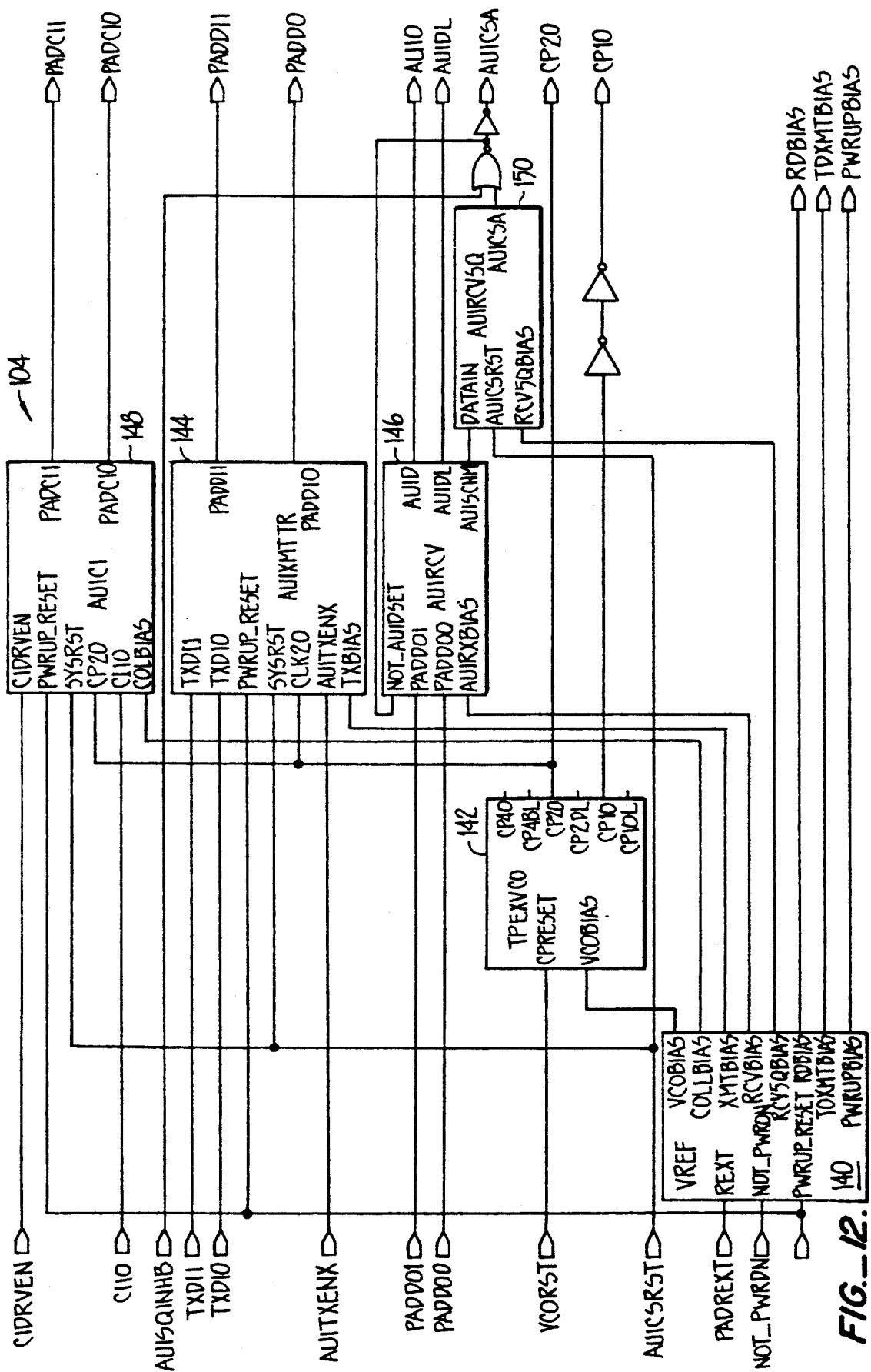
FIG._12.

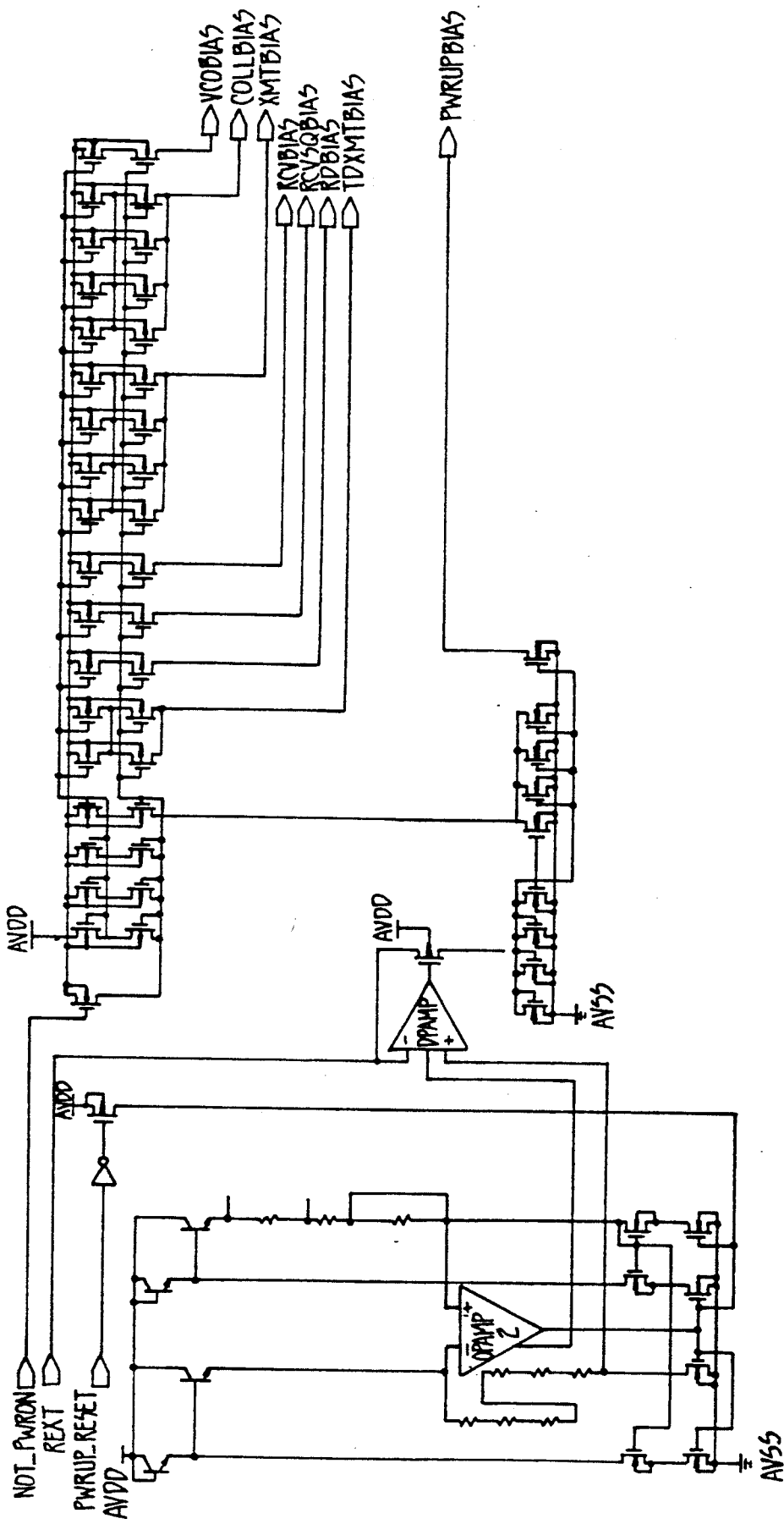
FIG._13.

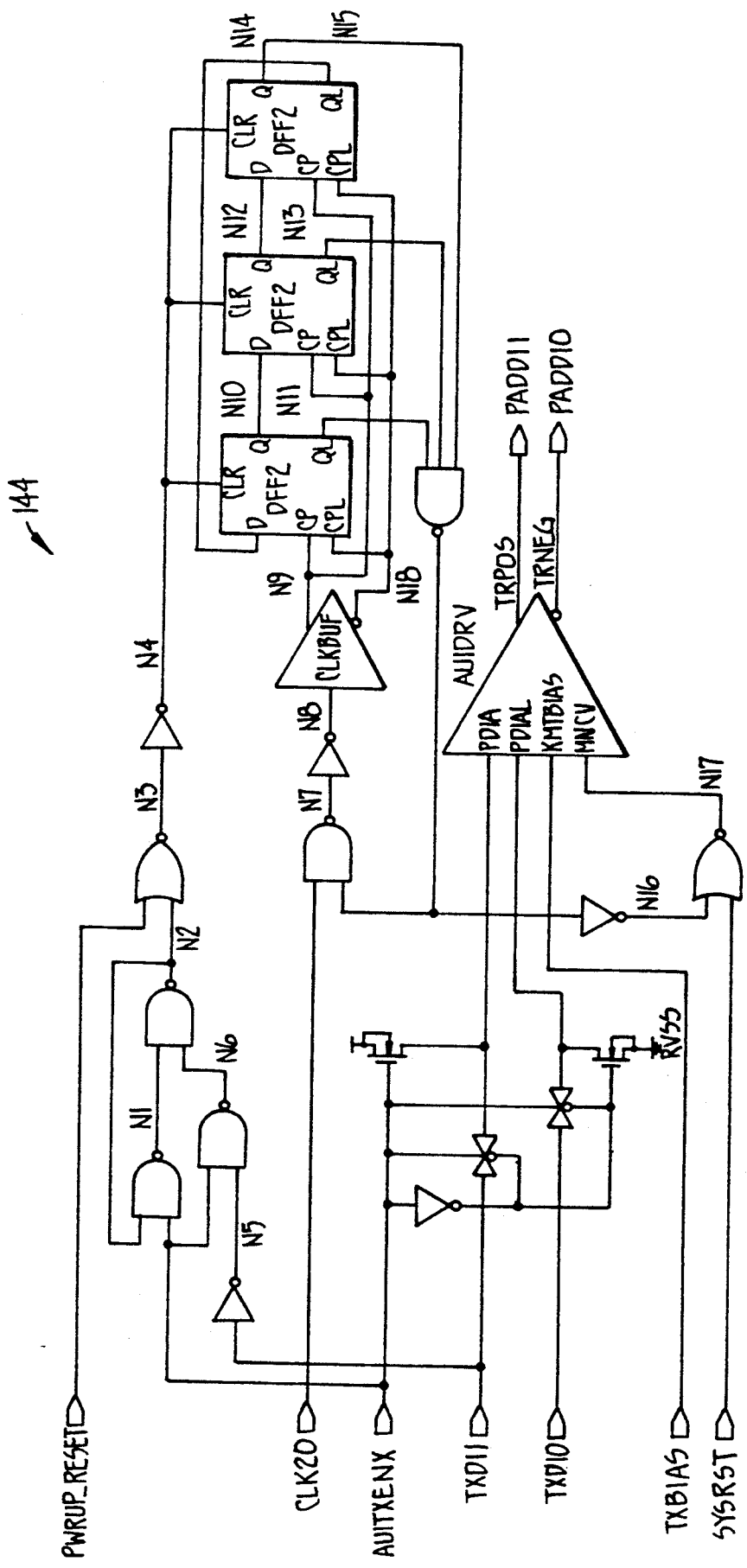
FIG._14.

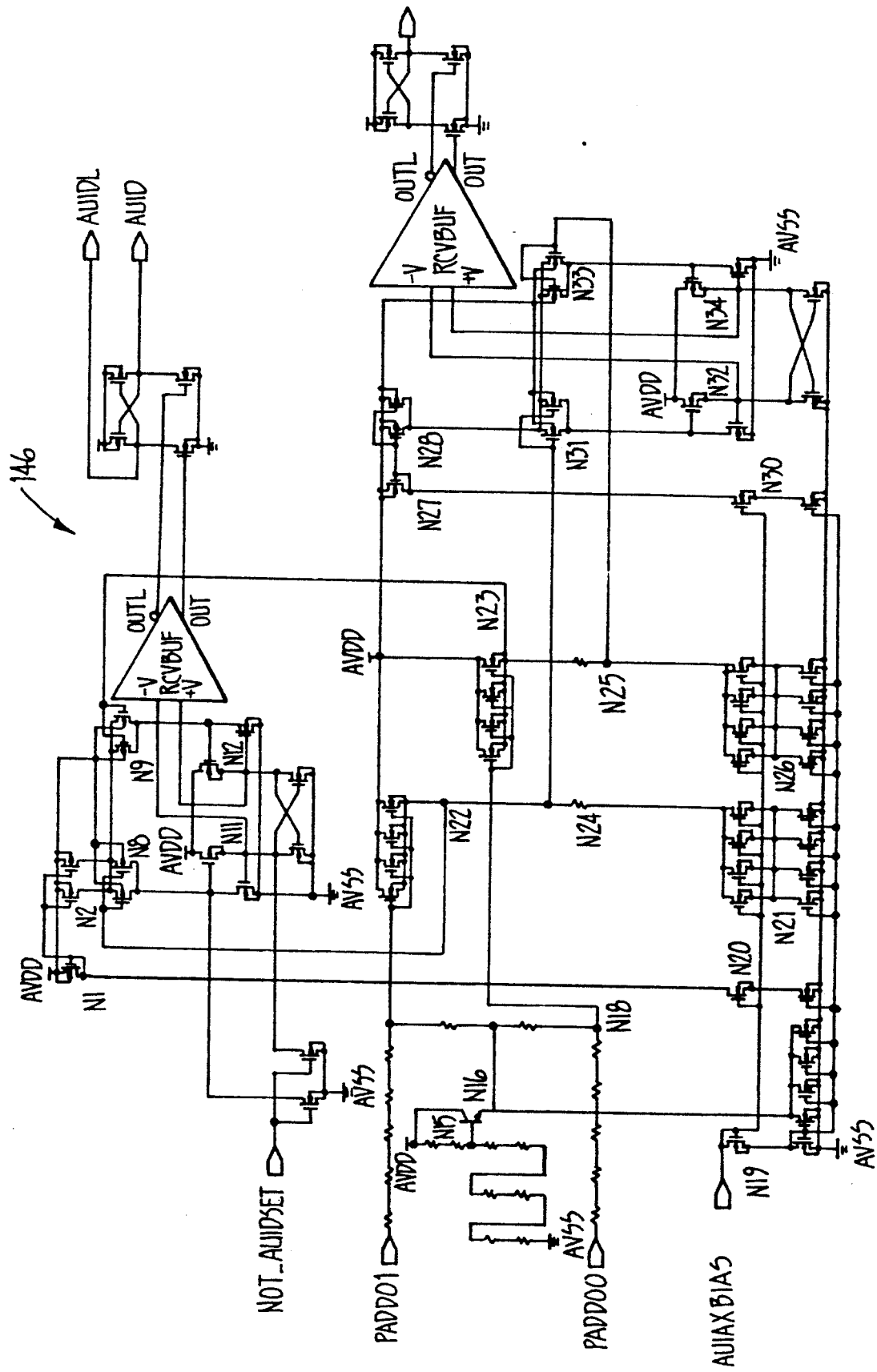
FIG._15.

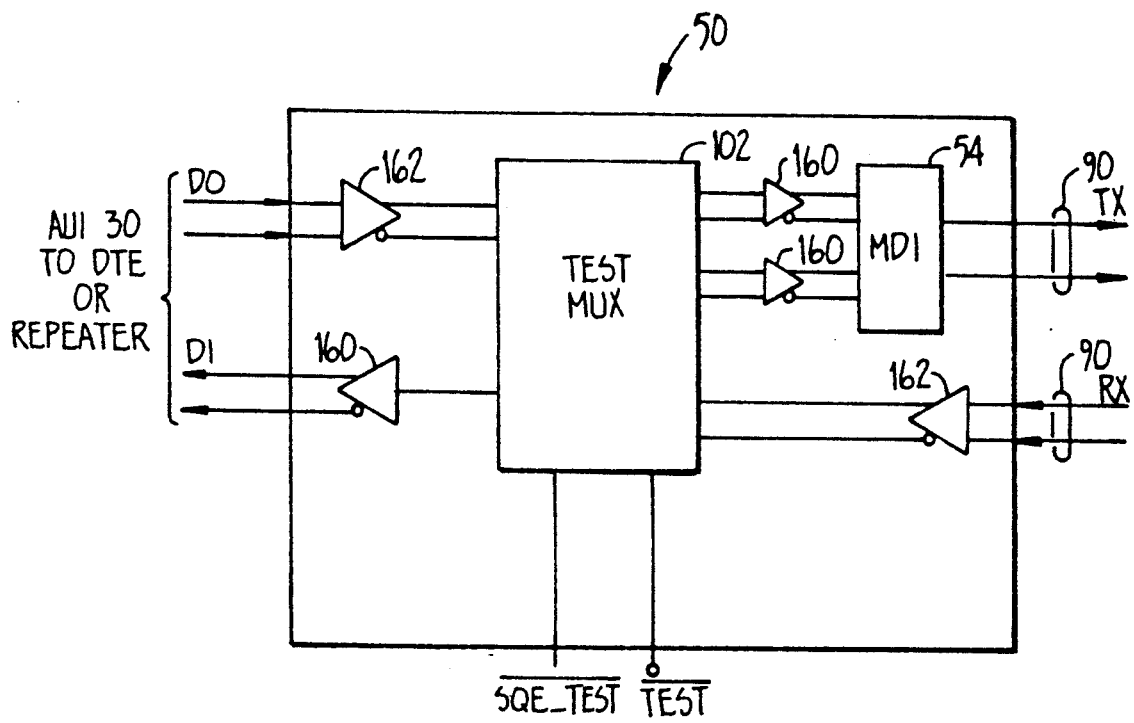
FIG._16.
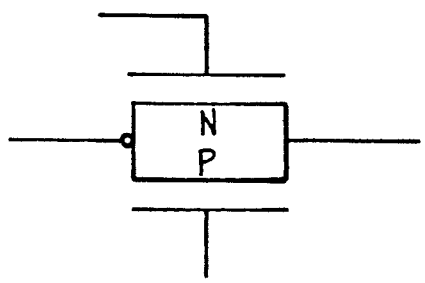
FIG._19.

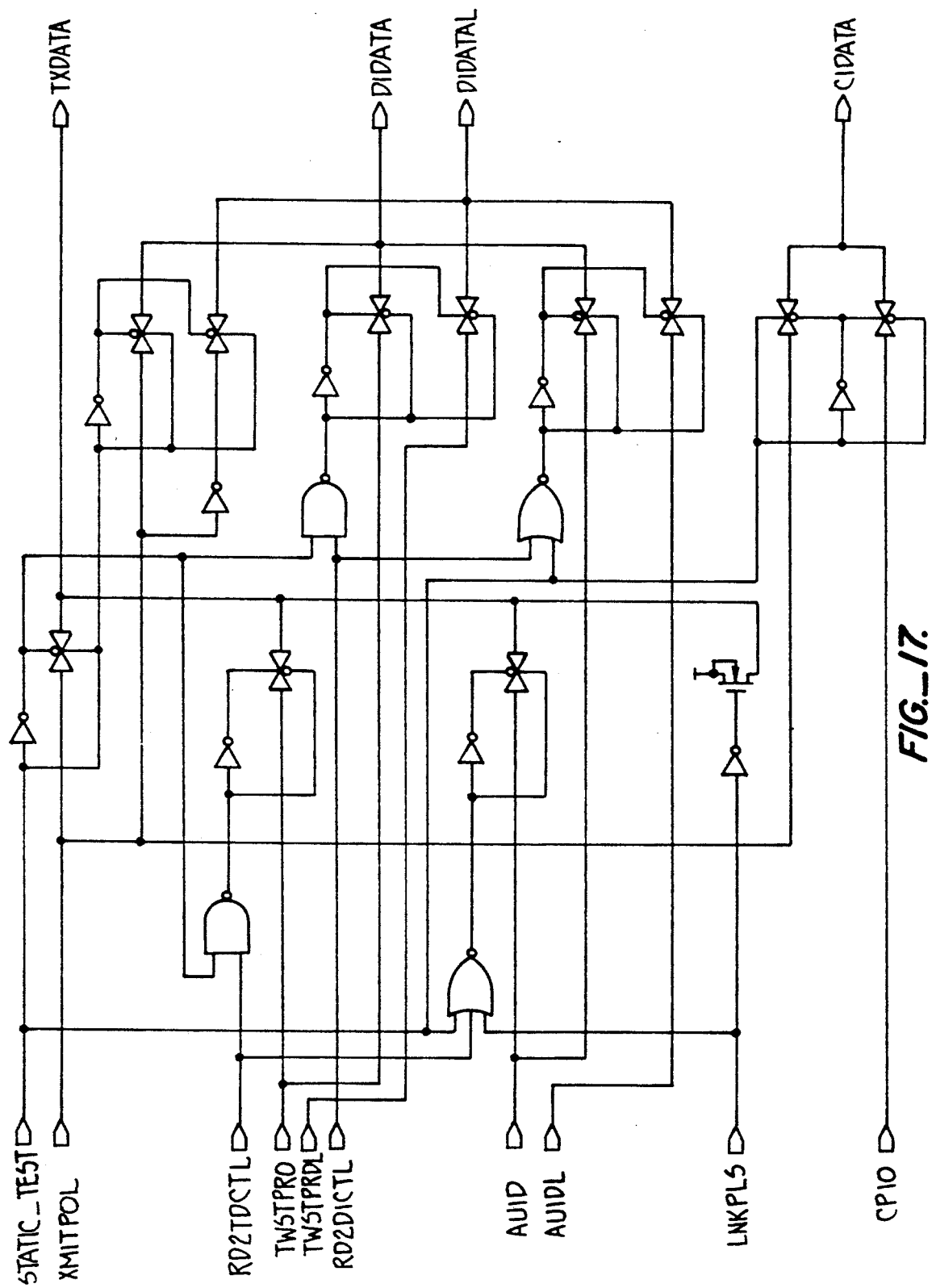
FIG._17.

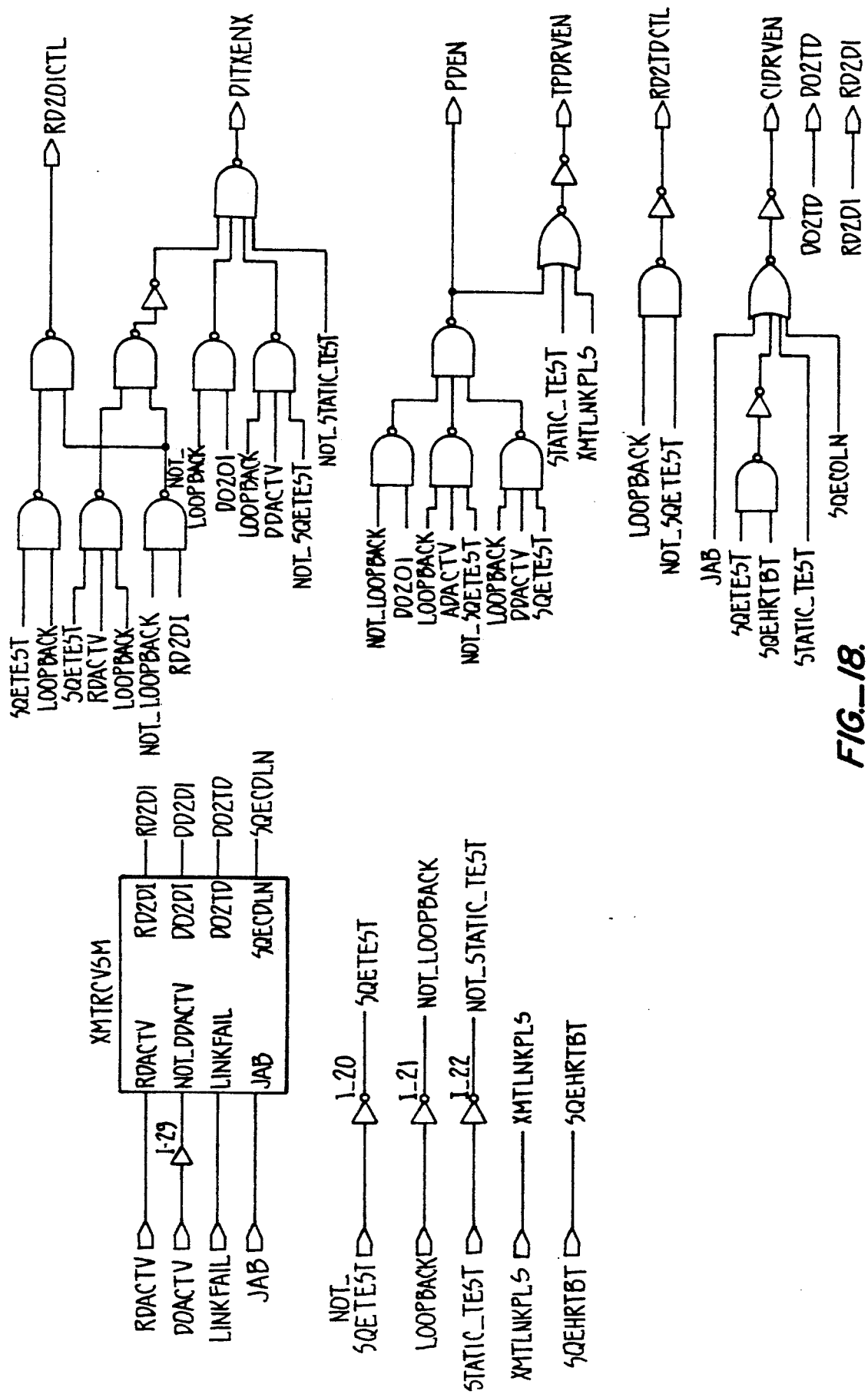
FIG._18.

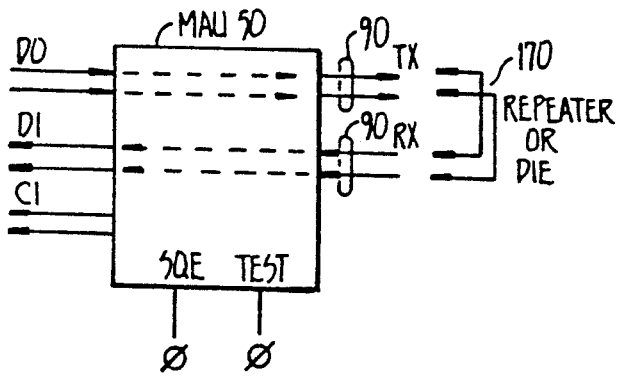
FIG._20.
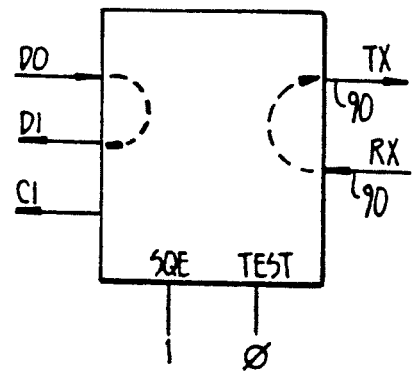
FIG._21.
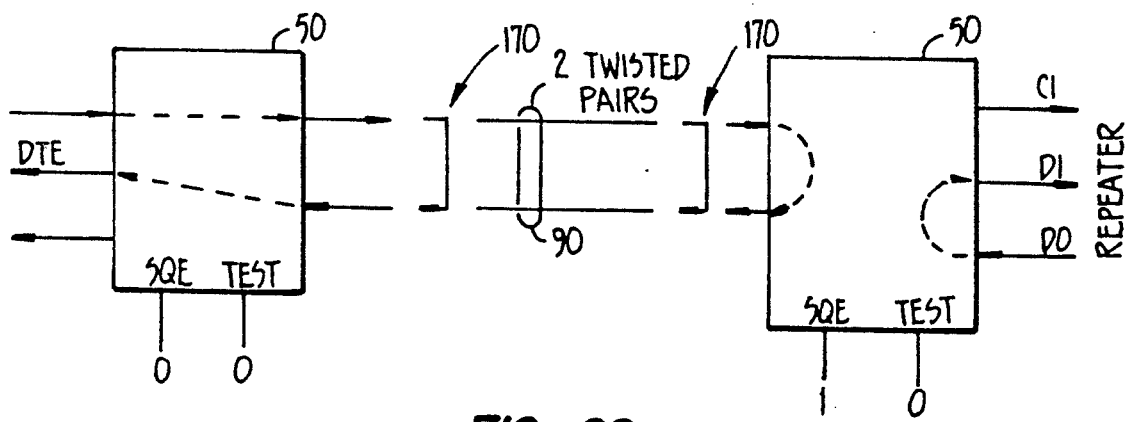
FIG._22.
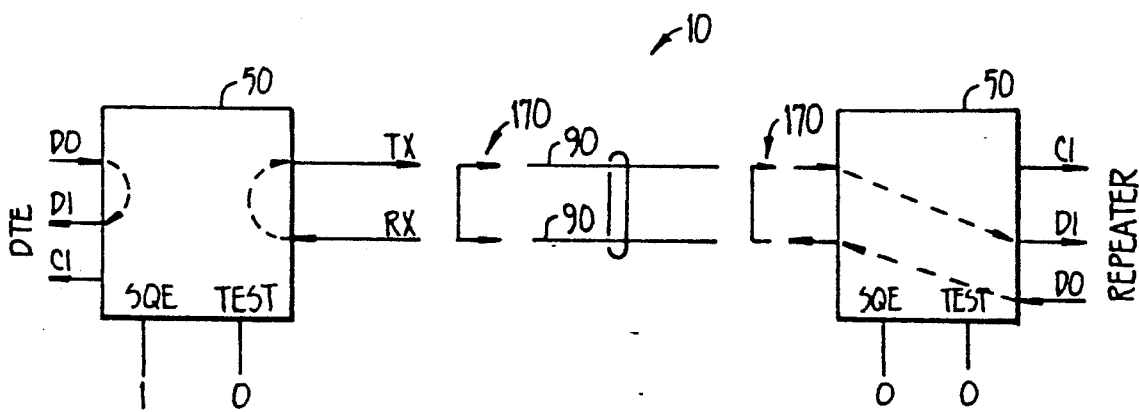
FIG._23.

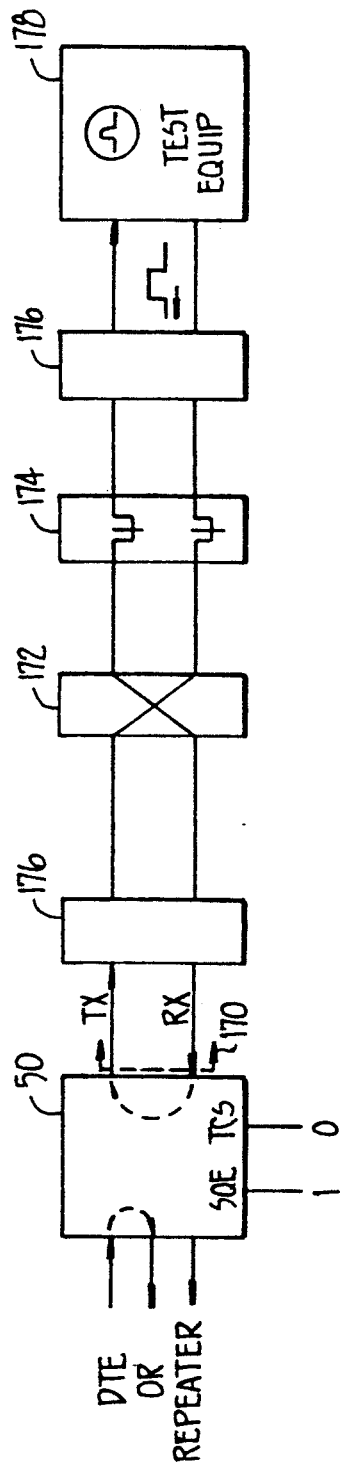
FIG._24.
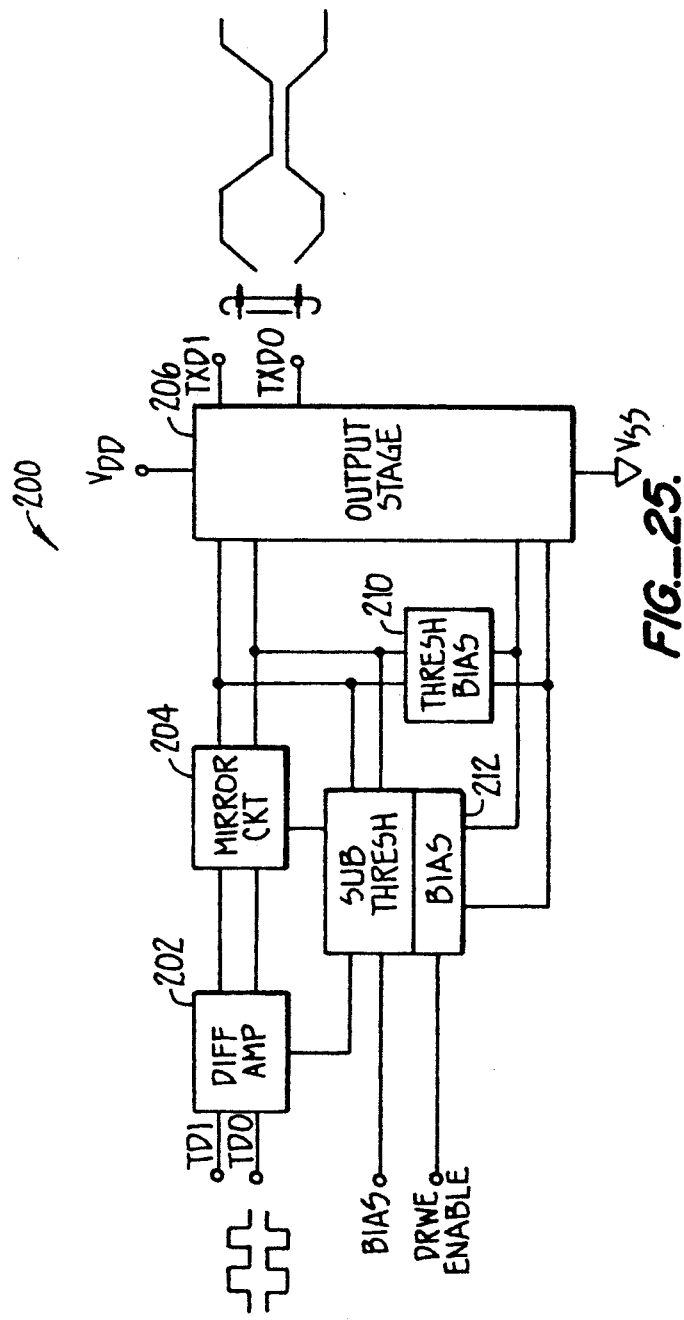
FIG._25.

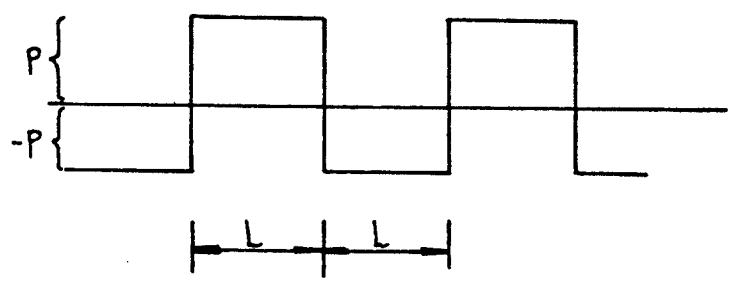
FIG._26.
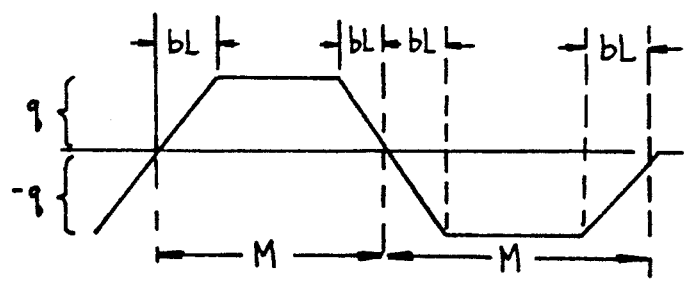
FIG._27.

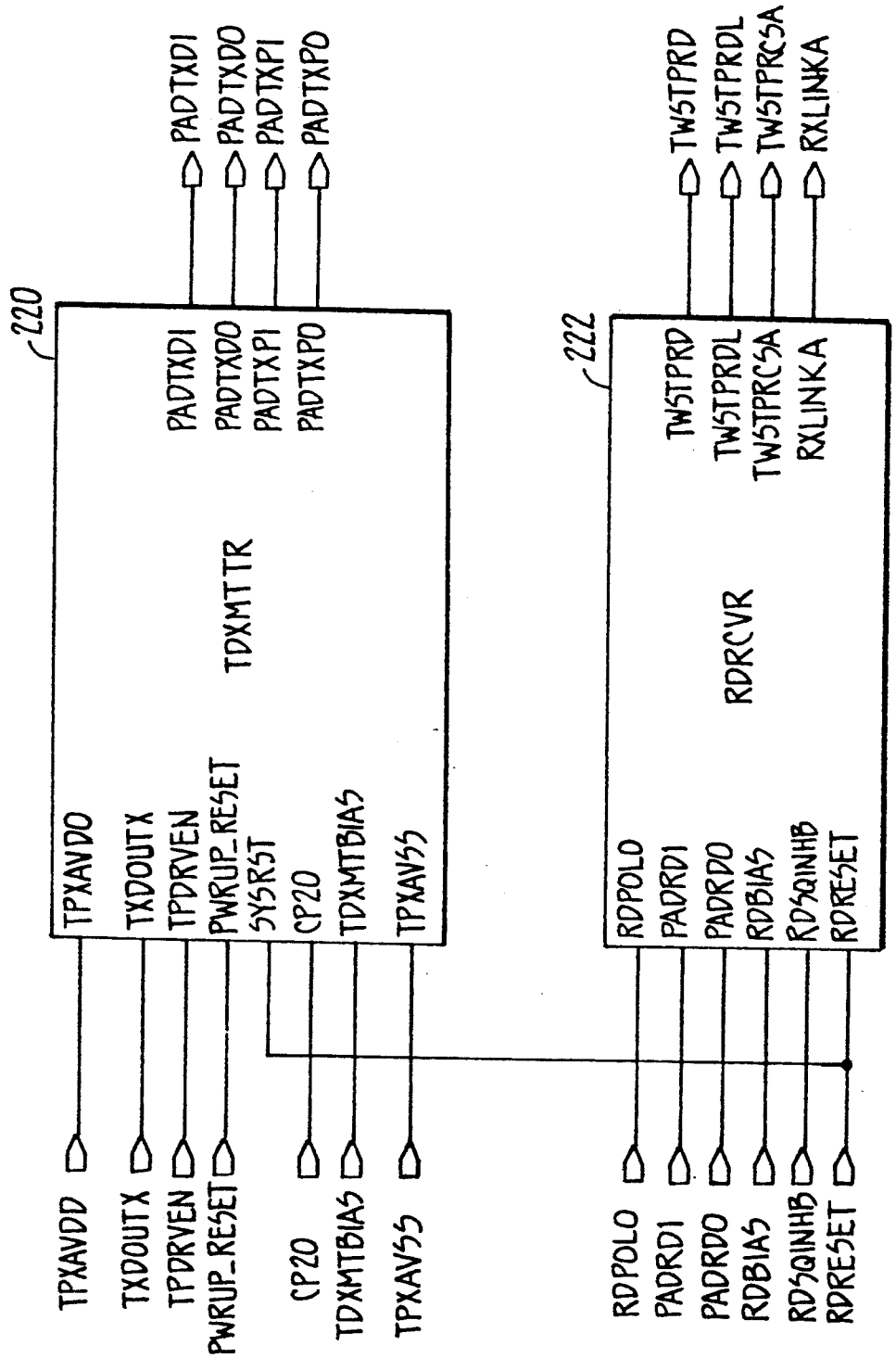
FIG._28.

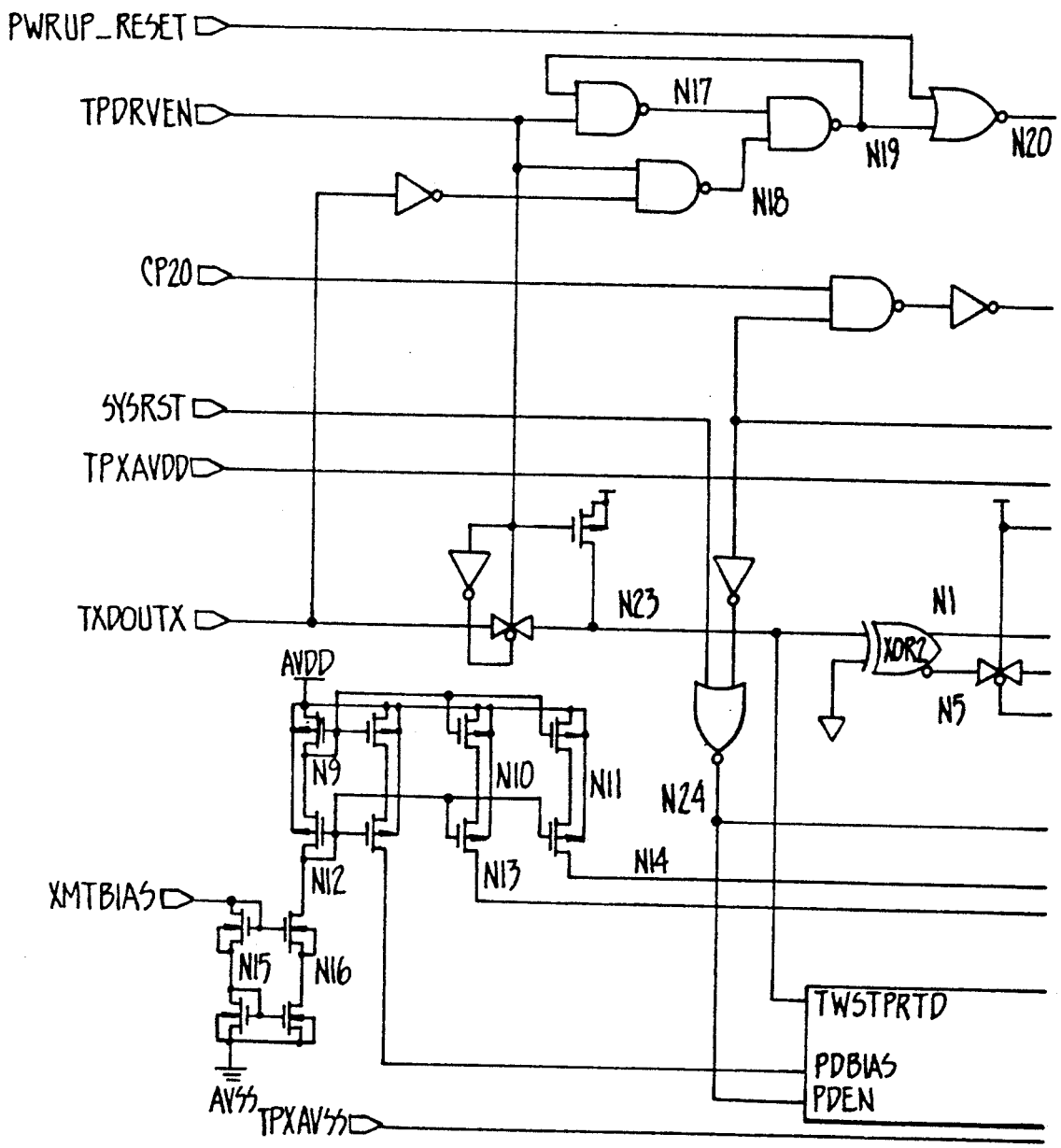
FIG._29A.

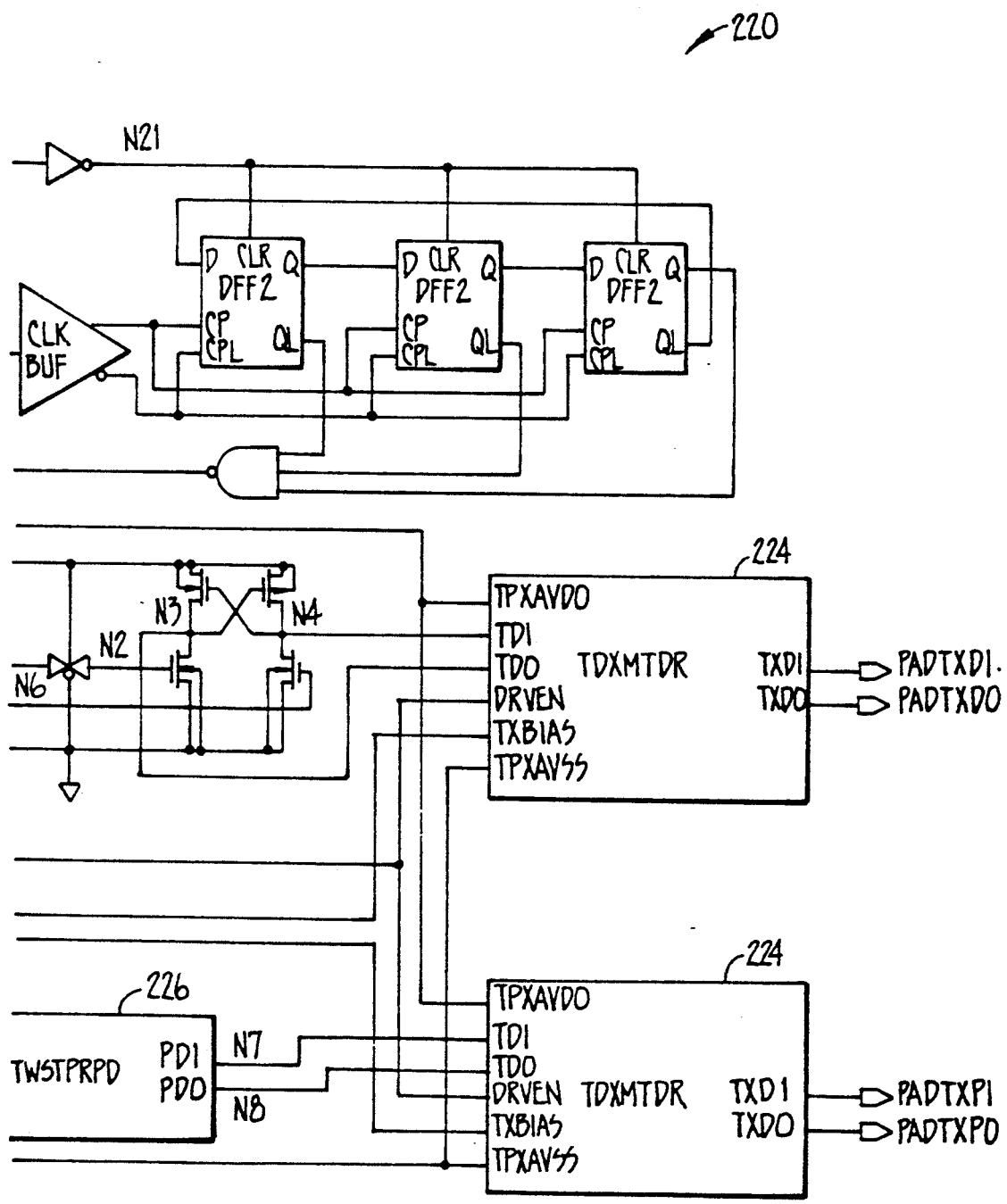
FIG_29B.

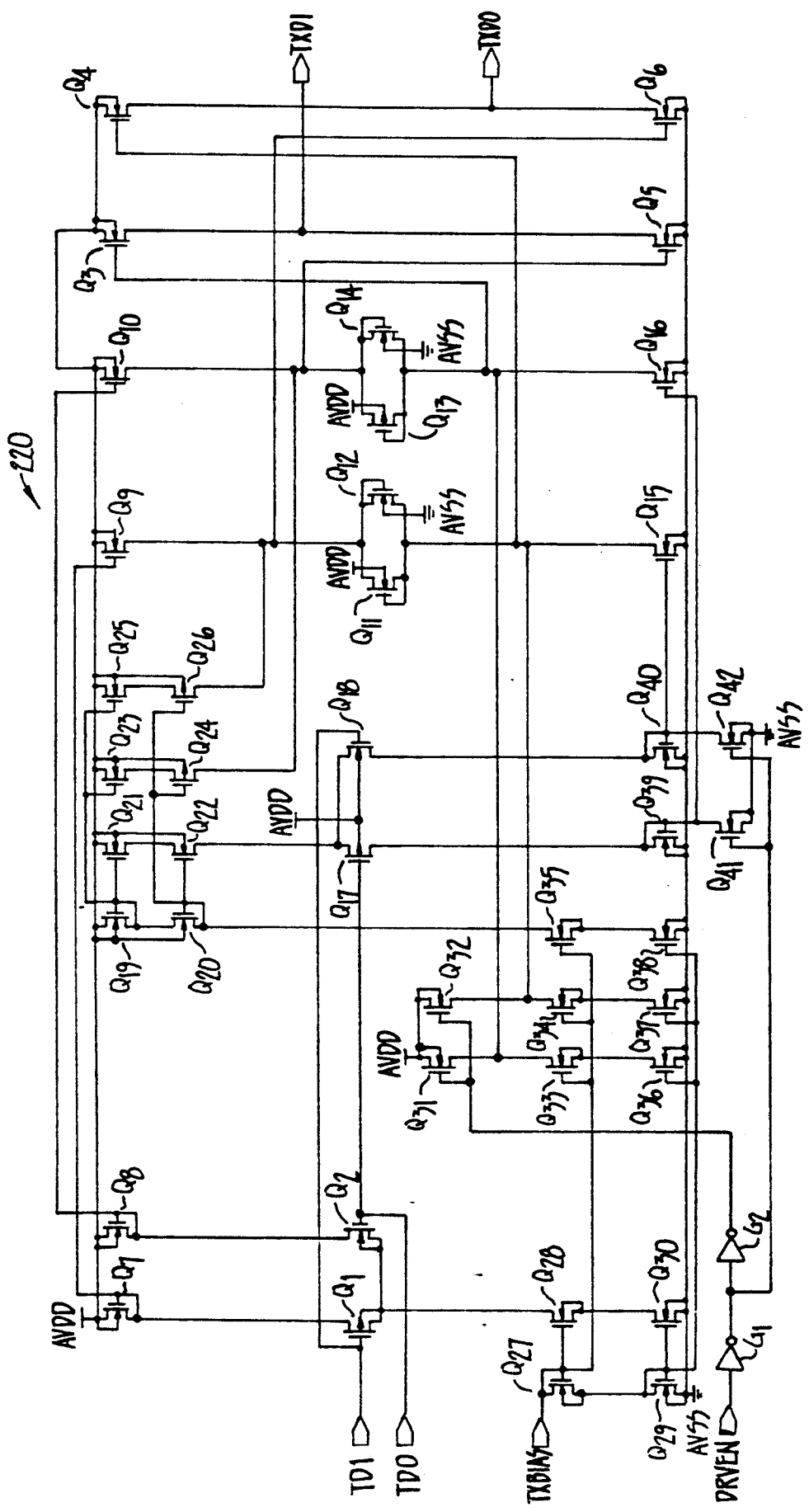
FIG._30.

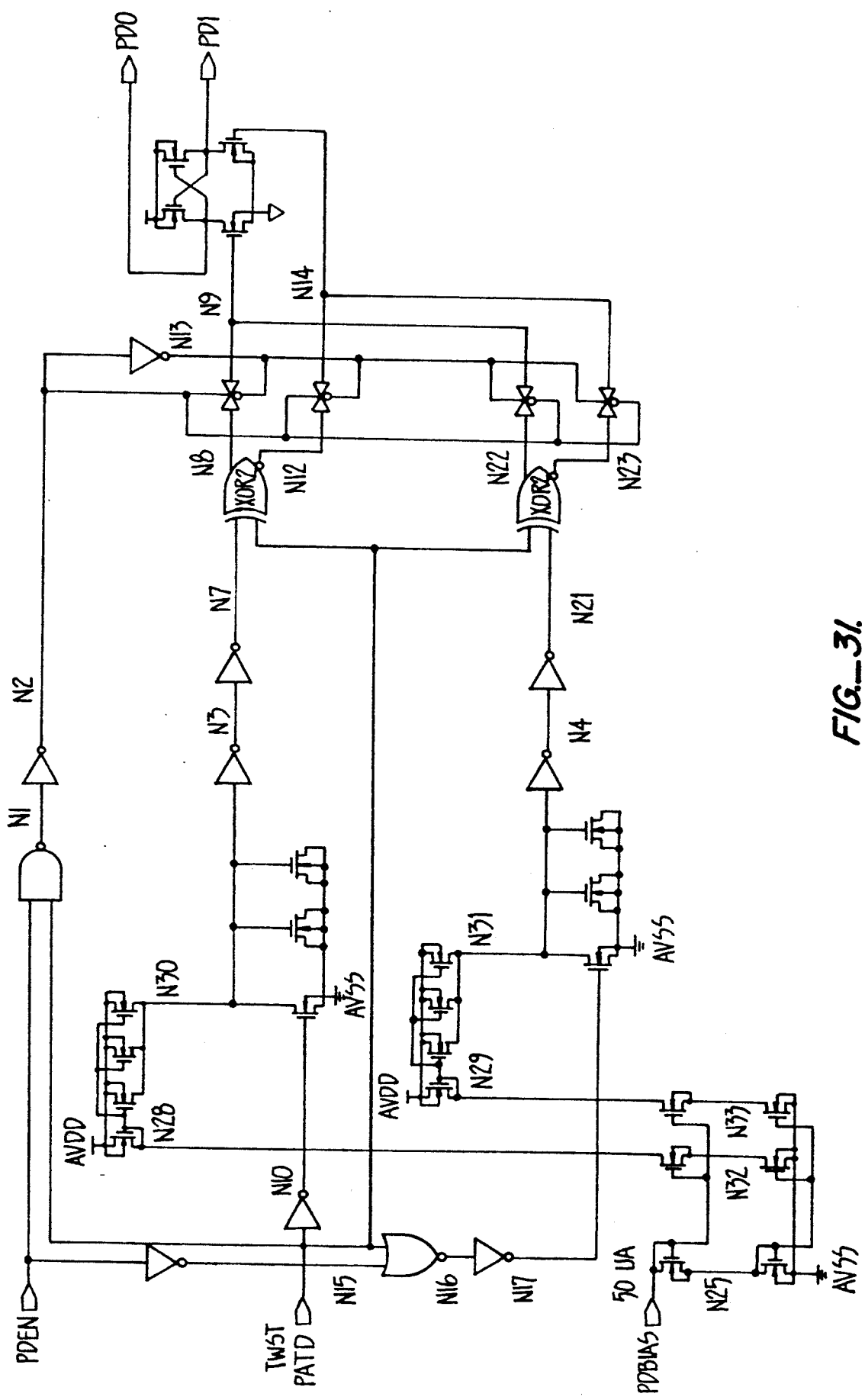
FIG._31.

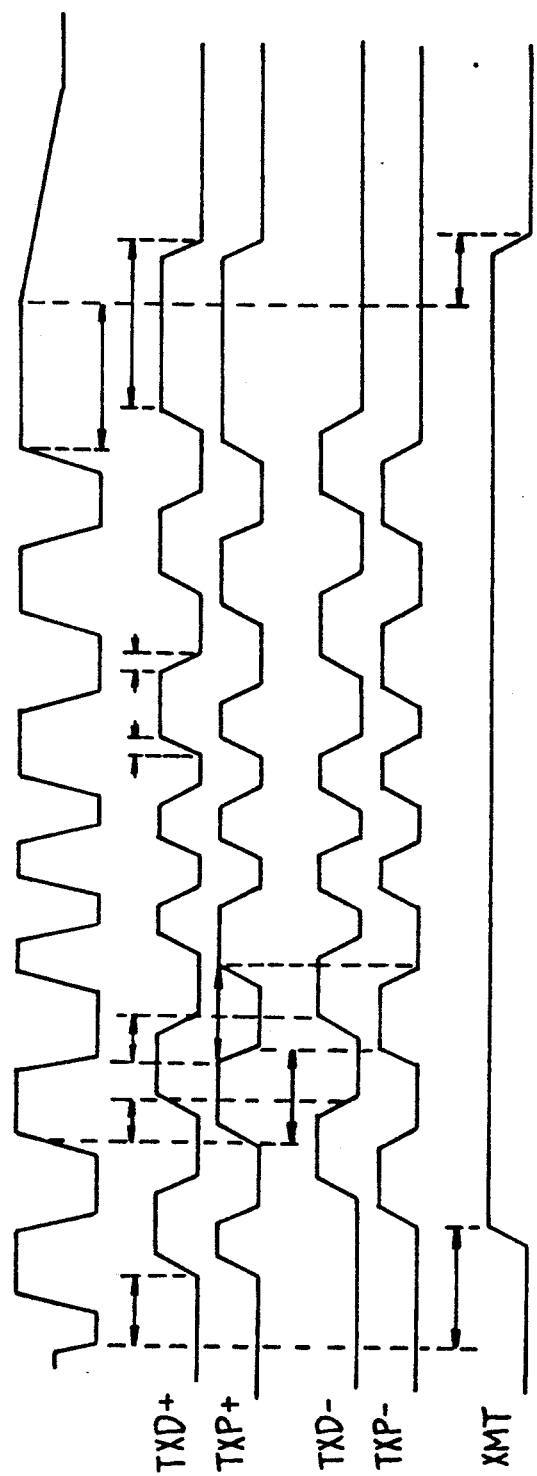
FIG._32.

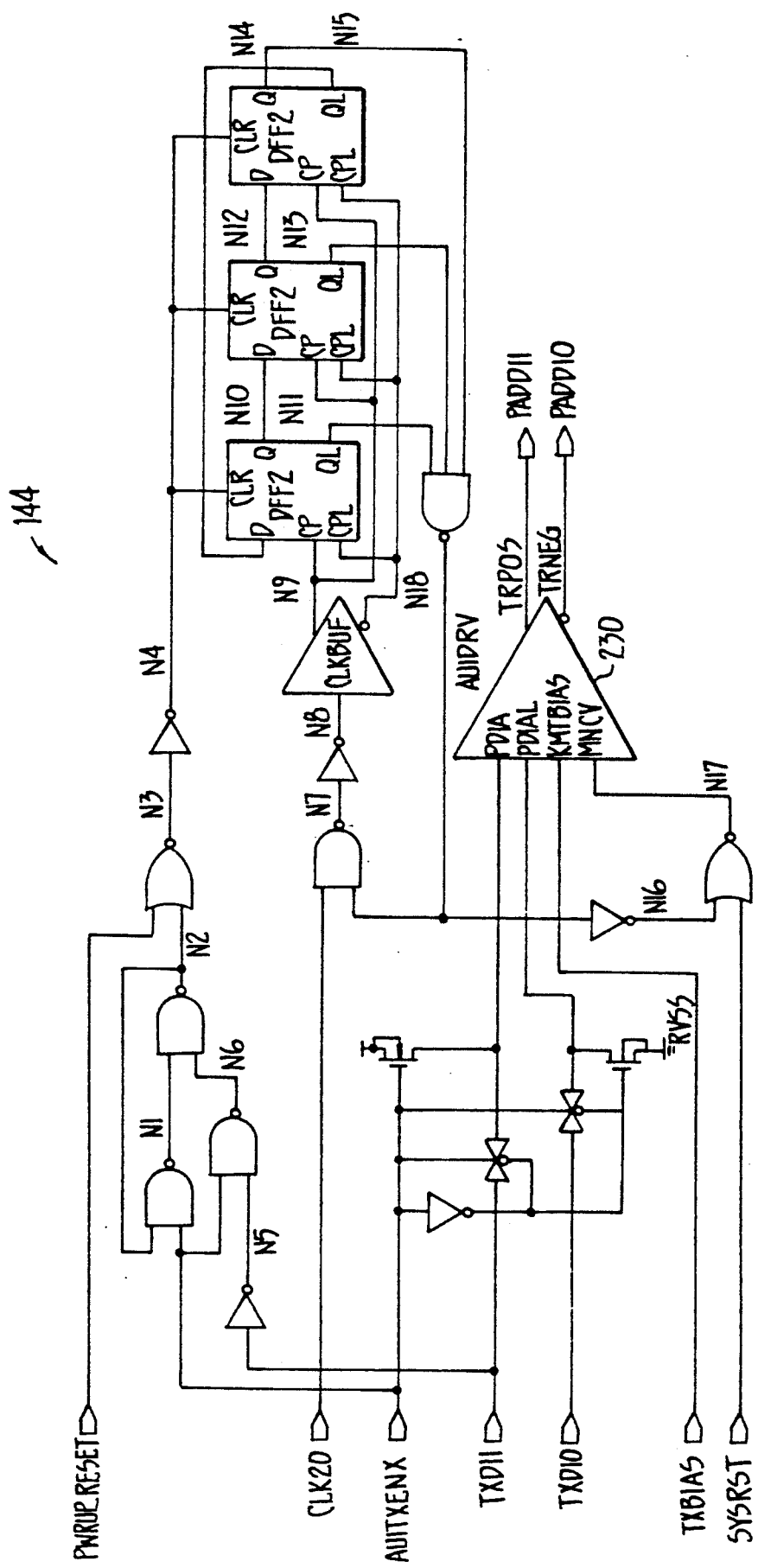
FIG._33.

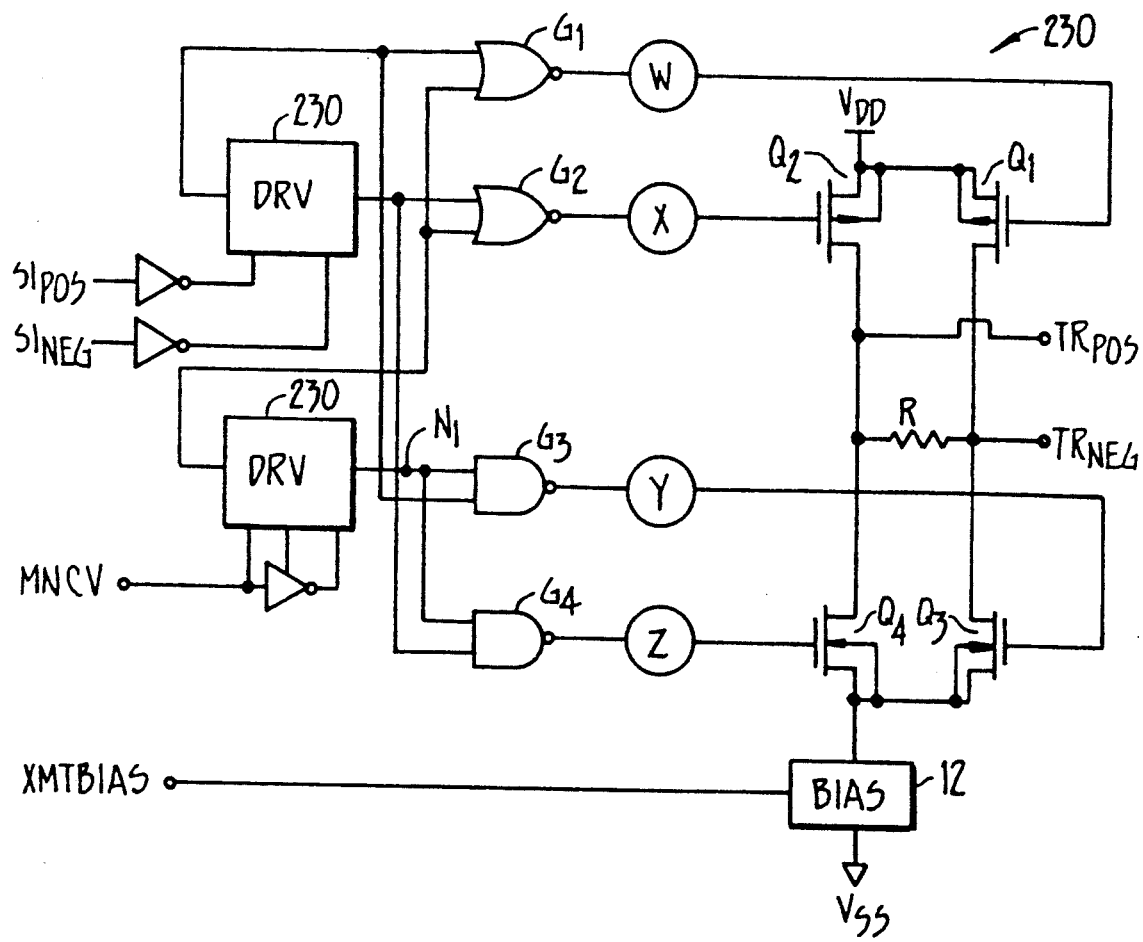
FIG._34.
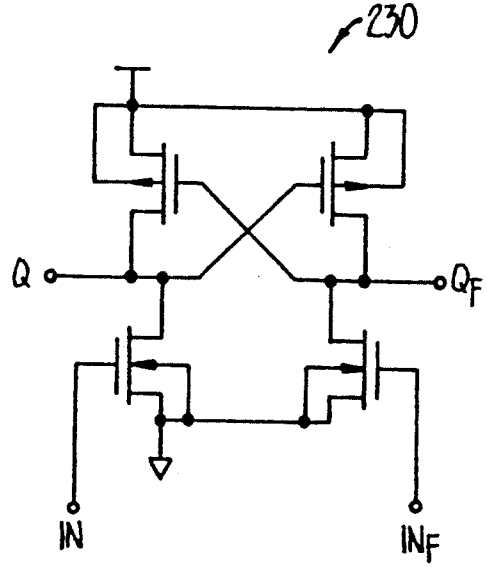
FIG._35.

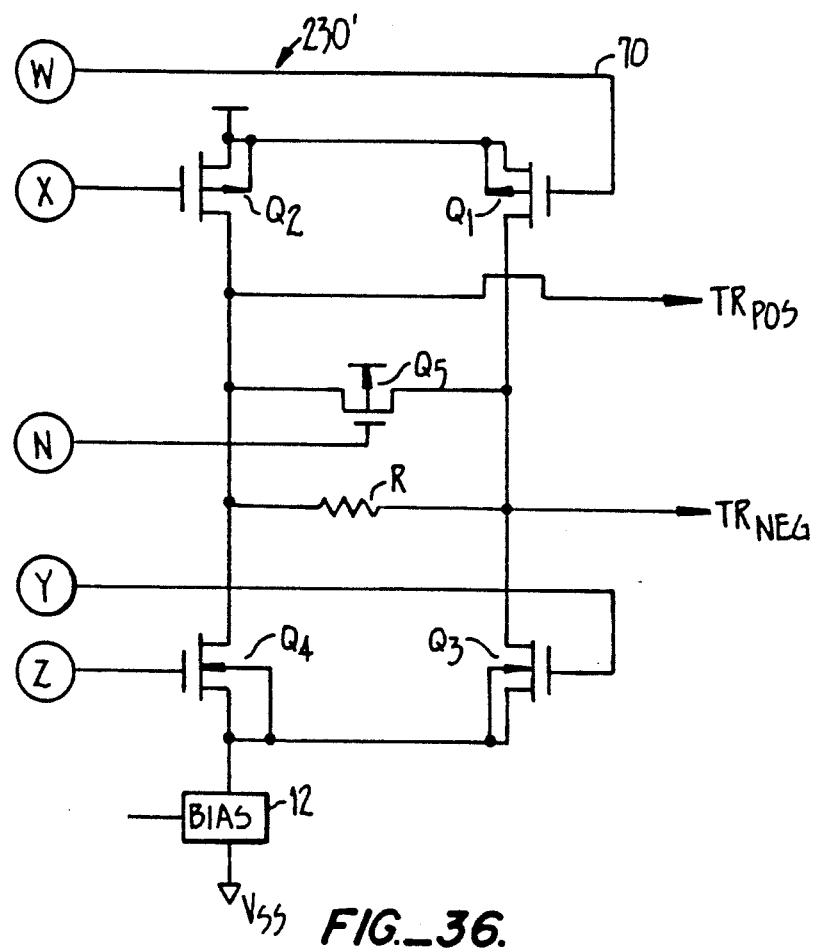
FIG._36.
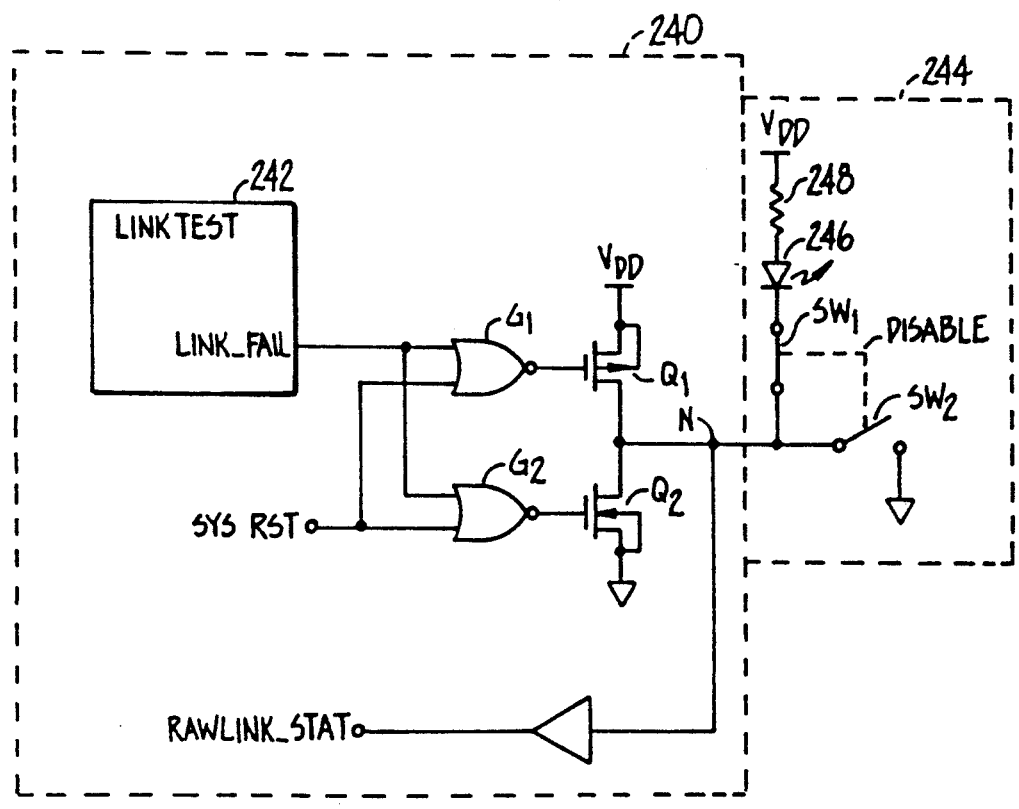
FIG._37.

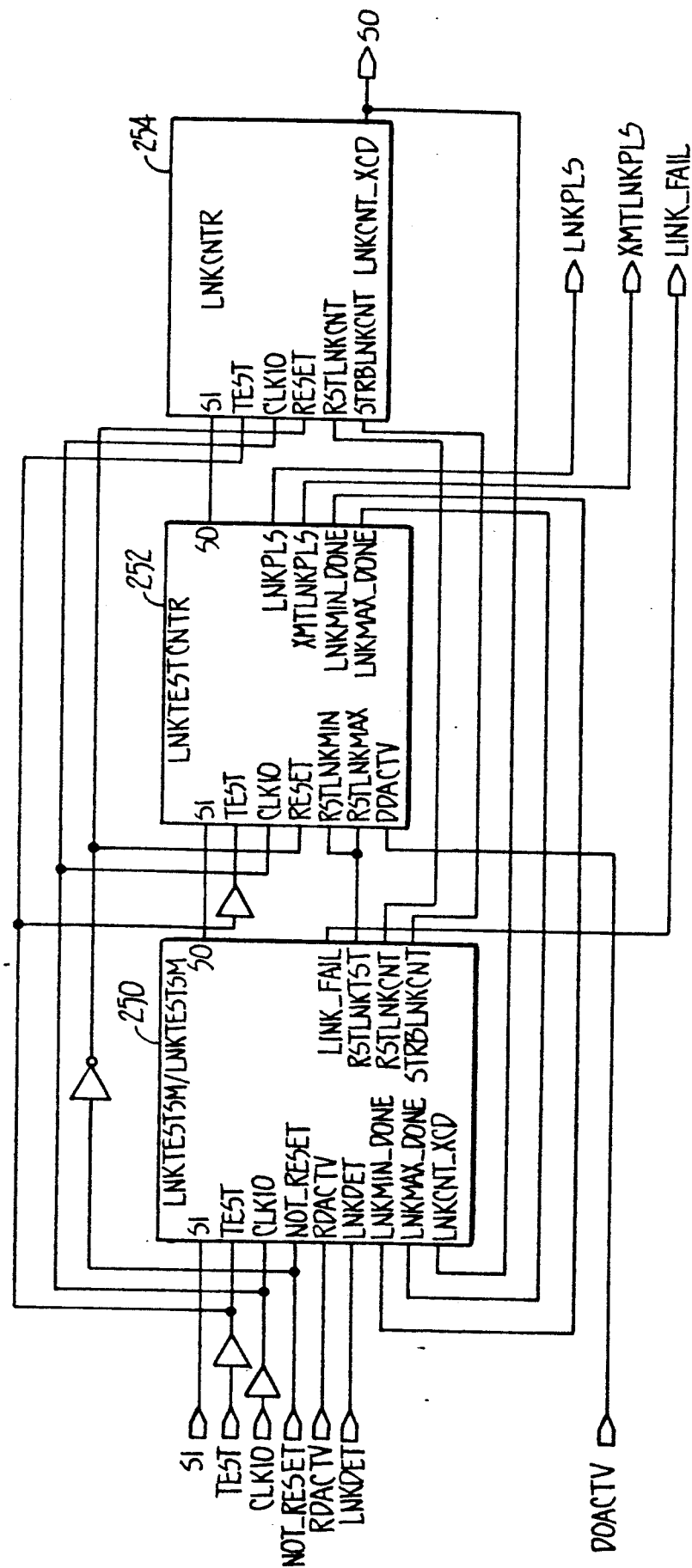
FIG._38.

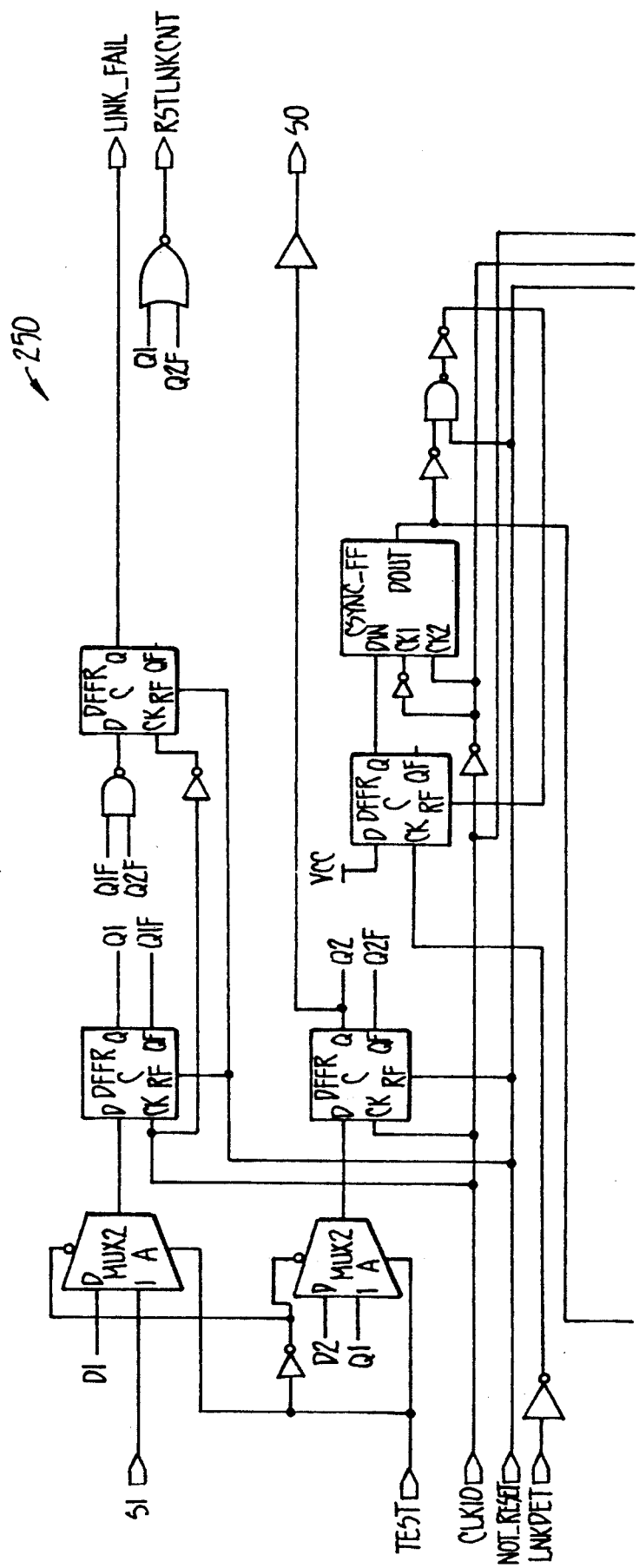
FIG._39A.

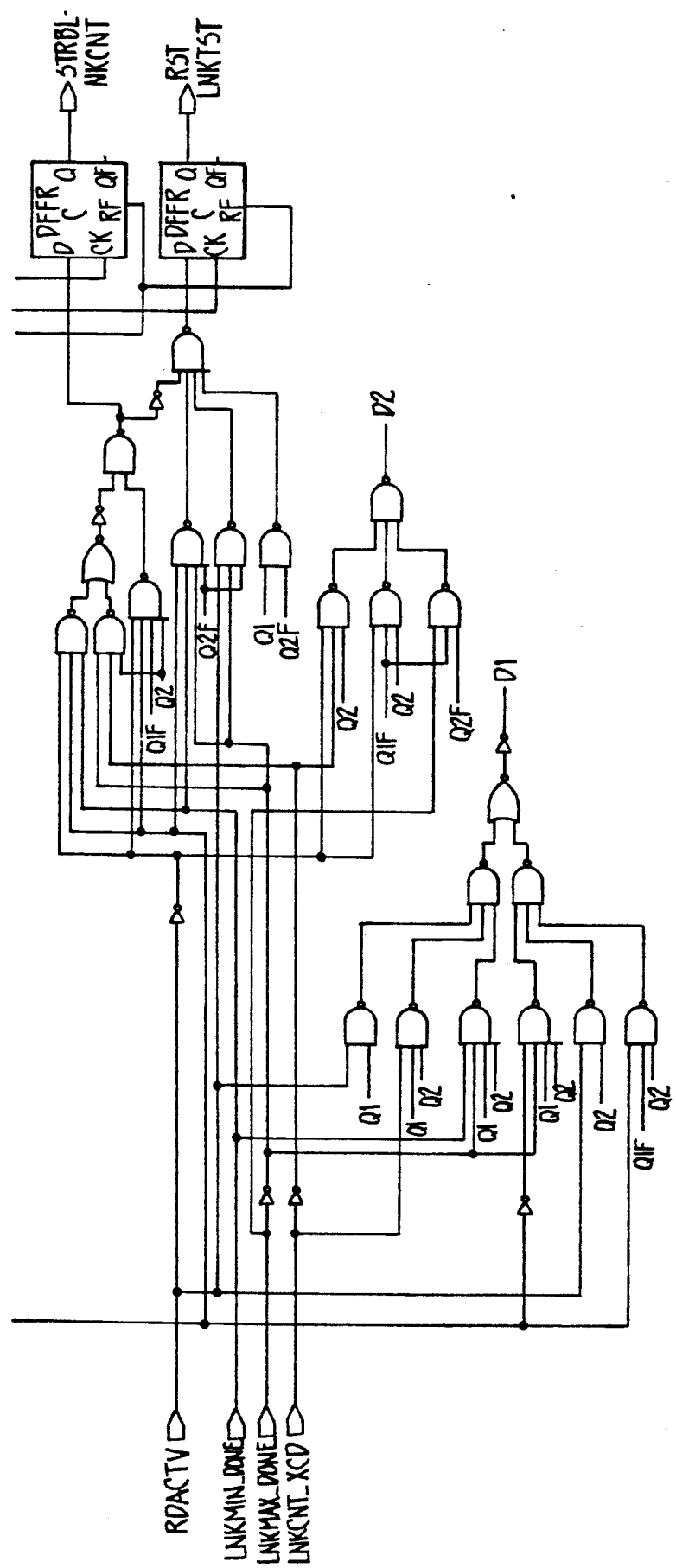
FIG._39B.

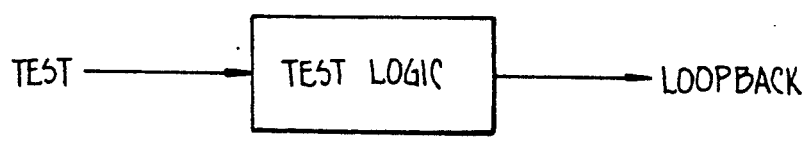
FIG._40.
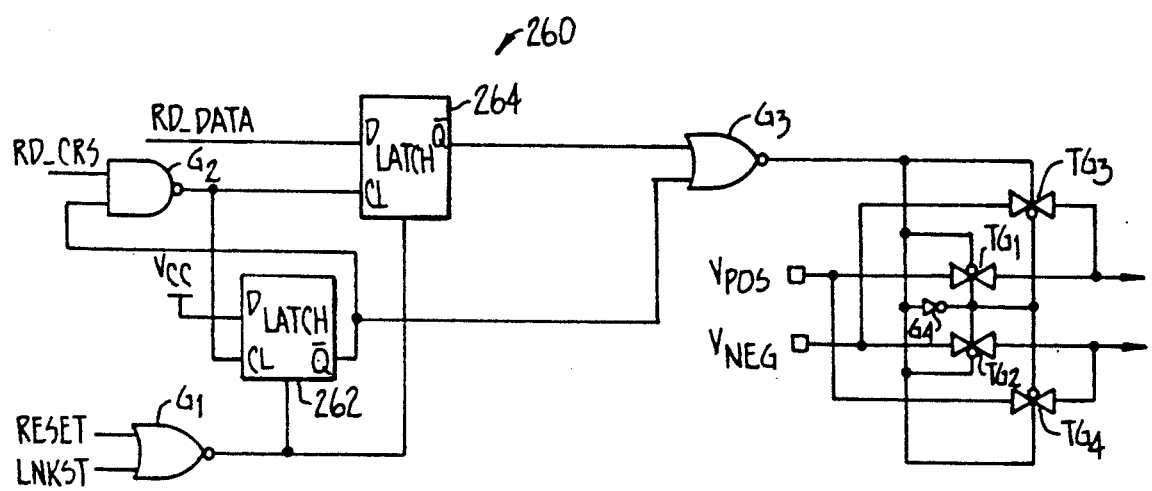
FIG._41.
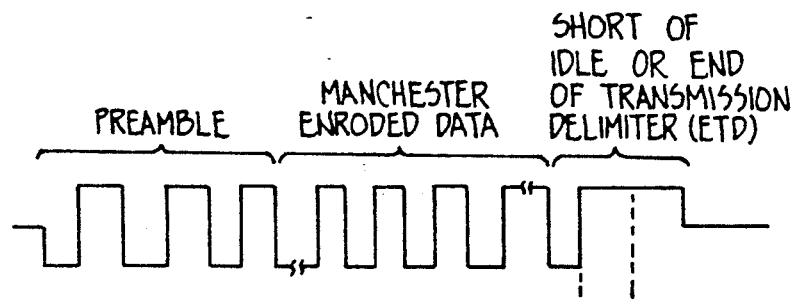
FIG._42A.
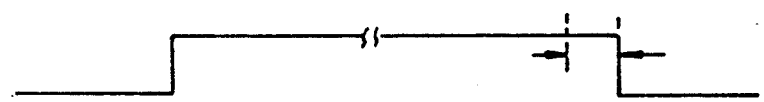
FIG._42B.
FIG._42C.

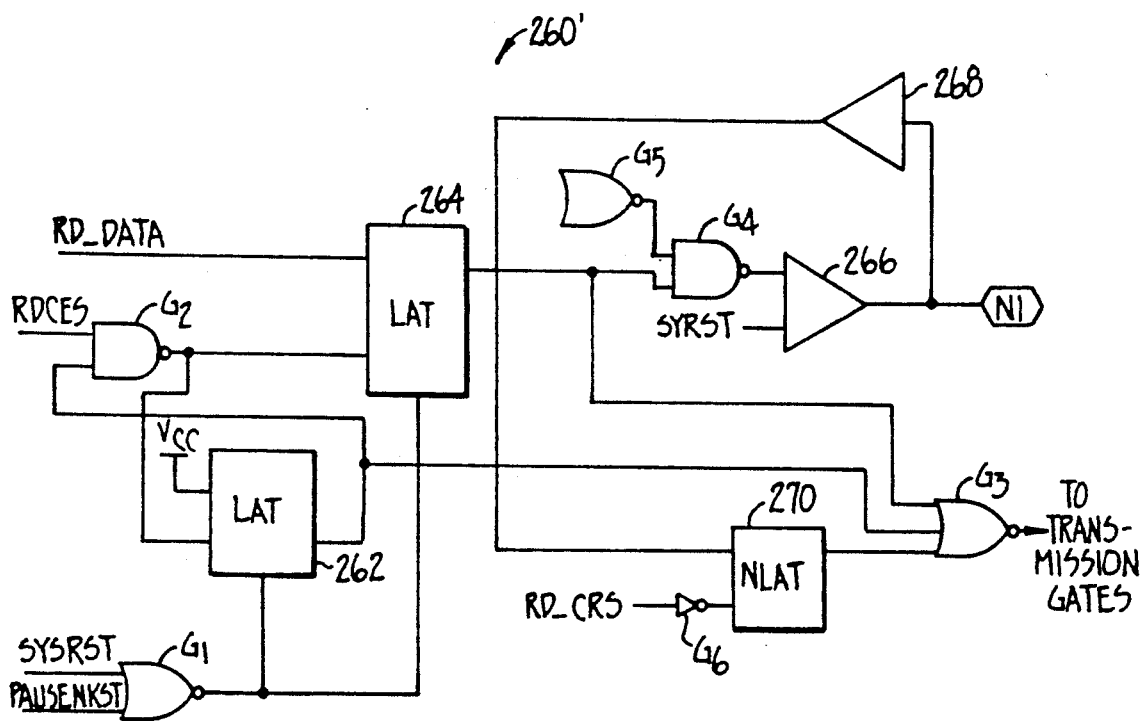
FIG._43.
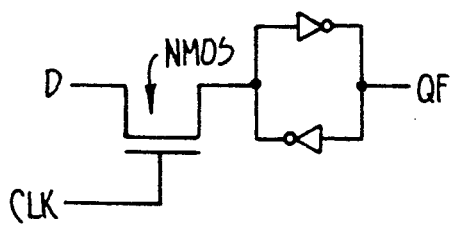
FIG._45.
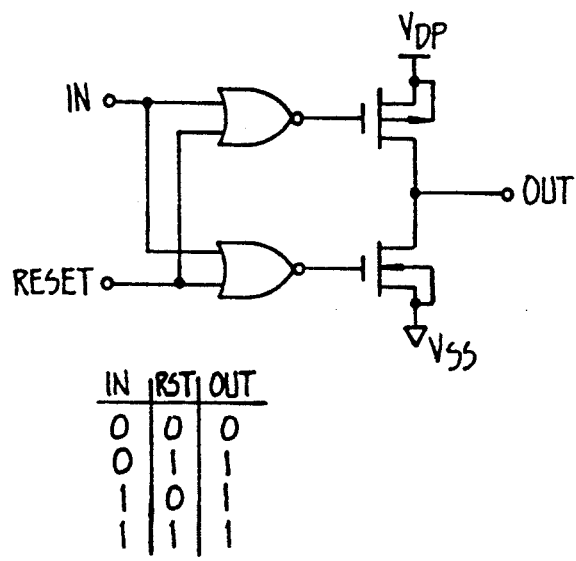
FIG._44.

MEDIUM ATTACHMENT UNIT FOR USE WITH TWISTED PAIR LOCAL AREA NETWORK

BACKGROUND OF THE INVENTION

The present invention relates generally to Medium Attachment Units ("MAU") of a Local Area Network ("LAN") and more specifically to an improved MAU for implementation of communication protocols with a twisted pair cable medium for a LAN system.

FIG. 1 is a block diagram of a conventional Local Area Network ("LAN") 10 of a type proliferating in the computing market. These LANs permit a Data Terminal Equipment ("DTE") $12_i$, a computer or business machine which provides data in a digital form, to transfer data and control information with other DTEs $12_i$. Communication from a first DTE $12_1$ to a second DTE $12_2$ is implemented by use of Data Communications Equipment ("DCE") $14_i$, which provide functions required to establish, maintain and terminate a connection. DCE 14 provides whatever signal conversion or processing that is necessary or desirable.

There are two interfaces which are important to understand. These include a DTE/DCE interface $16_i$ and a DCE/DCE interface 18, commonly referred to a transmission channel, or medium. For proper and reliable communication, a set of rules for communication between like processes, which provide a means of controlling information transfer between stations (DTEs) on a datalink, known as a protocol are implemented.

A popular protocol referred to as Carrier Sensing, Multiple Access, Collision Detection ("CSMA/CD") has been commercially successful. This protocol permits multiple stations to access a LAN system simultaneously. Each station, before transmitting, will sense for a carrier signal indicating that the network presently is being used to transmit a message. If it senses the carrier signal, transmission will not be initiated. It is possible, due to time delays in propagating a signal from a DTE $12_i$, that two transmissions will overlap. This overlap is referred to as a collision, which will be detected by DCEs $14_i$ on the network. Upon detecting a collision, all transmissions will be terminated and DTEs $12_i$ desiring to transmit will wait a random period of time before attempting to transmit again. This protocol is further defined in IEEE Standard 802.3, hereby expressly incorporated by reference for all purposes, which sets forth requirements for the DTE/DCE interface $16_i$, referenced as an Attachment Unit Interface ("AUI"). The IEEE Standard 802.3 defines a system which is similar to Ethernet ®, a registered trademark of Xerox Corporation.

FIG. 2 is a block diagram of an example of a particular type of LAN 10 of FIG. 1, which implements the IEEE Standard 802.3. A plurality of nodes 20, each of which includes a System Interface Adapter ("SIA") 22, are the DTEs $12_i$ of FIG. 1. SIA 22 is a encoder/decoder which translates information from Node 20 to a form required by the IEEE Standard 802.3. SIA 22 is coupled to a Medium Attachment Unit ("MAU") 26 by an AUI 30. MAU 26 and AUI 30 corresponds to DCE 14 and DTE/DCE interface 16, respectively, of FIG. 1.

Each MAU 26 must meet certain prespecified requirements, depending upon the type of medium to which it "translates" data to and from SIA 22. A standard identifying these prespecified requirements for MAU 26 is identified, for example, as 10 Base 5. This designation comes from three important physical layer (a model concerned with defining mechanical, electrical, functional and procedural characteristics of a physical link between two communicating devices) parameters. These parameters include transmission speed in megabits per second ("mbps"), whether baseband or broadband transmission is used and a segment length in hundreds of meters. Thus, 10 Base 5 identifies a 35 physical layer which uses baseband transmission at 10 mbps at a length up to 500 meters, which are typical values for a coaxial cable medium. A draft standard, 10 Base T has been proposed which identifies standards for twisted pair cable medium.

AUI 30 may include a plurality of 1:1 coupling transformers 32 which provide isolation which are not always needed in particular applications. MAU 26 is coupled to a coaxial cable 34 which is used as the medium interconnecting the plurality of Nodes 20 of LAN 10. A repeater 36 is also provided which is used to amplify or regenerate signals passed in the system to compensate for losses. Repeater 36 will also resynchronize signals as necessary.

The LAN 10 illustrated in FIG. 2 may be expensive or difficult to implement because of the coaxial cable 34 which must be installed. In preexisting buildings and other structures, the expense and difficulty to install the cable increase. Many buildings have pre-installed unshielded twisted pair wires used for telephone services. By using these pre-existing lines in lieu of the coaxial cable, a significant savings in cost may be realized. As the reader will readily appreciate, the transmission of digital signals on these twisted pair lines is more difficult as the lines are susceptible to noise and attenuation. Additionally, preexisting wiring may use combinations of wires of differing gauges and have many different types of terminations and nodes which make transmission along those wires unpredictable.

An implementation of LAN 10 with twisted pair cable may be performed, however, by changing MAU 26 from an access unit for coaxial cable to an access unit for twisted pair cable. As compatibility of the IEEE Standard 802.3 is desired, other components, e.g., AUI 30 and SIA 22, remain exactly the same.

It is therefore another object of the present invention to implement a new and improved MAU which can properly interface an AUI to a twisted pair medium and maintain compatibility with the IEEE Standard 802.3 and draft standard 10 Base T. In implementing this new MAU, improvements and features have been incorporated which are not addressed by the 10 Base T standard. Portability of the improved MAU to networks which do not necessarily implement all current features of the IEEE Standard 802.3 must be maintained. It is therefore an object of the present invention to ensure that portability to pre-standard networks may be simply and efficiently ensured.

For example, a link test is implemented in the current standard as an active idle by which information may be exchanged among active devices on a network assuring each device that the network is operational. Some pre-standard systems do not send link pulses, therefore post standard devices attached on a network with them will not receive link pulses, indicating a link failure where none is present. A prior art solution to this problem is to provide an ability of new devices to totally inhibit both link pulse receive and link pulse transmit functions.

SUMMARY OF THE INVENTION

The present invention provides method and apparatus for implementing a twisted pair MAU which is operative to send reliable transmission signals to and from DTEs on a LAN by use of twisted pair cable. The twisted pair MAU has a number of advantages which include: a variable loopback mode for various implementations of the MAU, as either a repeater MAU or a DTE MAU. Further, an improved twisted pair line driver is provided which will provide a ramped response differential output signal having reduced jitter. Also included is an improved CMOS AUI line driver feature which has a simplified ETD control. Additionally, a combined override and status indication of link status and automatic polarity reversal is provided.

A further understanding of the nature and advantages of the invention may be realized by reference to the remaining portions of the specification and the drawings.

BRIEF DESCRIPTION OF THE DRAWINGS

FIG. 1 is a block diagram of a conventional local area network ("LAN") 10 of a type proliferating in the computing market;

FIG. 2 is a block diagram of a LAN 10 implementing IEEE Standard 802.3;

FIG. 3 is a schematic block diagram of functional blocks of an improved twisted pair MAU 50 embodying aspects of the present invention;

FIG. 4 illustrates a typical system application of integrated circuit 52 and MDI 54;

FIG. 5 is a block diagram of integrated circuit 52 including a CORELOGIC circuit 100, a TESTMUX circuit 102, an AUIPORT circuit 104 and a TWSTPRPORT circuit 106;

FIG. 6 is a functional block diagram further illustrating features of CORELOGIC 100;

FIG. 7 through FIG. 11 are directed to circuitry for implementation of a Smart Squelch for MAU 50;

FIG. 7 is a graphical representation of a noise packet $N_p$ superimposed over a Manchester preamble shown in phantom;

FIG. 8 is a schematic block diagram of a methodology adopted to satisfactorily address the requirements of squelch and data integrity and transmission delay;

FIG. 9 is a block diagram of RDRCVR 222 of FIG. 28 including a receive data receiver ("RDRCV") circuit 126 and a receive data receiver squelch ("RDRCVSQ") circuit 128;

FIG. 10 is a schematic diagram of RDRCV circuit 126 which performs an "amplitude" squelch qualification on received data from $V_{pos}$ and $V_{neg}$;

FIG. 11 is a schematic block diagram of RDRCVSQ circuit 128 illustrated in FIG. 9

FIG. 12 through FIG. 15 are block schematic diagrams of AUIPORT 104 of FIG. 5 illustrating implementation of the isolation impedance presented to AUI 30 during idle mode;

FIG. 12 is a block schematic diagram of AUIPORT 104 showing its functional subunits;

FIG. 13 is a circuit schematic diagram of VREF circuit 140 which supplies power to the circuits of AUIPORT 104;

FIG. 14 is a schematic diagram of AUIXMTTR circuit 144;

FIG. 15 is a schematic diagram of AUIRCV circuit 146;

FIG. 16 through FIG. 25 are schematic block diagrams and illustrations of MAU 50 configured for implementing the loopback modes;

FIG. 16 is a schematic block diagram of an improved twisted pair MAU 50 incorporating a preferred embodiment of the present invention;

FIG. 17 is a schematic diagram of a preferred embodiment of test multiplexer 102;

FIG. 18 illustrate a plurality of logic gates which perform the logic circuitry to appropriately reroute transmission paths through 50 depending upon a particular loopback mode desired;

FIG. 19 is schematic of a preferred embodiment of transmission gate $TG_i$;

FIG. 20 is a schematic illustration of MAU 50 in its pass through loopback mode where data from DO is passed directly to TX, without predistortion and signals received from RX are transmitted directly to DI, with collision detection disabled to permit simultaneous transmission from DI and TX;

FIG. 21 is a schematic illustration of MAU 50 in its return mode where signals from DO are returned to DI and signals from RX are returned to TX;

FIG. 22 is a schematic illustration of the use of a LAN system to perform an external loopback test;

FIG. 23 is a schematic illustration of the use of a LAN 10 subsystem to perform a link integrity test from repeater 36;

FIG. 24 is a schematic illustration of the use of loopback modes to provide a generic wiring continuity test;

FIG. 25 through FIG. 32 illustrate an improved twisted pair driver used as part of twisted pair MAU 50;

FIG. 25 is a block schematic diagram illustrating a preferred embodiment of a twisted pair transmitter 200;

FIG. 26 illustrates a square waveform input at TD and TD0;

FIG. 27 illustrates a ramped response output of output stage 206 from input square waveforms of the type of FIG. 26;

FIG. 28 is a block diagram of TWSTPRPORT 106 having a Twisted Pair Transmitter ("TDXMTTR") 220 and a Twisted Pair Receiver ("RDRCVR") 222;

FIG. 29 is a block diagram of TDXMTTR 106 including a TD twisted pair driver circuit ("TDXMDR") 224 and a Twisted pair predistortion driver circuit 226;

FIG. 30 is a circuit schematic diagram of TDXMTTR 220 for driving output terminals TXD1 and TXD0;

FIG. 31 is a circuit diagram of TWSTPRPD 226 for providing a predistortion feature of for MAU 50;

FIG. 32 illustrates a set of timing relationships of output waveforms of TDXMTTR 220;

FIG. 33 is a schematic diagram of AUIXMTTR 144 having an AUI Driver ("AUIDRV") 230 for output of DI+ and DI− from MAU 50;

FIG. 34 is a schematic diagram illustrating a preferred embodiment of AUIDRV 230;

FIG. 35 is a schematic diagram of a preferred embodiment of an inverting driver, such as driver 230;

FIG. 36 is a schematic diagram of AUIDRV 230' which is designed to provide an ETD termination with acceptable levels of backswing;

FIG. 37 is a block schematic diagram illustrating a preferred embodiment of an aspect of the present invention including a combined function override and status indication for a link test feature;

FIG. 38 is a block schematic diagram of a LINK TEST subnetwork of CORELOGIC 100 having a LINKTEST state machine 250 circuit, a linktest counter circuit 252 and a link counter circuit 254;

FIG. 39 is a schematic diagram of LINKTEST state machine 250 circuit;

FIG. 40 is a schematic diagram of TESTLOGIC 110 of FIG. 6;

FIG. 41 is a schematic diagram of a subnetwork of FIG. 6 for reversing polarity of two signals, $V_{pos}$ and $V_{neg}$ if necessary;

FIG. 42 illustrates a plurality of waveforms which are relevant to a discussion of an preferred embodiment of an aspect of the present invention relating to polarity reversal;

FIG. 44 is a schematic circuit diagram of a preferred embodiment for buffer 266, as well as a truth table illustrating its operation; and FIG. 45 is a schematic diagram of NMOS latch 270.

DESCRIPTION OF A PREFERRED EMBODIMENT

Contents

I. General
II. AUI Driver
III. Combined Function Override/Status
IV. Polarity Detection/Reversal
V. Loopback Implementation
VI. Twisted Pair Driver
VII. Smart Squelch

I. General

Transmission of information in a network is limited by the type of medium used. Information which is necessary to know in order to make reliable transmission of information include characteristics of the medium and characteristics of the signal to be transmitted. The implementation of twisted pair as a network medium is fraught with hazards because the medium characteristics may not be accurately predicted in advance as they would if coaxial cable were used. An improved medium access unit for twisted pair cable is therefore provided. This improved medium access unit will implement mandatory features in an improved manner and additionally provide features not found in these medium access units before.

The 10 Base T standard includes a number of mandatory functions which are included and implemented by the improved MAU:

1. Transmit function

Provides an ability to transfer Manchester encoded data from a DO circuit to a TD circuit. While not sending Manchester encoded data on the TD circuit, an idle signal TP_IDL is sent on the TD line,

2. Receive Function

Provides an ability to transfer Manchester encoded data from a RD circuit to a DI circuit. While not sending Manchester encoded data on the DI circuit, an idle signal IDL is sent on the DI circuit,

3. Loopback function

Provides an ability to transfer Manchester encoded data from the DO to the DI circuit when the MAU is sending Manchester encoded data to the TD circuit,

4. Collision Presence function

Provides an ability to detect simultaneous occurrence of Manchester encoded data on the RD and the DO circuits and to report such occurrence as a collision,

5. Signal quality error message ("SQE") test function

Provides an ability to indicate to the DTE that the collision detecting mechanism is operational and that the SQE message can be sent by the MAU,

6. Jabber function

Provides an ability to prevent abnormally long reception of Manchester encoded data on the DO circuit from indefinitely disrupting transmission on the network which, when present, disables transfer of Manchester encoded data by the Transmit and the Loopback functions, and

7. Link Integrity Test function

Provides an ability to protect the network from consequences of a one-way link failure by monitoring an RD circuit for RD_input and link test pulse activity, whereby if neither condition is satisfied within a pre-specified time, the MAU shall enter a link fail state and cause idle to be sent on the DI and TD circuits until RD_input is received or sufficient link test pulse activity is detected. The link fail state shall disable bit transfer of the transmit, receive and loopback functions, and the collision presence and SQE test functions.

FIG. 3 is a schematic block diagram of functional blocks of an improved twisted pair MAU 50 embodying aspects of the present invention. MAU 50 includes an integrated circuit 52 and external medium dependent interfaces ("MDI") 54.

Integrated circuit 52 includes a line receiver and squelch circuit 60 for receipt of DO signals from SIA 22 not shown. Line receiver and squelch circuit 60 is coupled to a line driver and pre-distortion circuit 62 and to a jabber control circuit 64. Jabber control circuit 64 is coupled to a collision and loopback circuit 66 which is coupled in turn to a CI line driver 68 and a DI line driver 70. A voltage controlled oscillator 72 provides an input into collision and loopback circuit 66.

A line receiver and noise filter circuit 80 is coupled to a link test circuit 82 and a polarity detection and auto reversal circuit 84. Polarity detect and auto reversal circuit 84 is coupled to DI line receiver 80.

MDI 54 contains external resistor and filter components to permit an optimization of signals on a twisted pair cable 90. As will be described in detail below, the mutual interaction of the circuits of integrated circuit 52 and MDI 54 meet the desired objects of the present invention.

FIG. 4 illustrates a typical system application of integrated circuit 52 and medium dependent interface ("MDI") 54. Integrated circuit 52 is receives a plurality of signals, transmits a plurality of signals and is responsive to a plurality of control signals for interfacing a DTE 12 or Repeater 36 to twisted pair cable 90. These plurality of signals which are transmitted and received and the control signals include:

2.1. Pin Definition

| Symbol | Type(*) | Name and Function |
|---|---|---|
| TXD+, TXD- | O | Transmit Data. Output. 10BASE-T |

| Symbol | Type(*) | Name and Function |
|---|---|---|
| TXP+, TXP− | O | port differential drivers. Transmit Pre-Distortion. Output. Transmit waveform Pre-Distortion Control. |
| RXD+, RXD− | I | Receive Data. Input. 10BASE-T port differential receivers. |
| DO+, DO− | I | Data Out. Input. AUI port differential receiver. |
| DI+, DI− | O | Data In. Output. AUI port differential driver. |
| CL+, CL− | O | Control In. Output. AUI port differential driver. |
| LNKST | I/O | Link Status. Open Drain, Input-Output. When this pin is tied LOW, the internal Link Test Receive function is disabled and the Transmit and Receive functions will remain active irrespective of arriving idle link pulses and data. Integrated circuit 52 continues to generate idle link pulses irrespective of the status of this pin. As an output, this pin is driven LOW if the link is identified as functional. However, if the link is determined to be non-functional, due to missing idle link pulses or data packets, then this pin is not driven. In the LOW output state, the pin is capable of sinking a maximum of 16mA and can be used to drive an LED. This pin is internally pulled High. |
| RXPOL | I/O | Receive Polarity. Open Drain, Input-Output. The twisted pair receiver is capable of detecting a receive signal with reversed polarity (wiring error). RXPOL pin is normally in the LOW state, indicating correct polarity of the received signal. If the receiver detects a received packet with reversed polarity, then this pin is not driven (goes HIGH) and the polarity of subsequent packets are inverted. In the LOW output state, this pin can sink up to a maximum of 16mA and is therefore capable of driving an LED. This feature can be disabled by strapping this pin LOW. In this case the Receive Polarity correction circuit is disabled and the internal receive signal remains non-inverted, irrespective of the received signal. This pin is internally pulled HIGH. |
| −SQE TEST | I | Signal Quality Test (Heartbeat) Enable. Input, Active Low. The SQE test function is enabled by typing this input LOW. This input is internally pulled High. |
| −PRDN/−RST | I | Power Down/Reset. Input, Active LOW. Driving this input LOW resets the internal logic of the integrated circuit 52 and places the device in a special Power Down mode. In the Power Down/Reset mode, all output drivers are placed in their inactive state. |
| XMT | O | Transmit. Output. This pin is driven HIGH while integrated circuit 52 is receiving data on the AUI DO pair and is transmitting data on the TXD/TXP pins. The output is HIGH during Collision. |
| RCV | O | Receive. Output. This pin is drive HIGH while integrated circuit 52 is receiving data on the RXD pins and is transferring the received signal onto the AUI DI pair. This |

| Symbol | Type(*) | Name and Function |
|---|---|---|
| REXT | I | output is HIGH during Collision. External Resistor. Input. An external precision resistor is connected between this pin and the positive power supply, in order to supply a voltage reference for the internal Voltage Controlled Oscillator (VCO). |
| TEST | I | Test. Input, Active High. This Pin should be tied LOW for normal operation. If this pin is driven HIGH, integrated circuit 52 will enter Loopback Test mode. The type of loopback is determined by the state of the −SQE TEST pin. If this pin is in the LOW state (Station MAU), integrated circuit 52 transfers data independently from DO to TXD/TXP circuit and from RXD to DI circuit. If the −SQE TEST is in the HIGH state (Repeater MAU), then data on RXD circuit is transmitted back onto the TXD/TXP circuit and data on the DO circuit is transmitted on the DI pair. |
| AVDD | P | Analog Power. This pin supplies the +5V to the analog portions of the integrated circuit 52 circuitry. |
| AVSS | P | Analog Ground. This pin supplies the 0V to the analog portions of the integrated circuit 52 circuitry. |
| VDD | P | Digital Power. This pin supplies +5V to the digital portions of the integrated circuit 52 circuitry. |
| VSS | P | Digital Ground. This pin supplies the 0V to the digital portions of the circuitry. |

(*)Pin Types are: I Input  O Output  I/O Input and Output  P-Power

Further description of these signals will be set forth below.

FIG. 5 is a block diagram of integrated circuit 52 including a CORELOGIC circuit 100, a TESTMUX circuit 102, an AUIPORT circuit 104 and a TWSTPRPORT circuit 106. CORELOGIC 100 performs the house keeping and logic functions of integrated circuit 52 and interface with TESTMUX 102 and AUIPORT 104 and TWSTPRPORT 106. The functions and operations of these circuits provide the features and meet the objectives of the present invention.

FIG. 6 is a functional block diagram further illustrating features of CORELOGIC 100. CORELOGIC 100 includes a testlogic 110 circuit, a SQETEST 112 circuit, a LINKTEST circuit 114, a jabber circuit 116 and a XMTRCV circuit 118.

This is the top-level logic schematic, which encompasses all the 'back-end' digital logic. CORELOGIC controls the function of the integrated circuit 52 drivers receivers, and status pins. It is composed of five major circuit blocks (TESTLOGIC, XMTRCV, SQETEST, LINKTEST, and JABBER), a power-up reset circuit, and some random logic.

Input and Output Signals

The following is a list of CORELOGIC input and output signals, where the input signals come from, where the output signals eventually go, and their function.

LINKDET (input) This signal is generated by the twisted-pair receiver's smart squelch circuitry (RXLINK of the RDPWSQ circuit block). A link test pulse detected by the twisted-pair receiver generates a positive pulse approximately 20 ns to 100 ns+ wide, depending on the width and amplitude of the received link test pulse. LINKDET is monitored by the LINKTEST circuit.

RD_DATA (input) This signal is the manchester encoded data which is detected by the twisted-pair input receiver, smart squelch qualified, and amplified before being sent to the DI transmitter circuits. It is used by CORELOGIC to determine the received data polarity.

RDCRS (input) This is the RD data carrier sense signal which is generated by the twisted-pair receiver smart squelch circuitry. It is used primarily by the LINKTEST circuit and XMTRCV circuit within CORELOGIC.

DOCRS (input) This is the DO data carrier sense signal which is generated by the AUI DO+/− input squelch and pulse width qualification circuits. It is used primarily by the SQETEST, JABBER, and XMTRCV circuits within CORELOGIC.

NOT_SQETEST (input) This signal is taken directly from the NOT_SQETEST pad. The signal is buffered by TPXINBUF to accept TTL-level logic signals. NOT_SQETEST is primarily used to allow/inhibit the end-of-packet SQE heartbeat transmission on CI+/− and is also used by the SCAN PATH test circuitry as the SI (Scan In) serial input.

NOT_PRDN (input) This signal is an active LOW signal which is routed from the NOT_PRDN pad. When PRDN is LOW it generates a system reset signal in CORELOGIC and shuts off the integrated circuit 52 bias current sources in the AUIPORT's VREF circuit. The PRDN signal is buffered by TPXINBUF to accept TTL-level logic signals.

PWRUPBIAS (input) This is a 2.5 $\mu$A (nominal) bias current from the AUIPORT's VREF circuit. It is used as a capacitor charging current in the CORELOGIC's PUPRST (power-up reset) circuit to provide a 10 $\mu$sec reset pulse during power-up.

RAWCLK10 (input) This signal is a 10 MHz +/−15% (50% duty cycle) clock which is generated by the integrated circuit 52 VCO. This signal is suspended during system resets. It provides the clock for the CORELOGIC and its state machines and counters during normal operation.

TEST (input) This signal is connected directly to the integrated circuit 52 TEST pad. An input buffer, TPXINBUF, accepts TTL-level logic signals and provides output levels compatible with MOS logic. The TEST signal is used by the TESTLOGIC circuit to select Integrated circuit 52 test modes.

TEST2 (input) The TEST2 signal is used by the TESTLOGIC circuit for production testing.

SYSRST (output, optional) This active-HIGH control signal is the system reset enable. It resets the CORELOGIC circuits, the AUIPORT's TPEXVCO and AUIRCVSQ circuits, and the TWSTPRPORT's RDRCVSQ circuit. SYSRST also disables the 16 mA output drivers (driving the RXPOL and LNKST pads) by driving them into the low-current (100 $\mu$A, max) output-HIGH states.

STAT RVRSPOL (input/output) This is an I/O signal which is routed to the RXPOL pad. As an active-LOW output, which is capable of sinking 16 mA, it indicates whether the Integrated circuit 52 has received a packet with reversed polarity. As an input, it is buffered to accept TTL-level logic signals and is used to enable/disable the receive polarity correction circuitry.

LINK FAIL (input/output) This is an I/O signal which is routed to the LNKST pad. As an active-LOW output, which is capable of sinking 16 mA, it indicates whether the Integrated circuit 52 has entered the Link Fail state. As an input, it is buffered to accept TTL-level logic signals and is used to enable/disable the Link Test Receive functions of the Integrated circuit 52.

STAT_RDCRS (output) This active-HIGH signal is routed to the RCV pad and goes HIGH when RD data is detected by the twisted pair receiver and the Integrated circuit 52 is not in the Link Fail state. This output is capable of driving one TTL input.

STAT_DOCRS (output) This active-HIGH signal is routed to the XMT pad and goes HIGH when DO data is detected by the AUI receiver circuit and the Integrated circuit 52 is not in the Link Fail or Jabber states. This output is capable of driving one TTL input.

FIXPOL (output) This signal is used to control multiplexers in the twisted-pair RD data path which invert the RD data polarity. FIXPOL will be HIGH if a reversed packet was received and polarity reversal is enabled.

SQLCH_INHB (output) This signal is sent to the AUI DO+/− receiver and twisted pair RD+/− receiver circuits. When enabled, this signal defeats squelch on AUI DO+/− and RD+/−.

CIDRVEN (output) This signal is the enable control for the CI+/− output drive circuits. It is normally activated when SQE test (heartbeat), collision, or jabber conditions indicate that the 10 MHz SQE signal must be transmitted onto the AUI CI+/− pair.

STATIC_TEST (output) This control signal is used in conjunction with production testing.

DITXENX (output) This signal is the enable control for the DI+/− output driver. It is normally activated when DO+/− data is looped back or when RD+/− data is to be sent to DI+/−.

TPDRVEN (output) This signal is the enable control for the TP+/− output drive circuits. It is normally activated when DO+/− data or a link pulse is to be sent to TP+/−. It is active during LOOPBACK-RPTR when RD data is to be sent to TP+/−. TPDRVEN is also hardwired to the predistortion enable input to the TP+/− output driver.

RD2DICTL (output) This active-HIGH control signal enables the TESTMUX circuit to route RD data to t he DI driver inputs.

LNKPLS (output) This active-HIGH control signal enables the TESTMUX circuit to route a logic-HIGH signal to the input of the TP+/− driver's data input. This control is active one bit-time before, during, and one bit-time after a link pulse transmission is performed to be certain only a HIGH pulse is transmitted onto the twisted-pair output lines.

RD2TDCTL (output) This active-HIGH control signal enables the TESTMUX circuit to route received RD data to the input of the TP+/− output driver.

NOT_PWRDN (output) This active-LOW reset signal is a buffered signal from the NOT_PRDN pad. It is sent to the AUIPORT's VREF circuit where it shuts off the Integrated circuit 52 bias current sources when the chip enters the power-down mode.

PWRUP_RESET (input) This active-HIGH reset signal is generated by a power-up circuit within CORE-LOGIC.

II. AUI Driver

FIG. 33 is a schematic diagram of AUIXMTTR 144 having an AUI Driver ("AUIDRV") 230 for output of DI+ and DI− from MAU 50.

IEEE Standard 802.3 specifies a particular waveshape for sending information on the AUI connection to and from the network, which is an implementation of Manchester encoding. The waveform has a start of transmission part and an end of transmission part. The start of transmission part has an identification which consists of a series of alternating 1's and 0's. The end of transmission part has an end of transmission delimiter ("ETD") which is unusual in that the encoded signal is held high for a minimum of two bit times, approximately 200 ns for a 10 MHz signal.

A receiver which is monitoring the Manchester encoded signal detects for transitions through zero. When approximately 1.5 bits times have elapsed without a transition, receivers will presume that a message has been completed or has become lost. The receiver will turn off and begin use of an internal clock in anticipation of transmitting a signal, or some other desired function.

The ETD function can be problematic in that AUI lines may include one or two isolation transformers which are driven by this signal. The transformers can introduce backswing into a signal if an input to the transformer is held high, such as with the ETD function, when an attempt is made to turn the ETD off instantaneously. Backswing develops because the transformer has developed a magnetic field which will collapse and produce a current flow opposite in direction to a current flow direction induced by the ETD. This reversed current direction induces a reverse polarity on the AUI line until the stored energy of the system is dissipated. If the backswing is of sufficient magnitude, the induced voltage can go negative, causing a transition. A receiver monitoring this line may perceive this backswing as another message because the start of transmission indicator begins with a negative transition. Receivers are configured to detect start of transmission with a voltage transition of greater than 160-320 mV and having a minimum pulse width. Thus, the backswing may cause a receiver to begin monitoring the backswing as if it were a message. A method and apparatus is desired to reliably send the ETD without triggering a receiver to unsquelch when the ETD is terminated. Unsquelching for meaningless voltage transitions degrades operational efficiency of the system.

IEEE Standard 802.3 establishes a maximum backswing value, called undershoot, of 100 mV, for termination of the ETD which must occur within a prespecified time period. The 802.3 Standard sets forth a specific load and template for measuring this undershoot. Prior art devices compatible with the 802.3 Standard, such as the AM7992B, Serial Interface Adaptor addressed the undershoot problem by use of bipolar devices. Proper configuration of these bipolar devices would permit a graceful decay to zero, with minimal undershoot. This prior solution also incorporated a separate pin for control of the termination of ETD. CMOS transistor devices implementing similar methods proved to be unacceptable, producing unacceptably large undershoot transitions.

FIG. 34 is a schematic diagram illustrating a preferred embodiment of AUIDRV 230. AUI driver 230 receives a differential signal from two lines, Signal In positive ("$SI_{pos}$") and Signal In negative ("$SI_{neg}$"). In response to $SI_{pos}$ and $SI_{neg}$, $TR_{pos}$ and $TR_{neg}$ are driven between $V_{dd}$ and $V_{ss}$ in a well known fashion. A transmit bias ("XMTBIAS") signal is provided to a bias circuit 12 establishes a nomina output current to be delivered to an external load for developing an output differential voltage in accordance with IEEE Standard 802.3. A Manchester Valid ("MNCV") signal is provided to AUI driver 10 to provide for a termination of ETD and for indicating when a true Manchester signal is present and being transmitted.

AUI driver 230 includes two PMOS transistor devices, $Q_1$ and $Q_2$ having source terminals coupled to $V_{dd}$. Two NMOS transistor devices $Q_3$ and $Q_4$ are configured to provide a differential output driver in cooperation with PMOS transistor devices $Q_1$ and $Q_2$. The operation of similar differential drivers is well known as the reader will appreciate. Source terminals of NMOS transistor devices $Q_3$ and $Q_4$ are coupled to bias circuit 12. A drain terminal of $Q_3$ is coupled to a drain terminal of $Q_1$. Similarly, a drain terminal of $Q_4$ is coupled to a drain terminal of $Q_2$. $TR_{pos}$ is coupled to the drain terminals of $Q_2$ and $Q_4$. Similarly, $TR_{neg}$ is coupled to the drain terminals of $Q_1$ and $Q_3$. A terminating resistor R is coupled between $TR_{pos}$ and $TR_{neg}$ and has a preferred value of 78 ohms. Gates of MOS transistor devices $Q_1$–$Q_4$ are coupled to control signals provided by outputs of a plurality of logic gates $G_1$–$G_4$ controlled by states of a first driver 20 and a second driver 22.

FIG. 35 is a schematic diagram of a preferred embodiment of an inverting driver, such as driver 230. Two pairs of PMOS and NMOS transistor devices are intercoupled to provide an inverting differential output Q and $Q_F$ from a complementary input set of IN and $IN_F$ input signals. FIG. 35 includes a truth table indicating the output values of Q and $Q_F$ in response to IN and $IN_F$.

Table I. below identifies the values present at a plurality of Nodes W, X, Y, and Z, coupled respectively to the gate terminals of MOS transistor devices $Q_1$–$Q_4$, in response to control signals $SI_{pos}$ and $SI_{neg}$. Table I. also indicates the output value of $TR_{pos}$ and $T_{neg}$ in response to the control signals.

TABLE I

| SI+ | SI− | MNCV | W | X | Y | X | TR+ | TR− |
|---|---|---|---|---|---|---|---|---|
| 1 | 0 | 1 | 0 | 1 | 0 | 1 | 0 | 1 |
| 0 | 1 | 1 | 1 | 0 | 1 | 0 | 1 | 0 |
| 1 | 0 | 0 | 0 | 0 | 1 | 1 | * | * |
| 0 | 1 | 0 | 0 | 0 | 1 | 1 | * | * |

*Termination of ETD, all transistors $Q_1$–$Q_4$ are on.

This implementation of AUIDRV 230 is anticipated to have undershoot problems, with a backswing of greater than 100 mV. A solution to the undershoot problem, contrary to the implementation of the bipolar tap transceiver, is to drive the voltage to zero immediately.

FIG. 36 is a schematic diagram of AUIDRV 230′ which is designed to provide an ETD termination with acceptable levels of backswing. Circuit elements are identical to those of FIG. 34 except for the addition of PMOS transistor device $Q_5$ to the differential driver configured by MOS transistors $Q_1$–$Q_4$. Source and drain terminals of $Q_5$ are coupled across $TR_{pos}$ and $TR_{neg}$ and in parallel to termination resistor R. A gate terminal is connected to a Node N identified in FIG. 34.

PMOS transistor device $Q_5$ will short resistor R when it is desired to terminate the ETD signal. By the simple expedient of adding this transistor, a MOS AUIDRV 230' may be implemented to reduce ETD to zero without significant backswing. The present circuit offers a potential advantage in that ETD is reduced to zero relatively immediately, rather than slowly and gracefully decaying to zero. This means that a receiver coupled to this AUIDRV 230' would be able to reset faster in anticipation of receiving another signal than it would be able to if a slow decay on the AUI line were output. While IEEE Standard 802.3 strictly controls the minimum time between pulses and may prevent any time savings to be realized, the present circuit does have this advantage.

III. Combined Function Override/Status

FIG. 37 is a block schematic diagram illustrating a preferred embodiment of an aspect of the present invention including a combined function override and status indication for a link test feature.

In implementing the IEEE Standard 802.3 for a Link Integrity Status feature in an improved single chip MAU for twisted pair cable, potential problems may arise when interfacing with older networks which do not meet this standard. The older systems do not supply necessary link test pulses which would indicate a link failure to a receiver, where no failure in fact existed. Thus, an improved twisted pair transceiver would be rendered inoperative when connected to these older systems. Therefore, to maintain backward compatibility, some solution to the absence of link test pulses must be found.

Additionally, provision may be desired to provide an indication of the current status of the link test circuit. In integrated circuits, packaging can be a substantial cost of an integrated device. The packaging cost is directly related to the number of pins used in the integrated device. Therefore, it is an object of the present invention to provide a combined link test disabling feature and status indication feature at a single pin of the integrated device.

A difficulty experienced in use of coaxial cable alternatives such as twisted pair cable which use two wires for each differential signal is that these wires are frequently reversed. For example, TD1 and TD0 may be reversed so that the differential signal is not properly received and is unrecognizable to a receiving system, causing failure of the system.

An improved twisted pair transceiver 240 includes a link test logic circuit 242 which monitors signals received from a twisted pair cable (not shown) and upon detecting a link fail condition, will assert a link fail signal ("LINK_FAIL"). LINK_FAIL is provided to a first logic gate $G_1$ and a second logic gate $G_2$. These logic gates $G_1$ and $G_2$ are operative to control gate voltages of a PMOS transistor device $Q_1$ and an NMOS transistor device $Q_2$, respectively. PMOS transistor device $Q_1$ has a drain terminal coupled to a drain terminal of NMOS transistor device $Q_2$. Source terminals of MOS transistors $Q_1$ and $Q_2$ are coupled to appropriate voltage levels. NMOS transistor $Q_2$ is processed in a well known manner to sink at least at 16 mA at TTL $V_{OL}$ levels when its gate terminal is driven high by logic gate $G_2$. A sink current of 16 mA is the equivalent to 1 standard TTL output and is sufficient to permit an LED to be illuminated. PMOS transistor $Q_1$ is processed to source at most 100 μA of current to provide a weak pull up current when its gate terminal is driven low by logic gate $G_1$.

A Node N is indicated at the drain terminals of MOS transistors $Q_1$ and $Q_2$. Node N may be coupled to a pin external of Twisted Pair MAU 50 to provide the indicated features of combined override and status indication. Circuit components 244 are representative of optional elements which may be used to simultaneously provide an indication of the status at Node N, or to inhibit operation of the link test function. These circuit components include common elements; an LED 246 and resistor 248 coupled to Node N to indicate the status. $SW_1$ and $SW_2$ are used to switch to an inhibit mode, coupling Node N to ground and disabling LED 246.

When Node N is tied low, the internal Link Test Receive function is disabled and the Transmit and Receive functions will remain active irrespective of arriving idle link pulses and data. Twisted pair MAU 50 continues to generate idle link pulses irrespective of the status of Node N. If Node N is not tied low, then Node N will be driven low by NMOS transistor device $Q_2$ if the link is determined to be functional. If the link is determined to be non-functional, due to missing link pulses or data packets, then Node N is not driven by NMOS transistor $Q_2$, and is pulled up by PMOS transistor $Q_1$. The weak pull up current of PMOS transistor $Q_1$ limits the amount of supply current drawn when $Q_1$ is driven and switch $SW_2$ is closed. If a low power down mode is activated, the SYSRST signals goes high and turns off $Q_2$ and turns $Q_1$ on to pull the node N high if switch $SW_2$ is open in the absence of LED/resistor network. In this case, $Q_1$ prevents a metastable input state from occurring by turning node N high.

FIG. 38 is a block schematic diagram of a LINK TEST subnetwork of CORELOGIC 100 having a LINKTEST state machine 250 circuit, a linktest counter circuit 252 and a link counter circuit 254.

FIG. 39 is a schematic diagram of LINKTEST state machine 250 circuit. LINKTEST state machine 250 implements the state machine functions of October 10, 1989 draft of the 10 base T receive state diagram.

FIG. 40 is a schematic diagram of TESTLOGIC 110 of FIG. 6.

IV. Polarity Detection/Reversal

FIG. 41 is a schematic diagram of a subnetwork of FIG. 6 for reversing polarity of two signals, $V_{pos}$ and $V_{neg}$ if necessary.

FIG. 42 illustrates a plurality of waveforms which are relevant to a discussion of an preferred embodiment of an aspect of the present invention relating to polarity reversal. Waveform "A" is representative of Manchester encoding which is used for transmission of data wherein data and clock information are combined in a single bit stream. In Manchester coding, a transition from one signal state to a second signal state always occurs in a middle of each bit period, with a signal state during a first half of a bit period indicating a data value.

Data is sent in packets which is appropriately encoded, with a preamble portion of alternating 1's and 0's, a data portion which includes addressing and other signalling information and an end of transmission delimiter ("ETD") or start of idle signal as a concluding part.

The ETD is to be at a high transition of at least two bit times, which is known as a violation in Manchester encoding. Note that the preamble begins with a negative transition, but the IEEE Standard 802.3 does not mandate that this first negative transition occur in the preamble. In other words, compatibility with IEEE Standard 802.3 is met without the negative transition, but the length of the ETD must always be at least a high level for at least two bit times to be compliant. Therefore, testing for the polarity of the initial pulse of the Manchester wave may be possible, but not viewed as reliable for the preferred embodiment.

Waveform B is a carrier sense signal developed by receiving circuitry associated with a differential receiver. After an input signal is recognized as Manchester code, the carrier sense signal is asserted and remains asserted during receipt of the signal. If transitions do not occur during a prespecified time interval, such as during the ETD concluding portion of a transmission, then the carrier sense signal is negated.

Waveform C is representative of Waveform A which has been inverted, such as would occur if RD1 and RD0 were reversed in a connection to a particular MAU.

FIG. 41 is a schematic block diagram illustrating circuitry which will automatically reverse incorrectly wired receive RDI and RD0 lines. The reader will appreciate that an internal rerouting of signals is accomplished by the present invention, rather than simply inverting each of the signals. While inversion will produce a correct signal and may be satisfactory in certain applications, it was not used in the preferred embodiment because inversion may introduce undesirable jitter to a received signal.

A polarity sensing circuit 260 is provided for receipt of a RD_DATA signal which is a differential Manchester encoded signal of the type illustrated by waveform A of FIG. 42. RD_DATA signal is produced by taking a difference between a first part of the signal received from a first line, $V_{pos}$, and a second part of the signal received from a second line, $V_{neg}$. A carrier sense ("RD CRS") signal similar to waveform B of FIG. 42 associated with RD_DATA is also provided to polarity sensing circuit 260.

Additional signals present are a RESET signal which is present after a power up or a reset command is issued. Additionally, a link status signal is provided to indicate that a link integrity test as indicated above has failed. RESET and LNKST signals are provided to logic gate $G_1$ which will assert a second reset signal if either of the RESET or the LNKST signals ar asserted. The reader will appreciate that assertion of a signal does not necessarily identify a voltage level associated with that signal. For example, the NOR gate implementation of logic gate $G_1$ actually provides a low level when any of the inputs are high. This low state of the second reset signal is a signal indicating that a reset function is desired, and is an assertion of that desire. Equivalents to any particular implementation of a manner of conveying that signal will occur to the reader and the particular implementation should not be viewed as a limitation.

An aspect of the present invention is to detect and correct incorrectly wired wires of a network media, as may occur if twisted pair cable is used a transmission medium. A receiver, able to correct for reversed wiring, may still receive information from the network which would otherwise be lost. An approach taken with the present invention is to test a polarity of a first packet and establish from that first packet whether to reverse or not for the rest of a session until some event occurs which indicates that a 1 reversal of the receive wires may have occurred or that a check is desired. The reset modes are chosen to identify those times when it ma be desirous of rechecking the status of the connection. After a reset or power up mode is commanded, the system will check for correct polarity as a faulty connection could have been made. Additionally, if a idle mode as described above is initiated, then reversal should be checked when the system commences operations again. Upon failure of the link integrity test, which may occur upon disconnection from the network, a test of the polarity is desired when operation recommences.

Therefore, the second reset signal is provided to a latch 262 and to a latch 264. Latch 262 and latch 264 are D-type flip-flops which will latch data from its "D" terminal upon a low to high transition of a clock signal present on its respective clock ("CL") terminal The second reset signal will put latch 262 and latch 264 into a prespecified state, with a "Q" output held low and "$\overline{Q}$" output held high. $\overline{Q}$ of latch 262 is coupled to a second logic gate $G_2$ whose output is provided as the clock input to latch 262 and to latch 264. The particular implementation of logic gate $G_2$ is to provide a low to high transition of the clock signals when the carrier sense signal goes from high to low. Latch 262 is used to ensure that only a first packet received after any of the above described reset conditions are asserted is used to establish whether reversal is necessary or not. It is assumed that polarity cannot change during operation unless one of the reset conditions are asserted, which will check the reversal status in any event. However, if it is desired to check polarity after every packet, latch 262 is not needed and logic gate $G_2$ may be replaced by a simple invertor.

When the carrier sense signal undergoes its high to low transition, the RD_DATA present at the D input of Latch 264 is either a high value or a low value, See FIG. 42, waveforms A and C. If the wiring is correct, then when the carrier sense signal goes low, a high value will be present at D of latch 264 and will be held at Q output of latch 264. If the wiring is incorrect, then a low value, complementary to the high value, will be clocked into latch 264 and output at Q. The reader will appreciate that the carrier sense signal is relatively independent from the coded data, and will undergo a high to low transition not upon detecting the ETD directly as a high for occurring greater than two bit times. Rather, carrier sense detects ETD because the ETD does not have any transitions and an associated timing circuit will determine that a Manchester signal is no longer present and will cause a negation of the carrier sense signal. By monitoring the ETD value when the carrier sense negation occurs, reversal of the receive lines is indicated by the value of the ETD line.

Logic gate $G_3$ is coupled to latch 262 and latch 264 and responsive to $\overline{Q}$ and Q. Logic gate $G_3$ will assert a reverse polarity signal if latch 264 has latched the complementary value and if latch 262 has latched a low value to its $\overline{Q}$ output, indicating that the first packet since the assertion of the second reset signal has been detected.

Four transmission gates $TG_1$-$TG_4$, CMOS switches, are provided for proper routing of the signals which will reverse the inputs if necessary. If the reverse polarity signal is not asserted, then $TG_1$ and $TG_2$ will transmit signals from $V_{pos}$ and $V_{neg}$, respectively, directly to processing circuitry for the respective signals. If the reverse polarity signal is asserted, then TG$_3$ will route signals from V$_{neg}$ to the processing circuitry intended for V$_{pos}$ signals. Similarly, TG$_4$ routes V$_{pos}$ signals to the processing circuitry intended for V$_{neg}$ signals Thus, reversal of polarity reversed wires is automatically attained.

As discussed above, invertors could be used in lieu of the plurality of transmission gates TG$_1$-TG$_4$, but at the risk that unacceptable jitter may be introduced.

Inhibiting Polarity Reversal

FIG. 43 is a schematic block diagram illustrating a preferred implementation of a polarity sensing circuit 260' which will permit polarity reversal to be inhibited by a user. When inhibiting polarity reversal, node N$_1$ is coupled to a ground voltage. If node N$_1$ is allowed to float, polarity reversal is enabled, and an indicator, such as a light emitting diode ("LED") may be coupled to node N$_1$ to permit a status of polarity reversal and detection to be monitored.

Polarity sensing circuit 260' includes the circuit components of differential receiver 260 with additional circuitry to inhibit and indicate polarity reversal status. Logic gate G$_4$ is coupled to Q of latch 264 and will assert a signal if polarity is correct. Logic gate G$_5$ is used to implement various test functions, not relevant to the present discussion and will not be further discussed except to address that the output of logic gate G$_5$ is high except in any of the test modes. Thus, when Q is high, indicating correct polarity, a low is asserted to a buffer 266.

FIG. 44 is a schematic circuit diagram of a preferred embodiment for buffer 266, as well as a truth table illustrating its operation. As illustrated, output of buffer 266 will be low when polarity is correct, or when node N$_1$ is coupled to ground. This buffer 266 provides a mechanism to implement the inhibiting feature and status indication from a single node, or pin for differential receiver 260' implemented as a single integrated circuit. Buffer 266 includes a PMOS transistor device and a NMOS transistor device. For the preferred implementation, the NMOS transistor device is to sink much more current than the PMOS transistor device, approximately 100 times or greater current.

If node N$_1$ is low, this indicates that either the polarity is correct or that reversal is inhibited. Node N$_1$ being high indicates that reversal is not inhibited and that polarity is incorrect. The status of node N$_1$ is transmitted by buffer 268 to an CMOS latch 270.

FIG. 45 is a schematic diagram of CMOS latch 270. CMOS latch 270 is a level sensitive latch (also commonly referred to as a transparent latch) which will propagate data from buffer 268 to an inverting output while its clock input is high and latching the data on the falling edge of the clock. A logic gate G$_6$ is provided to invert a clock input, the carrier sense signal, to provide a logic high level clock signal when carrier sense signal is negated. When carrier sense signal is negated, the status of node N$_1$ is propagated to the inverting output of CMOS latch 270. Therefore, if polarity reversal is inhibited or not necessary, Q$_F$ will be high. A low signal on Q$_F$ indicates that polarity is reversed and enabled. CMOS latch 270 output Q$_F$ is provided to logic gate G$_3$ with the first packet signal and the value of the ETD pulse of the first packet. If all three are low, for this implementation, then polarity reversal will be performed.

Buffer 266 is configured with a relatively large NMOS transistor device (in current handling terms) to that of the PMOS transistor device. This permits the NMOS device to sink sufficient current, approximately 10-15 mA, to drive an LED. The LED will illuminate, in the preferred embodiment, only when polarity is correct. The reader will appreciate that when polarity is incorrect and node N$_1$ is grounded, that a small current will flow from the PMOS transistor device to ground, which explains why the PMOS device is relatively small.

FIG. 12 through FIG. 15 are block schematic diagrams of AUIPORT 104 of FIG. 5 illustrating implementation of the impedance presented to AUI 30 during idle mode.

FIG. 12 is a block schematic diagram of AUIPORT 104 showing its functional subunits. These subunits include a VREF circuit 140, a twisted pair MAU 50 power circuit 142 ("TPEXVCO"), an AUIXMTTR circuit 144, an AUIRCV circuit 146, an AUICI circuit 148 and an AUIRCVSQ circuit 150.

FIG. 13 is a circuit schematic diagram of VREF circuit 140 which supplies power to the circuits of AUIPORT 104. If NOT_PWRDN is low, or asserted, then a gate to source voltage of a PMOS transistor device coupled to NOT_PWRDN becomes active, initiating power to be supplied to the other circuits as the reader will readily appreciate.

FIG. 14 is a schematic diagram of AUIXMTTR circuit 144. FIG. 15 is a schematic diagram of AUIRCV circuit 146.

By implementing AUIPORT 104 as described, a low impedance may be presented to AUI 30 in an idle mode.

V. Loopback Implementation

FIG. 16 through FIG. 25 are schematic block diagrams and illustrations of MAU 50 configured for implementing the loopback modes.

A Loopback test refers to an ability of a MAU to assist in a performance of system tests of data transmission integrity. These system tests are generally initiated by a DTE or a repeater coupled to an AUI line wherein data sent out on DO lines is to be transmitted back to the data input lines, DI.

Twisted pair MAUs may be used in two specific types of implementations, either coupled to an AUI which is coupled to a DTE, or coupled to an AUI which is part of a repeater. Due to these two different implementations and special considerations due to a use of unshielded twisted pair cable, special test modes should be implemented by a MAU coupled to twisted pair medium.

FIG. 16 is a schematic block diagram of an improved twisted pair MAU 50 incorporating a preferred embodiment of the present invention. MAU 50 generally receives signals from an AUI on DO and will process them to be transmitted on TX. Signals received from twisted pair cable 90 at RX are provided to DI for transmission to a DTE or to repeater 36. DTE's generally operate with SQE_TEST operative which is a heart beat signal provided to SIA 22 from its associated MAU after a transmission on DI has occurred which indicates that if a collision had occurred, that a signal would have been transmitted on CI. Operation of Repeaters 36 do not require this heart beat and this feature is, therefore, disabled.

SQE_TEST is enabled by asserting the SQE_TEST signal, which is active low. A collision condition occurs when a MAU 50 receives simultaneous messages on RD and DO and is not an acceptable condition during standard operation.

In DTE operations, SQE_TEST will be low, while in Repeater implementations, SQE_TEST will be high. Implementation of loopback will be initiated by assertion of a TEST signal, active low, which will cause MAU 50 to enter a particular loopback mode, dependent upon a signal present at SQE_TEST.

MAU 50 includes a plurality of differential drivers 160 and differential receivers 162 for transmission and reception of signals. MAU 50 includes MDI 54 for use with predistortion circuitry to waveshape output signals to improve transmission characteristics on specific twisted pair cables 90. Also included is test multiplexer 102 for use in directing data during loopback implementation which is responsive to SQE_TEST and TEST signals.

FIG. 17 is a schematic diagram of a preferred embodiment of test multiplexer 102. Test multiplexer 120 includes a plurality of transmission gates $TG_i$ which a configured with appropriate logic gates $G_i$ to direct signals in response to SQE_TEST and TEST signals as the reader will understand.

FIG. 18 illustrate a plurality of logic gates which perform the logic circuitry to appropriately reroute transmission paths through 50 depending upon a particular loopback mode desired.

FIG. 19 is schematic of a preferred embodiment of transmission gate $TG_i$. $TG_1$ is a CMOS transistor device having drain terminals and source terminals of respective PMOS and NMOS transistor devices coupled to each other, respectively.

FIG. 20 is a schematic illustration of MAU 50 in its pass through loopback mode where data from DO is passed directly to TD, and signals received from RD are transmitted directly to DI, to permit simultaneous transmission from DI and TD. This loopback mode is useful when MAU 50 is part of a DTE, and jumper connectors 170 are used, to permit DTE software to test a transmission through MAU 50 in both directions. That is, transmission from Do to TD and RD to DI is tested in a single operation. As illustrated, pass through mode is implemented with SQE_TEST and TEST asserted.

FIG. 21 is a schematic illustration of MAU 50 in its return mode where signals from DO are returned to DI and signals from RD are returned to TD. Again, collision detection is disabled. This mode is generally applicable to repeaters coupled to DO and DI but is not necessarily limited in that respect. Negating SQE_TEST when TEST is asserted implements the return mode.

As illustrated, a DTE may also implement return mode as a type of internal loopback check. DTE software may be tested and no data exits to the network. Data signals of twisted pair receiver will be returned on twisted pair transmitter for twisted pair continuity checks.

FIG. 22 is a schematic illustration of the use of a LAN system to perform an external loopback test. A user provides an external loopback connector anywhere along the twisted pair medium. This will permit a test of all connect and cable portions along the length of the twisted pair. The user may also loopback using MAU 50 of a repeater.

FIG. 23 is a schematic illustration of the use of a LAN 10 subsystem to perform a link integrity test from repeater 36. Again, as illustrated, repeater 36 can perform full loopback, loopback at an external jumper 170 or anywhere along length of the medium, twisted pair cable 90. Simultaneously, SIA 22, not shown, could perform internal loopback integrity testing without affecting repeater/network operation.

FIG. 24 is a schematic illustration of the use of loopback modes to provide a generic wiring continuity test. Continuity of a complete signal path may be tested, including all crossovers 172, patch panels 174 and connectors 176. Test equipment, such as an oscilloscope 178, implements a wiring test with MAU 50 in loopback mode and then the wiring test is repeated with a jumper 170 in lieu of MAU 50. By moving jumper 170, various effects and anomalies may be measured and isolated. The DTE or the repeater could perform internal loopback integrity testing, if desired, simultaneously with the wiring continuity test.

VI. Twisted Pair Driver

FIG. 25 through FIG. 32 illustrate an improved twisted pair driver used as part of twisted pair MAU 50.

A interface of the twisted pair MAU to the twisted pair cable is typically accomplished by use of a type of differential driver which makes a first wire of a pair more positive than a second wire of the pair for one particular bit state. For a complementary bit state, the second wire is made more positive than the first wire.

It is by this expedient that a receiving device may sense received signals, rather than by determining voltage levels with respect to a reference as being one or the other of the bit states. Noise and miscellaneous voltages which become associated with a twisted pair cable can make absolute voltage level methods unreliable.

The signals transmitted to the network through the twisted pair cable typically have transmission frequencies of 10 MHz or greater and are generally square waveforms. To permit operation of a twisted pair line driver of the type desired, government regulations addressing transmissions from electronic equipment must be met. To meet these regulations, high frequencies radiated from the LAN must be attenuated.

The use of square waveforms as a signalling waveform introduces odd harmonics to the signal line is well understood. Fourier functions will permit any single-valued function $f(\theta)$ that is continuous, except for a finite number of discontinuities in an interval $-\pi < \theta < \pi$, and that has a finite number of maxima and minima in this interval to be represented by a convergent Fourier series of the form:

$$f(\theta) = a_0/2 \Sigma (a_n \cos n\theta + b_n \sin n\theta).$$

If $f(\theta)$ is a periodic function of $\theta$ with a period of $$a_n = 1/\pi \int_{-\pi}^{+\pi} f(\theta) \cos n\theta d\theta \quad n = 0, 1, 2, \ldots \text{ and}$$

$$b_n = 1/\pi \int_{-\pi}^{+\pi} f(\theta) \sin n\theta d\theta \quad n = 0, 1, 2, \ldots$$

FIG. 26 illustrates a square waveform having an amplitude p. Coefficients $a_n$ and $b_n$ may be developed, as is well known, to be:

$$a_0/2 = 0; \quad a_n = 0; \text{ and } b_n = 4p/n\pi$$

for $n = 1, 3, 5, \ldots$.

The Fourier series for the illustrated square waveform is:

$$f(t) = (4p/\pi) \sin \omega t + (4p/3x) \sin 3\omega t + (4p/5x) \sin 5\omega t + \ldots$$

where $\omega = 2\pi/2L$.

This particular f(t) includes a fundamental frequency, represented by w, having an amplitude of $4p/\pi$. Additionally, odd harmonics are provided for $n\omega$, where $n = 3,5,7,\ldots$. The first harmonic includes an amplitude ⅓ as large as an amplitude of the fundamental frequency. Relatively complex external filtering is necessary to remove these odd harmonics.

A second concern with a twisted pair driver is directed to the amount of delay introduced to a signal to be transmitted. Various devices communicating to one another on a network synchronize themselves by use of timing information contained within pockets of transmitted data. Manchester encoding facilitates this synchronization as data signal transitions always occur halfway into a symbol period known as a bit cell. Jitter is a tendency toward lack of synchronization caused by electrical or mechanical changes.

Systems are constrained in the amount of jitter to which they may introduce to a signal. Therefore, it is an object of the present invention to reduce jitter introduced by the twisted pair driver. As circuits employ transistor devices, jitter may be introduced due to an operating parameter referred to as a threshold voltage. A MOSFET transistor is responsive to a potential established across a gate and a source. When a potential difference exceeds a predetermined value, the threshold voltage $V_{th}$, current may flow between the source and a drain. Until the potential across the gate and the source reaches this threshold value, no current flows between the source and the drain. A time delay is thereby introduced by the MOSFET between a time when receipt of a signal occurs at a gate and when current will flow in response to receipt of that signal, equal to a rise time of the gate signal to reach the threshold voltage of the MOSFET device. Similarly, when a signal is decreasing in value, current flow will substantially decrease when the gate signal decreases below the threshold voltage.

FIG. 25 is a block schematic diagram illustrating a preferred embodiment of a twisted pair transmitter 200. Twisted pair transmitter 200 receives differential input signals at a first input terminal TD1 and a second input terminal TD0 at a differential amplifier 202. In response to complementary signals received at TD1 and TD0, a first and a second current flow is initiated in differential amplifier 202. A mirror circuit 204 is provided for scaling the first and second currents to produce a first and a second scaled constant current source inputs to an output stage 206.

Output stage 206 is responsive to these scaled constant currents to output a differential signal on a first output port TXD1 and a second output port TXD0. Output stage 206 incorporates an integration function which will output a ramped response from the first and second scaled constant currents.

FIG. 26 illustrates a square waveform input at TD1 and TD0. The square waveform has an amplitude p and a period of 2L.

FIG. 27 illustrates a ramped response output of output stage 206 from input square waveforms of the type of FIG. 26. This ramped response has an amplitude of q and a period of 2M.

The ramped response illustrated in FIG. 27 has a Fourier series of the form:

$$a_0/2 + \Sigma(a_n \cos n\theta + b_n \sin n\theta);$$

with an amplitude q, the coefficients $a_n$ and $b_n$ may be developed as is well known to be:

$$a_0/2 = 0; \quad a_n = 0; \quad \text{and} \quad b_n = (4q \sin \alpha)/(n\pi\alpha)$$

for $n = 1,3,5,\ldots$ and $\alpha = n\pi b$.

The Fourier series for the illustrated ramped response waveform with amplitude q and b set equal to $\pi/4$ is:

$$f'(t) = [(4q \sin (\pi^2/4))/(\pi^3/4)] \sin \omega t + \\ [(4q \sin (3\pi^2/4)/9\pi^3/4)] \sin 3\omega t + \\ [(4q \sin (5\pi^2/4))/(25\pi^3/4)] \sin 5\omega t + \ldots$$

where $\omega = 2\pi/2L$.

This particular f'(t) includes a fundamental frequency, represented by $\omega$, having an amplitude of $4q\sin(\pi^2/4)/\pi^3/4$. Setting this amplitude equal to the amplitude of $b_1$ of f(t) illustrated above;

$$q = p\pi^2/4\sin(\pi/2)^2.$$

Making this substitution into f'(t) and using trigonometric identities to simplify various terms produces:

$$f'(t) = 4p\sin\omega t + [(4p/3\pi)\sin 3\omega t - \\ ((16p\sin^2(\pi/2)^2)/(9\pi))\sin 3\omega t] + [(4p/5\pi)\sin 5\omega t - \\ ((16p\sin^2(\pi/2)^2)/(25\pi))\sin 5\omega t] + \\ ((64p\sin^4(\pi/2)^2)/(25\pi))\sin 5\omega t] + \ldots$$

As the reader will understand, the amplitude of the odd harmonics include at least two terms, a first term equal to the amplitude of a corresponding harmonic of the square wave and a second term subtracted from this amplitude. Thus, by providing the ramped response output, the total amplitude will be less than with a square wave output, as shown above. With the decreased amplitude of the odd harmonics, an object of the present invention is attained, namely a decrease in number of external filter components. By providing a ramped response in this fashion, the frequency of the output waveform is somewhat decreased, further facilitating a reduction in the external filter requirements.

Jitter Reduction

Twisted pair transmitter 200 also includes a threshold bias circuit 210 and a subthreshold bias circuit 212 to reduce jitter which may be introduced by twisted pair transmitter 200. Threshold bias circuit 210 is operative to overcome delays introduced by output stage 206 due to any threshold voltages of active circuit elements of output stage 206. By holding voltage levels of circuit devices of output stage 206 at approximately threshold levels during the time transistors are not intended to pull up or pull down output lines TXD1 or TXD0, response of output stage 206 to the first and second scaled constant currents of mirror circuit 204 may be close to immediate.

However, if threshold bias circuit 210 biases output stage 206 devices at greater than threshold levels, idle power will be consumed by output stage 206 and an output voltage level will be present on TXD1 and TXD0 which could exceed prescribed limits.

For the preferred embodiment, it is not desirable to have transistors in output stage 206 consume significant power while otherwise biased at subthreshold voltage. Subthreshold circuit 212 is provided to supply a small constant current, on the order of 2-3 μA to threshold bias circuit 210. This small current causes bias circuit 210 to force the circuit elements of output stage 206 to be biased at a value slightly less than threshold levels, and the level will not exceed the threshold.

FIG. 28 is a block diagram of TWSTPRPORT 106 having a Twisted Pair Transmitter ("TDXMTTR") 220 and a Twisted Pair Receiver ("RDRCVR") 222.

FIG. 29 is a block diagram of TDXMTTR 106 including a TD twisted pair driver circuit ("TDXMDR") 224 and a Twisted pair predistortion driver circuit 226.

FIG. 30 is a circuit schematic diagram of TDXMTTR 220 for driving output terminals TXD1 and TXD0. TDXMTTR 220 includes a plurality of MOS devices (transistors $Q_1$-$Q_{42}$), a logic gate $G_1$ and a logic gate $G_2$ which implement a preferred embodiment of a twisted pair driver. In this preferred embodiment, the components $Q_1$-$Q_{42}$ and logic gate $G_1$ and logic gate $G_2$ are integrated into a single chip. Filter components necessary to reduce harmonic frequencies are additional to those components illustrated in FIG. 30.

Transistors $Q_1$, $Q_2$ and $Q_{17}$, $Q_{18}$ are provided as part of a differential amplifier 12 (See FIG. 25) for receipt of a differential signal on input lines TD1 and TD0. Source terminals of $Q_1$ and $Q_2$, and $Q_{18}$ and $Q_{17}$ are coupled to each other and their gate terminals are respectively coupled to TD1 and TD0. The differential signal is to be transmitted by output stage 206 (See FIG. 25) configured by transistors $Q_3$-$Q_6$, after it has been shaped by intermediate transistors. Output stage 206 provides a ramped response output on output lines TXD1 and TXD0. Transistor $Q_3$ and $Q_5$ drive output TXD1 between a first supply voltage Vdd and a second supply voltage Vss. Transistors $Q_4$ and $Q_6$ drive output port TXD0 similarly. Outputs of TXD1 and TXD0 are dependent upon voltage and current levels at a gate terminal of each transistor $Q_3$-$Q_6$ as explained below.

The differential signal at TD1 and TD0 initiates a first and a second independent current flow from transistors $Q_1$ and $Q_2$, dependent upon voltage levels at their respective gate terminals. Similarly, the differential signal initiates a third and a fourth independent current flow from transistors $Q_{17}$ and $Q_{18}$. Transistors $Q_7$-$Q_{10}$ and transistors $Q_{39}$, $Q_{40}$, $Q_{15}$ and $Q_{16}$ implement a mirror circuit 20 (See FIG. 25) which are responsive to these independent current flows. The first independent current flow is operative with transistors $Q_7$ and $Q_9$ ($Q_9$ is provided with a length similar to that of $Q_7$ but with a width approximately ten times greater than a length of $Q_7$) to scale the first independent current and provide a constant current to the gate terminal of transistor $Q_4$ and $Q_6$. Transistors $Q_8$ and $Q_{10}$ are similarly operative to provide a second scaled constant current to the gate terminal of transistor $Q_3$ and $Q_5$. Transistors $Q_{39}$ and $Q_{16}$ are similarly operative to provide a third scaled constant current to the gate terminal of transistor $Q_3$ and $Q_5$. Transistors $Q_{40}$ and $Q_{15}$ are similarly operative to provide a fourth scaled constant current to the gate terminal of transistor $Q_4$ and $Q_6$ As is well known, gate terminals of MOS devices may be modelled as near ideal capacitors. A constant current source is integrated by a capacitance load to provide a ramped response. Logic gate $G_1$ and logic gate $G_2$ are operative with transistors $Q_{31}$, $Q_{32}$, $Q_{41}$ and $Q_{42}$ to enable or disenable operation of the twisted pair transmitter in response to a DRVEN signal. This feature provides idle operation when the TD circuit is not transmitting.

The above described circuit components will provide a twisted pair transmitter providing symmetry between its complementary output ports TXD1 and TXD0 and a ramped response output in response to a differential signal on input ports TD1 and TD0. This ramped response, as described above, will provide an output waveform with harmonics of decreased amplitude wherein a simpler external filter arrangement may be provided.

The remaining transistors, $Q_{11}$-$Q_{14}$, $Q_{19}$-$Q_{26}$ and $Q_{33}$-$Q_{38}$ are included as part of threshold bias circuit 210 and subthreshold bias circuit 212 (See FIG. 25) and are operative to reduce jitter which may be introduced by the circuit components. Each MOS device has a threshold voltage which must be attained before it will begin draining or sourcing a current. If a gate voltage is taken all the way to zero volts (for NMOS gates) to effectively shut off an NMOS transistor, then when it is desired to turn that NMOS device back on, that threshold voltage must be overcome before the transistor can begin to function and draw current and pull its output down. An additional problem is that threshold magnitudes will vary within a known range and a threshold of a driven device may not be precisely the same as the threshold voltage of the device that is driving it. Physical proximity greatly affects threshold characteristics of the various devices.

To overcome a potential jitter problem, due to threshold voltage a desired solution is to ensure that the waveform for the output gates never goes to zero volts. It is anticipated that the gate voltage will approach the source voltage, to approximately threshold, wherein the device is sinking or sourcing approximately 2-3 μA. A more precise current level is not important to the particular application. Thereafter, when attempting to turn the device back on, very little delay is introduced into the output response and threshold voltage induced jitter is minimized.

Gate to drain connected transistor pairs $Q_{11}$, $Q_{12}$ and $Q_{13}$, $Q_{14}$ are part of threshold bias circuit 210. These transistor pairs ensure that voltages on the gates of output stage 206 transistors $Q_3$-$Q_6$ are maintained at approximately threshold. It is well known, that the source voltage of a MOS transistor operating with subthreshold drain current, will not rise higher than approximately 1 threshold voltage below that transistor's gate bias voltage. That is, if a gate terminal is biased at 5 volts, and a drain terminal is biased at 5 volts, a source terminal cannot be driven above 1 $V_{th}$ less than 5 volts because to go higher, the driven device would be forced into subthreshold operation and shut itself off.

A problem may occur through use of threshold circuit 210 only as threshold voltages on transistors used on threshold circuit 210 may not match threshold voltages of transistors used in output stage 206. Instead of an acceptable level of current, through output stage 206 device, such as one μA threshold circuit 210 may bias a gate to produce several hundred microamps of idle current particular. This current is wasted and can effect an output waveform. Therefore, two transistors are put in parallel to pull voltage not to exactly $V_{th}$ but a little lower than $V_{th}$. These parallel structures help ensure that little current, if any, is pulled through the output stage 206 device while maintaining greater than zero volts gate bias.

Therefore, the additional transistor structures of the subthreshold bias circuit 212 are provided to ensure proper operation. These structures add an extra bias current of approximately 2.5 microamps of static current going into both of the diode connected transistor structures of bias circuit 210. This small amount of trickle current is provided to the diode connected structures at $V_{th}$ and not much lower.

By providing threshold bias circuit 210 and subthreshold bias circuit 212, gate voltages are maintained very close to threshold levels which permit rapid response to an input signal, reducing jitter and providing a truer response output. The reader will appreciate that proper operation of the circuit ma be obtained without use of subthreshold bias circuit 212 elements in particular applications. It is preferred, for the improved twisted pair driver, that subthreshold bias circuit 212 be used.

FIG. 31 is a circuit diagram of TWSTPRPD 226 for providing a predistortion feature of for MAU 50.

FIG. 32 illustrates a set of timing relationships of output waveforms of TDXMTTR 220.

VII. Smart Squelch

FIG. 7 through FIG. 11 are directed to circuitry for implementation of a Smart Squelch for MAU 50.

Squelch is a noise rejection scheme to ensure that only a receipt of a Manchester encoded signal by a particular MAU 50 will activate circuits of the particular MAU 50 to operate upon the input signal in a predetermined manner. As illustrated in FIG. 42, a Manchester encoded signal has three portions and it is during the initial portion of this signal that MAU 50 must detect that such a signal is in fact a Manchester encoded signal. A squelch circuit then prepares the rest of MAU 50 to operate on this signal. On the other hand, if a squelch circuit is presented with a noise packet as an input, the squelch circuit should reject the noise packet and not prepare MAU 50 for operation. As the reader will appreciate, inefficient operation and a degradation of an effective bandwidth for the system is obtained with erroneous identification of noise as data.

FIG. 7 is a graphical representation of a noise packet $N_p$ superimposed over a Manchester preamble shown in phantom. Noise packet $N_p$ undergoes numerous transitions and has variable amplitude and pulse width characteristics. Initial 802.3 Standard systems sent AUI signals over shielded twisted pair cable. With the advent of the 10 Base-T standard, unshielded twisted pair cable ("UTP") was used. These media operate in noisy environments and the UTP cable is susceptible to noise.

The signal transmitted between a DTE and a MAU is allowed to have an amplitude range of roughly 3:1, and the AUI cable is allowed to attenuate a transmitted signal by as much as 3 dB, for a total dynamic range of 18:1. A UTP signal has a much more restrictive output range at the transmitter, but a maximum length UTP cable (of about 100 meters) has much worse attenuation characteristics than that of AUI 30 (not shown). UTP signal total dynamic range is on the order of 4–3 : 1. AUI cables are usually shielded, and transmission on those cables is relatively insensitive to external noise, but UTP cables do not have any shield and signals transmitted over UTP are much more easily disrupted by external noise sources. In addition, a MAU is only allowed a minimal amount of time between the reception of a valid Manchester-encoded signal before it must restore the amplitude of that signal, format it for the appropriate medium (AUI or UTP), and begin transmitting, and this implies that there is not sufficient time allowed for complex signal processing prior to retransmission. Since there is not sufficient time to store, process, and forward an input signal, and since the dynamic range of either UTP or AUI allows very low amplitude input signals, most MAUs and DTEs make use of high-gain, wide-bandwidth comparators in their receiver circuits.

This choice then means that MAU and DTE receivers will not only be adequately sensitive to normal AUI and UTP traffic, but they will also respond to noise on AUI or UTP cables when those lines are otherwise idle. It can also be said that while AUI cables will have a lower noise magnitude than UTP cables, the AUI signal is correspondingly smaller than that of UTP, and again, high-gain wide-bandwidth comparators are necessary to adequately receive the signal and format it for retransmission.

Given the above, and given that both AUI and UTP cables will have noise signals during periods of otherwise idle network traffic that is sufficiently large to trigger receiver circuits, it then becomes important to introduce a "squelch" function into each receiver circuit on UTP and AUI in order to prevent a MAU or DTE from attempting to process a noise signal as if it was a valid Manchester signal.

It has been observed that typical noise on a twisted pair wire is similar to Manchester signals and is therefore difficult to distinguish. If a squelch circuit attempts to "overqualify" a signal, time delays will be excessive with an attendant failure to comply with the IEEE Standard 802.3. Similarly, if only a simple qualification procedure is used, then system bandwidth will be degraded by inefficient operation.

Therefore, it is desired that some squelch circuit which optimally compromises on speed and reliability be developed. Within the time allocated, it is not believed to be possible to absolutely ensure that no noise will be detected as Manchester.

A measure of the effectiveness of a communication method, or system, is termed the "network bandwidth", and that parameter reflects the amount of useful, or valid, information that can be transmitted from one point to another over a unit interval of time. A communication system that spends a large portion of its active time attempting to acquire and retransmit noise signals as well as data signals can be said to have a much lower effective network bandwidth than a similar system which includes a means of discriminating between noise and signal. AUI and UTP Receivers, then, include squelch functions for discriminating between noise and valid Manchester signals which results in greater network bandwidth.

A squelch circuit coupled to an AUI 30 (not shown) is termed a "dumb" squelch in that only a minimum amplitude threshold and minimum pulse width are used to qualify a signal on a DO line as a Manchester signal. This is acceptable for signals received from an AUI as noise levels are generally less than on unshielded twisted pair cable. This "dumb" squelch circuit is viewed as unsatisfactory for twisted pair receivers as a reduction of network bandwidth is anticipated.

AUI cables are usually shielded, and are much shorter than UTP cables. As a consequence, and despite the fact that an AUI signal is much lower than a corresponding signal on UTP, AUI cables contain relatively little extraneous noise, and an AUI receiver can adequately process AUI signal traffic while using a relatively simple, or "dumb", squelch circuit. Such "dumb" squelch circuits may consist of a detector for AUI signal pulse amplitude and pulse width only, and reject an input signal if either criteria or both are not satisfied. UTP cables, by their nature, carry far more noise than AUI cables, whether or not there is any message traffic extant on the cable, and studies have shown that noise on UTP cables generally has many characteristics in common with the signal characteristics of normal UTP traffic, rendering ordinary discrimination circuits inadequate. UTP receivers which use only "dumb" squelch circuits are thus more likely to waste a large portion of their network bandwidth attempting to process both noise and normal signal traffic.

FIG. 8 is a schematic block diagram of a methodology adopted to satisfactorily address the requirements of squelch and data integrity and transmission delay. From a twisted pair cable receiver 80', signals received are passed in parallel throughout the system. Therefore, input signals are sent along a data path 120 and simultaneously sent to a squelch circuit 122 to process the input signals as will be described below. The input signals will be sent to a desired driver circuit 124, for example DI on AUI 30 (not shown). However, driver 124 is inoperative to output signals derived from the input signals absent an enablement of driver 124 by squelch circuit 122. The squelch circuit corrupts the input signals during its processing so that outputs from a qualifying process are not proper to use in driver 124. Therefore, two distinct paths are provided to the input signals so that once processing is complete, the system has the data available for transmission, if warranted.

FIG. 9 is a block diagram of RDRCVR 222 of FIG. 28 including a receive data receiver ("RDRCV") circuit 126 and a receive data receiver squelch ("RDRCVSQ") circuit 128. RDRCV circuit 126 and RDRCVSQ circuit 128 are operative to implement a "smart squelch" function as described below.

In order for the UTP receiver to maintain a high network bandwidth, that is, efficiently discriminate between the relatively high noise levels that exist on UTP and signal traffic, a UTP receiver must use other rejection criteria in addition to pulse width and pulse amplitude that is used in dumb squelch circuits, that is, it must be "smart". It is known that valid Manchester signal traffic has a specific shape: a "packet", as it is known, starts with a 5 MHz "preamble" whose first transition is a negative pulse of specific pulse width, and continues with a combination of 5 and 10 Mhz components of alternating polarity for the remainder of the packet. It is generally true that while UTP noise does contain many of the characteristics of valid Manchester signals, those similarities do not persist for more than one or two valid Manchester symbols for most UTP noise and that the remainder of UTP noise that does more significantly match valid Manchester signals occurs infrequently. Thus, a smart squelch circuit can discriminate between noise on UTP and signal traffic if it specifically accepts signals which are substantially similar to Manchester characteristics and rejects those signals that fail to match all criteria.

The criteria for our smart squelch circuit include: detection of voltage threshold crossing for both positive polarity and negative polarity signals, followed by a specific input transition sequence. It is known that the first transition of a valid Manchester signal will have a negative amplitude at least as large as a prespecified threshold voltage, and will have a prespecified pulsewidth above that minimum threshold. Thereafter, pulses will alternate from positive to negative to positive polarity, all with a specific pulse width, throughout the packet, until the ETD is encountered, or until a noise event corrupts the signal. The smart squelch, then, will look for the first negative polarity transition, followed by a positive polarity transition, followed by a negative transition, before causing the UTP receiver circuit to "unsquelch" and receive the signal. After the first successful attempt at unsquelching, the smart squelch resets itself, and begins monitoring negative-positive-positive transitions anew. If any negative-positive-negative sequence should fail, either because any combination of the pulse transitions of that sequence is missing or placed out-of-order during the squelch check sequence, the smart squelch circuit resets itself and begins monitoring transitions anew. If a noise event should happen to dominate a pulse shape such that the negative-positive-negative transition sequence is corrupted, the smart squelch circuit will also reset itself and begin monitoring that transition sequence anew. The use of both positive and negative voltage thresholds, and a negative-positive-negative transition sequence provides better discrimination between signals and noise on UTP than is possible with an ordinary dumb AUI squelch circuit.

A limitation of this circuit is that it cannot completely discriminate between noise and valid Manchester signals because its transition check is limited to three transitions. It is possible to implement a more robust smart squelch by extending the transition check sequence to more than three transitions, but the maximum limit is constrained by the maximum allowed time for a DTE or MAU to receive valid Manchester signals before retransmitting them.

The IEEE Standard 802.3 includes a requirement that a MAU twisted pair receiver reject particular identified signal types. One type of signal is a single cycle sine wave, either beginning at 0° or 180° and continuing for 360° thereafter. Such a signal type will only have two transitions.

The reader will understand that while the preferred embodiment checks for negative, positive then negative transitions, it is equally possible to check for positive, negative and positive transitions. This is permitted partly as the first bit of Manchester may be corrupted and timing requirements may permit this one bit delay in establishing a presence of Manchester. Other transition orders may be implemented, depending upon timing requirements and particular applications.

FIG. 10 is a schematic diagram of RDRCV circuit 126 which performs an "amplitude" squelch qualification on received data from $V_{pos}$ and $V_{neg}$. Three MOS comparators $128_i$ are provided; $128_1$ for data, and $128_2$ and $128_3$. Comparators $128_2$ and $128_3$ indicate that an input pulse amplitude has exceeded a prespecified threshold when undergoing a particular transition by asserting an output signal. Comparator $128_1$ is operable with a differential signal at $V_{pos}$ and $V_{neg}$ to output a corresponding signal data out ("DOUT") and its complement ("DOUTL"). Thus as any type of transition occurs of the input differential signal, DOUT and DOUTL respond appropriately. If $V_{pos}$ is greater than $V_{neg}$, then DOUT is asserted and DOUTL is negated. If $V_{neg}$ is greater than $V_{pos}$, then DOUT is negated and DOUTL is asserted.

A plurality of MOS transistors 129 are operable to provide a constant current source to resistors R. This constant current source provides a voltage offset to selected inputs of comparators $128_2$ and $128_3$ due to a well known relationship of constant current through a constant resistance. This voltage offset requires that the differential signal exceed this offset before an output will be asserted by comparator $128_2$ or comparator $128_3$. Thus, for a positive transition, comparator $128_2$ will assert positive squelch out ("PSQOUT") upon $V_{pos}$ exceeding $V_{neg}$ by the offset voltage amount. Similarly, upon $V_{neg}$ exceeding $V_{pos}$ by the offset voltage amount, negative squelch out ("NSQOUT") will be asserted.

FIG. 11 is a schematic block diagram of RDRCVSQ circuit 128 illustrated in FIG. 9. RDRCVSQ circuit 128 is operable with the amplitude qualified pulses of DOUT, present at DIN. Transitions occurring at DIN are monitored by comparing DI with PSQOUT, present at PSQIN, and NSQOUT, present at NSQIN, as appropriate. The logic of FIG. 11 implements a continuous monitoring for a prespecified combinatorial pattern of signals present at DIN. The smart squelch circuit of FIG. 11 detects for a particular order of transitions occurring at DIN, which is the Manchester encoded data, or noise. If the circuit detects a negative transition of appropriate amplitude, a positive transition of appropriate amplitude followed by a negative transition of appropriate amplitude, the circuit will assert twisted pair carrier ("TWSTPRCA") to enable the twisted pair driver circuitry to begin transmitting the signal. The circuit also continues to monitor the signal to test for the negative - positive - negative transition combinations. If any of these transitions do not occur, or occur in an incorrect order, TWSTPRCA is negated, aborting transmission.

A first latch 130, a second latch 132 and a third latch 134 are provided to successively assert a first, second and third transition signal as particular desired signals of appropriate amplitude appear at DIN in a particular order. If an expected event occurs, for example a negative transition exceeding a second offset voltage, then a first latch will assert a first transition signal. Other latches monitor the particular transitions after earlier transitions have been detected. If events do not occur in proper order, or do not occur at all, then the logic circuit is reset and monitoring begins anew. Only after identified transitions occur in the particular desired order will TWSTPRCA be asserted. Thereafter, the circuit continues to monitor the input pattern to ensure that the input signal maintains the desired pattern and that noise does not corrupt the data. If the input signal is subsequently determined to not fit the pattern, then the TWSTPRCA is negated disabling output drivers.

CONCLUSION

The above description provides a full and complete disclosure of a preferred embodiment of the present invention. Various changes, alterations and modifications will occur to the reader, such as use of AUI circuits of the improved MAU in other circuits of devices coupled to an AUI, such as DTE's or SIA's, given the benefit of this disclosure. Therefore, the reader is directed to the appended claims, rather than to the preferred embodiment to ascertain the scope of the present invention.

What is claimed is:

1. A combined link test inhibit and status indication apparatus for disabling a link test feature and providing a means for indicating a status of the link test feature, comprising:

monitoring means, coupled to a medium, for monitoring said medium for a transmitted link test signal;

transmitting means, coupled to said monitoring means, for transmitting a link test signal in response to a first predetermined criteria;

asserting means, coupled to said monitoring means, for asserting a link test fail signal if said transmitted link test signal is not detected in response to a second predetermined criteria; and disabling means for disabling only said asserting means in response to an inhibit signal while said transmitting means is operational in response to said first predetermined criteria.

2. The combined link test inhibit and status indication apparatus of claim 1 wherein said disabling means further comprises means for controlling a current flow with respect to a node when said inhibit signal is negated.

3. A combined inhibit and status indication circuit, comprising:

a MOS transistor pair, provided in an integrated circuit having a plurality of external pins, said MOS transistor pair including a PMOS transistor device and an NMOS transistor device, a drain terminal of said PMOS transistor device coupled to a drain terminal of said NMOS transistor device to provide an output node coupled to a particular one of said plurality of external pins, a source terminal of said PMOS transistor device coupled to a supply voltage and a source terminal of said NMOS transistor device coupled to a reference voltage;

a logic circuit, coupled to a gate terminal of said PMOS transistor device and to a gate terminal of said NMOS transistor device and responsive to a status signal, for activating said PMOS transistor device and deactivating said NMOS transistor device if said status signal is asserted to assert an output signal at said output node, otherwise;

said logic circuit activating said NMOS transistor device and deactivating said PMOS transistor device when said status signal is negated to negate an output signal at said output node; and an external circuit, coupled to said particular one of said plurality of external pins, said external circuit comprising:

indicating means, responsive to said output signal, for indicating a first condition when said status signal is asserted, otherwise;

said indicating means indicating a second condition when said status signal is negated;

communicating means for communicating said external pin to said reference voltage; and coupling means for coupling said indicating means to said particular one external pin when a status indication mode is implemented, otherwise;

said coupling means coupling said communicating means to said particular one of said plurality of external pins when an inhibit mode is implemented.

4. A combined link test inhibit and status indication apparatus for disabling a link test feature and providing a means for indicating a status of the link test feature, comprising:

monitoring means, coupled to a medium, for monitoring said medium for a transmitted link test signal;

transmitting means, coupled to said monitoring means, for transmitting a link test signal in response to a first predetermined criteria;

asserting means, coupled to said monitoring means, for asserting a link test fail signal if said transmitted link test signal is not detected in response to a second predetermined criteria; and disabling means for disabling only said asserting means in response to an inhibit signal while said transmitting means is operational in response to said first predetermined criteria, said disabling means further comprising means for controlling a current flow with respect to a node when said inhibit signal is negated.

5. In a system for transferring data over a medium, a combined link test inhibit and status indication apparatus, comprising:

a link test circuit, having a circuit input coupled to said medium, and a test output, said link test circuit monitoring said circuit input for the presence of a link test signal and asserting, in response to a predetermined criteria, a test fail signal at said test output when said link test signal is not found at said circuit input;

a bidirectional node comprising a status indication output and a test inhibit input; and a combiner circuit having a test input coupled to said test output and having a system test output, said combiner circuit asserting a test pass signal at said system test output, when a test inhibit signal is present at said test inhibit input, and coupling said test input to said status indication output and said system test output, when said test inhibit signal is not present at said test inhibit input.

* * * * *

UNITED STATES PATENT AND TRADEMARK OFFICE
CERTIFICATE OF CORRECTION

PATENT NO. : 5,164,960

DATED : Nov. 17, 1992

INVENTOR(S) : Wincn et al. (Amended to Vijeh et al.)

It is certified that error appears in the above-identified patent and that said Letters Patent is hereby corrected as shown below:

On the title page: Item [75], please delete "John M. Wincn; Nader Vijeh, both of Cupertino; Ian S. Crayford, San Jose; Jeffrey M. Blumenthal, Fremont, all of Calif." and substitute therefor, --Nader Vijeh, Cupertino, California; Jeffrey M. Blumenthal, Fremont, California--;

In item [56] on the face sheet of the patent, after the U.S. PATENT DOCUMENTS cites, add the following:

--FOREIGN PATENT DOCUMENTS 2537383  2/1977  Fed. Rep. of Germany
3906927  9/1989  Fed. Rep. of Germany--

In column 1, line 40, delete "12i" and substitute therefor, --$12_i$--;

In column 1, line 42, delete "14i" and substitute therefor, --$14_i$--;

In column 2, line 7, delete "35";

In column 4, line 35, delete "at TD" and substitute therefor, --at TD1--;

In column 6, line 6, delete "Signal quality error message" and substitute therefor, --Signal_quality_error message--;

UNITED STATES PATENT AND TRADEMARK OFFICE
CERTIFICATE OF CORRECTION

PATENT NO. : 5,164,960

DATED : Nov. 17, 1992

INVENTOR(S) : Wincn et al. (Amended to Vijeh et al.)

It is certified that error appears in the above-identified patent and that said Letters Patent is hereby corrected as shown below:

In column 12, line 10, delete "nomina" and substitute therefor, --nominal--;

In column 12, line 47, delete "$T_{neg}$" and substitute therefor, --$TR_{neg}$--;

In column 12, line 51 of the Table, delete "W X Y X" and substitute therefor, --W X Y Z--;

In column 16, line 2, delete "that a 1 reversal" and substitute therefor, --that a reversal--;

In column 16, line 5, delete "ma be" and substitute therefor, --may be--;

In column 19, line 21, delete "which a" and substitute therefor, --which are--;

In column 19, lines 22-23, delete "direct signals" and substitute therefor, --direct input signals--;

In column 20, line 23, delete "A interface" and substitute therefor, --An interface--;

In column 20, line 48, delete "$\theta<\pi$" and substitute therefor, --$\theta<+\pi$--;

In column 20, line 54, after "a period of" insert --$2\pi$,--;

UNITED STATES PATENT AND TRADEMARK OFFICE
CERTIFICATE OF CORRECTION

PATENT NO. : 5,164,960
DATED : Nov. 17, 1992
INVENTOR(S) : Winen et al. (Amended to Vijeh et al.)

It is certified that error appears in the above-identified patent and that said Letters Patent is hereby corrected as shown below:

In column 21, line 4, delete "(4p/3x) sin 3wt + (4p/5x) sin" and substitute therefor, --(4p/3π) sin 3wt + (4p/5π) sin--; and In column 25, line 11, delete "ma be" and substitute therefor, --may be--.

Signed and Sealed this

Twenty-second Day of March, 1994

Attest:

BRUCE LEHMAN

Attesting Officer

Commissioner of Patents and Trademarks